United States Patent [19]
Kosonocky

[11] 3,760,202
[45] Sept. 18, 1973

[54] INPUT CIRCUITS FOR CHARGED-COUPLED CIRCUITS

[75] Inventor: Walter Frank Kosonocky, Skillman, N.J.

[73] Assignee: RCA Corporation, Princeton, N.J.

[22] Filed: Jan. 31, 1972

[21] Appl. No.: 222,237

Related U.S. Application Data

[62] Division of Ser. No. 106,381, Jan. 14, 1971.

[52] U.S. Cl. .............................. 307/304, 317/235 G
[51] Int. Cl. .............................. H01l 11/14
[58] Field of Search .................. 317/235 G; 307/304

[56] References Cited

UNITED STATES PATENTS 3,660,697 5/1972 Berglund et al. .................. 317/235

OTHER PUBLICATIONS

Applied Physics Letters, "Charge Coupled 8-Bit Shift Register" pages 111–115, August 1970, by Tompsett et al.

*Primary Examiner*—Jerry D. Craig
*Attorney*—H. Christoffersen et al.

[57] ABSTRACT

An input circuit for a charge-coupled circuit includes a source electrode in the substrate and a gate electrode spaced from the substrate located between the source electrode and a storage electrode. The amount of surface charge signal which becomes stored beneath the storage electrode may be controlled by controlling the source electrode voltage while the gate electrode is at a sufficiently high voltage level to form a low impedance conduction channel in the substrate. The time at which this charge signal transfers to the surface of the substrate beneath the storage electrode may be controlled by controlling the timing of the application of the voltage to the control electrode.

8 Claims, 63 Drawing Figures

INPUT CIRCUITS FOR CHARGED-COUPLED CIRCUITS

STATEMENTS

This is a division of application Ser. No. 106,381 filed Jan. 14, 1971.

This invention described herein was made in the course of or under a contract or subcontract thereunder with the Department of the Air Force.

BACKGROUND OF THE INVENTION

The papers, W.S. Boyle and G.E. Smith, "Charge Coupled Semiconductor Devices", Bell System Technical Journal, April 1970, page 587, and G.F. Amelio, M.F. Tompsett; G.E. Smith, "Experimental Verification of the Charge Coupled Device Concept" page 593 of the same periodical; and M.F. Tompsett, G.F. Amelio and G.E. Smith, Charge Coupled 8-Bit Shift Register", Applied Physics Letters, Vol. 17, 3, p. 111, August 1970, discuss charge coupled semiconductor devices. Charges are stored in potential wells created at the surface of a semiconductor and voltages are employed to move the charges along this surface. In more detail, these charges are minority carriers stored at the silicon (Si)-silicon-dioxide ($SiO_2$) interfaces of MOS capacitors. They are transferred from capacitor-to-capacitor on the same substrate by manipulating the voltages applied across the capacitors.

SUMMARY OF THE INVENTION

A charge-coupled input circuit includes a substrate, means for producing surface charge carriers, means forming a potential well in the substrate, and means controlling the flow of surface charge from the means producing charge carriers, to the potential well. By controlling the application of voltages to these means, the timing and extent to which the potential well is filled with said carriers accurately may be controlled.

DETAILED DESCRIPTION

The discussion which follows describes the invention according to the following outline.

1. Brief description of an overall system — a serial memory made up of a plurality of shift registers and which can be operated as a circulating memory.
2. Input end of the system.
3. Middle of the system.
4. Coupling between the shift registers of the system.
5. Output end of the system.
6. General considerations in the design of charge-coupled shift circuits.
7. High-speed operation.
8. Methods of fabrication.

THE OVERALL SYSTEM

Figure 1:
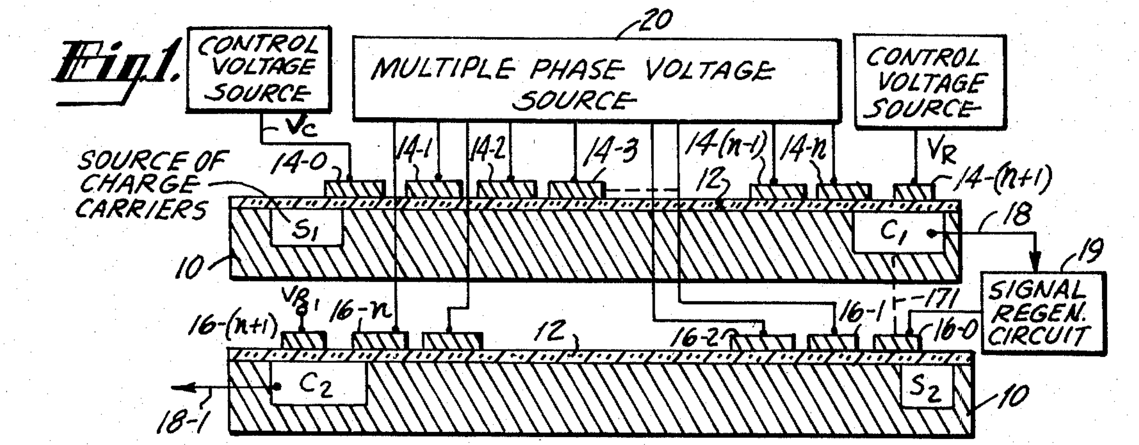
FIG. 1 is a schematic showing, partially in block form and partially in cross-section, of a portion of a system embodying the invention.

FIG. 1 shows in a somewhat schematic way a system according to an embodiment of the invention. It includes a common substrate 10 shown in two parts for ease of illustration. The substrate is formed of a semiconductor such as *n*-type silicon. Other alternatives, discussed later, are possible. A thin film 12 of insulating material such as one formed of silicon dioxide ($SiO_2$) is located on the portions of the surface of the semiconductor substrate under which the charge signals move. The actual thickness may be from 500 to 2,000 Angstroms (A.). The remaining regions of the silicon surface (not shown) may be covered by a thick $SiO_2$ layer, perhaps 10,000 A. or more thick.

A plurality of conductive plates or electrodes 14-0, 14-1, 14-2 . . . 14-($n$+1) formed of a metal such as aluminum are located on the silicon dioxide layer. A source of charge carriers $S_1$ is located in the substrate 10 and in close proximity to the control plate or electrode 14-0 and another means $C_1$ including a collector of charge carriers is located in the substrate in close proximity to the control plate 14-($n$+1). The source $S_1$ and means $C_1$ are shown only as rectangles in FIG. 1. Their actual structure is shown in following drawings and is discussed later. The complete structure acts as a shift register in a manner shortly to be discussed.

A second shift register similar to the first is located adjacent to the first shift register. It includes a source of minority carriers $S_2$, a plurality of conductive plates 16-0, 16-1, 16-2 and so on located on the silicon dioxide surface 12 and a means $C_2$ which may have the same structure and function as the means $C_1$ located adjacent to the control plate 16-($n$+1).

The output terminal 18 of the first shift register is connected to the input circuit of the second shift register by a signal regeneration circuit. The latter may include simply a single connection, shown by dashed line 171, or instead may be an external circuit illustrated by block 19. The output lead 18-1 of the second shift register may be coupled to the input terminal of the following shift register (not shown) in the same manner as already discussed. Alternatively, the output lead 18-1 1 may be coupled via a regeneration circuit to the source of charge carriers $S_1$ to provide a circulating memory. As a third alternative or additionally the output lead 18-1 may be the output terminal of the system. These various alternatives are discussed shortly in connection with FIGS. 2 and 3.

The information supplied to the serial memory of FIG. 1 may be propagated from stage to stage by a multiple-phase voltage source 20. In practice, this source may supply a three, four or higher phase signal but preferably it is a two-phase voltage source as this permits the structure of the memory to be more compact and, under some conditions, to be faster. However, the use of a two-phase voltage source does not naturally provide unidirectional signal propaga-tion. Solutions of the present invention to this problem are discussed in detail below.

The arrangement of FIG. 1 also includes various direct-voltage bias means. These are not shown in FIG. 1 but are shown in later figures and their function is discussed in the explanation of these figures.

Before discussing the operation of the FIG. 1 arrangement, it is in order to consider the general theory of operation of charge coupled devices. If a negative voltage pulse is applied to a plate or electrode such as 14-2, there is formed a so-called deep depletion region in the portion of the *n*-type substrate immediately beneath this electrode. In other words, the applied negative voltage pulse repels majority carriers, electrons in the case of an *n*-type substrate, from the surface of the substrate directly under the electrode such as 14-2. This causes a potential well to be formed at the surface of the *n*-type silicon which corresponds to the induced depletion region. The depth of the potential well is proportional to the square of the depth of the depletion region. The higher the substrate resistivity, the greater the depletion depth for a voltage pulse of given amplitude. The thicker the layer of silicon dioxide beneath the electrode, the shallower the depletion depth for a given voltage amplitude applied to the electrode.

Any potential well formed at the surface of the silicon substrate will tend to accumulate minority carriers (holes in this example). If available from no other place, they will come from the substrate itself. In this case, the carriers are thermally generated and are produced mainly by a surface generation process. They form an inversion layer at the surface of the silicon substrate in which the potential well is formed in a time of the order of one second. In other words, the potential well created beneath the electrode in response to a negative voltage pulse "naturally" becomes filled with minority carriers. The amount of charge that can be collected in such a potential well is equal to the charge required to substitute for the number of previously "exposed" immobile ions (ions which previously have given up charge) in the deep depletion region plus the additional charge accumulated in response to the capacitance between the substrate and the electrode in question.

In the present invention, thermal generation of charge carriers is not depended upon to provide the charge which is introduced into a potential well as a signal. Instead, a source $S_1$ is employed, which source may be a heavily doped *p*+ region located in the substrate, as will be discussed in more detail shortly. In response to a voltage $V_c$ applied to the control plate 14-0, which voltage is more negative than the source potential, and a negative voltage applied to the electrode 14-1 whose leading edge may overlap the lagging edge of the voltage $-V_c$ (or simply by applying a voltage pulse $V_c$ to electrode 14-0 which is in time coincidence with the voltage applied to electrode 14-1) an inversion layer is formed between the source $S_1$ and the potential well created beneath the electrode 14-1. Charge carriers travel from the source through this inversion layer or "channel" into the potential well beneath electrode 14-1 very rapidly, in a time of the order of from ones to tens of nanoseconds with appropriate circuit design. Control of the passage of this charge may be via the control plate 14-0 and, alternatively, or in addition, the source itself may be pulsed as will be discussed shortly.

The storage of charge under an electrode or plate may represent the presence of a binary digit (bit) such as "1". The absence of charge carriers in the region of a substrate beneath an electrode may represent storage of the bit "0." Other alternatives are also possible and will be discussed briefly later.

In the arrangement of FIG. 1, charges are transferred from one potential well to the next, that is, from the region of the substrate beneath one electrode to the region of the substrate beneath the next adjacent electrode by multiple-phase voltages. In other words, the transfer occurs under the influence of an electrical field which may be referred to as drift field. Another mechanism that may be involved in the transfer of charge from "capacitor" to "capacitor" (where a capacitor may be considered to be an electrode such as 14-1, the region of the *n*-type semiconductor substrate beneath this electrode, and the silicon dioxide layer separating the two) is diffusion which in the case of charge coupled devices, normally also results in an induced drift field. As will be discussed briefly later, for high speed operation the charge coupled circuit should be designed to operate under the influence of the drift field rather than diffusion.

When a charge reaches the last electrode **14-*n* of the shift register it may be sensed and the sensed signal employed to control the passage of charge to the input stages to the next register. Involved in the transfer are a control plate 14-(*n*+1) and structure within the means $C_1$. The function of the means $C_1$ is to detect the presence of charge by producing a voltage level that can regenerate the signal in the second shift register and to remove the charge signal from the first shift register. As one example, a floating junction within $C_1$ may be employed to couple a signal to the control plate 16-0 for permitting the source $S_2$, or not, to transfer charge to the region beneath the electrode 16-1 when an appropriate negative voltage pulse is applied to the plate 16-1 from source 20. This connection is illustrated by the dashed line 171 or by 18, 19. In the former case, the connection is such that the complement of the bit present at 14-*n* is transferred to the region under 16-1**. In the latter case, either the bit or its complement may be transferred. All of this will be discussed in greater detail later.

Figure 2:
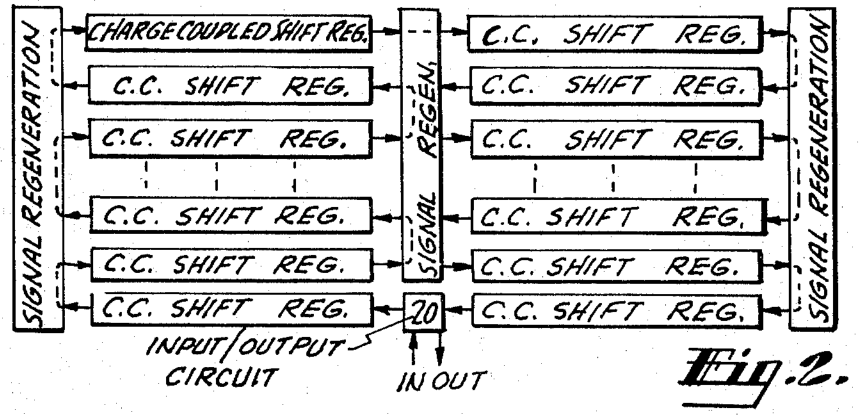
FIGS. 2 and 3 are block circuit diagrams of different systems embodying the invention.

FIG. 2 shows schematically one form that a system of shift registers may take. The shift registers are connected end-to-end through signal regeneration circuits to provide one large ring. These are useful in many data processing applications such as large capacity serial memories, and large circulating registers of this type are useful also: as refresh memories for cathode-ray tube displays; in communication applications; and in video processing applications. The circuit of FIG. 2 also shows schematically an input-output circuit 20 which includes means for accepting new information and means for supplying output information. Circuit details are illustrated and discussed later.

Figure 3:
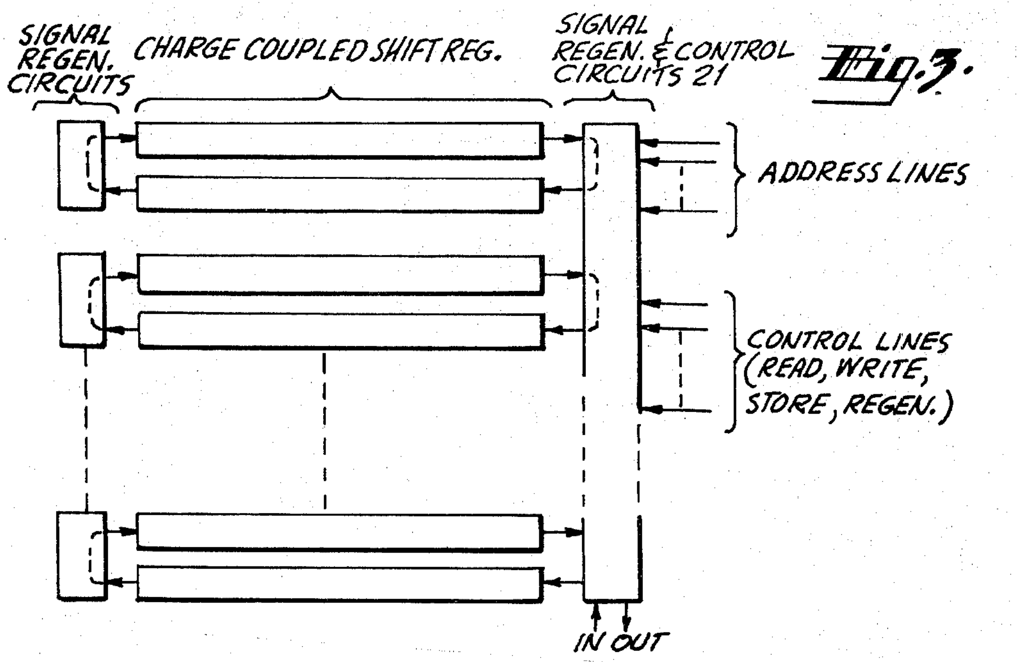

The system of FIG. 3 is arranged in a different way. Here each pair of shift registers forms a ring which, depending upon the size of the shift register, may store from, say, 32 to 256 bits. The signal regeneration and control circuits 21 may include decoder means responsive to the signals on address lines and control means responsive to signals present on the control lines. The circuits may be of the same type as employed in a memory. They may be used to permit readout of the bits stored in any loop. As an alternative, the various ring connected registers may be considered to be analogous to the tracks of a drum memory and the bits read-out in parallel. It is to be understood that here and in FIG. 2 the multiple-phase voltage source, while not explicitly illustrated, is implied.

Although not specifically referred to in the following text, the charge-coupled structures and circuits to be described are also useful in random access charge storage memories and self-scanned photosensor arrays. In the latter application, the light signal (rather than an elctrical pulse) may be employed as the source of charge carriers for the charge-coupled shift register. In the two-phase structures described in more detail later, the light input may be applied to the polysilicon electrodes and the system operated as a self-scanned photosensor array. In these uses, if an analog output signal is desired, it can be obtained from a common drain region fed by parallel charge-coupled shift registers shifting the signal in only one direction. A simple selection of the desired row in an array is possible if one of the multiple phase voltages is unconditionally applied while the other one of these voltages is applied only to the selected row. This one phase is varied between a direct voltage level at which a shallow potential well forms and a voltage at which a deep well forms so that at the electrodes receiving this one phase, a potential well always is present which fluctuates between two levels. The light generated carries thus accumulate at these electrodes and, when desired, they (the stored carriers in a row) can be shifted to an output terminal by the application to the row of the other phase(s).

INPUT END OF THE SYSTEM

In the prior art, the source of charge carriers ($S_1$ in FIG. 1) for the charge-coupled shift register was described as a gate controlled PN junction (for an *n*-type substrate, a p+ region) operated at the substrate potential. In the operation of the shift register, the signal charge was transferred from this *p*+ region to the first potential well by the application of a negative pulse (corresponding to $V_c$ of FIG. 1) to the gate electrode such as 14–0 in FIG. 1. To control the amount of charge to be introduced into the first potential well, careful control of the magnitude and duration of this applied voltage $V_c$ was required.

In charge coupled devices, during the propagation of charge from the source to the potential well beneath the first storage plate (such as 14-1 in FIG. 1) and later from the region of the substrate beneath one storage plate to the region of the substrate beneath the next adjacent plate, the rate of flow of charge is dependent upon the amount that the potential well of the next adjacent plate is to be filled. Thus, for example, if there is charge present under plate 14-2 (FIG. 1) and this charge begins to flow into the "empty" depletion region beneath plate 14-3, initially the charge flows very rapidly. However, as the charge fills the region beneath the plate 14-3 to a greater and greater extent, it becomes more and more difficult for additional charges to enter. The reason is that as the well becomes full, the surface potential of the well gets closer to that of the substrate (the difference in potential decreases). Moreover, the present inventor has discovered that if it is attempted completely to fill each well from the preceding one, some charge tends to remain in the preceding well. This residual charge in the case in which the next bit to be transferred to the preceding well is to be a 0 (the absence of the charge), adversely affects the signal-to-noise ratio as it tends to make a stored 0 look like a stored 1. This effect is cumulative and with a large number of stages becomes quite serious.

One aspect of the present invention resides in the means for obtaining a desired degree of partial filling of the first potential well (the well under plate 14-1) substantially independently of the magnitude of the voltage applied to the control electrode 14-0 (as long as the amplitude of the control pulse $V_c$ is sufficiently large). The details of how this is done are given shortly after the description of the structure.

Figure 4:
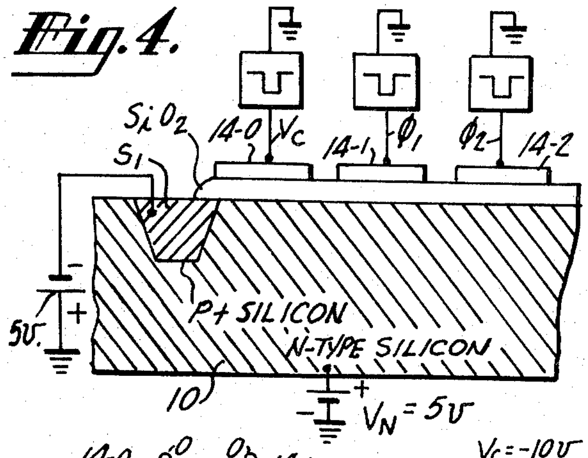
FIG. 4 is a cross-section showing the input end of a shift register according to one form of the invention.

FIG. 4 should now be referred to. The source of charge carriers $S_1$ consists of a conductive line formed in the *n*-type silicon substrate. This structure may be made by diffusing a substantial amount of *p*-type material such as boron into a restricted region of the substrate. This makes this region of the substrate relatively highly conducting and a good source of positive charge carriers. The *n*-type silicon substrate is maintained at an elevated voltage such as +5 volts. The reason is to deplete the surface of the silicon adjacent to the silicon dioxide layer — the surface along which charge carriers representing the signal move during the operation of the register. This biasing tends to eliminate the loss of signal due to surface recombinations by not allowing the majority carriers (electrons in this example) of the silicon substrate to come to the surface to reset the traps for the minority carriers (holes in this example) that represent the signal.

In accordance the present invention, rather than tying the source $S_1$ to the same potential as the substrate, it is instead reverse biased to the extent of say −5 volts with respect to ground (−10 volts with respect to the substrate). As will be shown shortly, this reverse biasing, together with the choice of pulses $V_c$ and $\phi_1$ of appropriate amplitude and timig, insure that the potential well created beneath the first plate 14-1 fills only to a predetermined level, which may be only a fraction of the capacity of this potential well.

Figure 5:
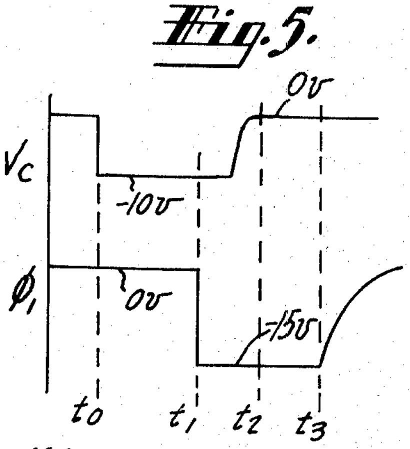
FIG. 5 is a drawing of waveforms present in the circuit of FIG. 4.

In the discussion which follows of the operation of the portion of the system shown in FIG. 4, FIGS. 5 and 6*a*–6*e* should be referred to. The quiescent potential conditions, that is, the conditions before time $t_0$ of FIG. 5 are as illustrated in the FIG. 6*a*. The well beneath the source region $S_1$, which region is at −5 volts, is deeper than that beneath the plates 14-0 and 14-1 so that the charge carriers in $S_1$ remain in $S_1$.

Figure 6A:
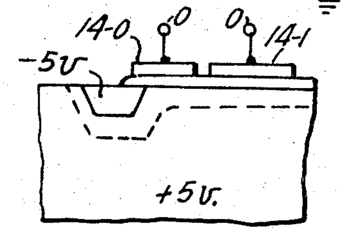
FIGS. 6*a* through 6*e* are drawings showing the potential wells which are formed in response to various voltages applied to the circuit of FIG. 4.
Figure 6B:
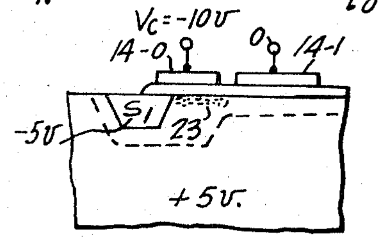
Figure 6C:
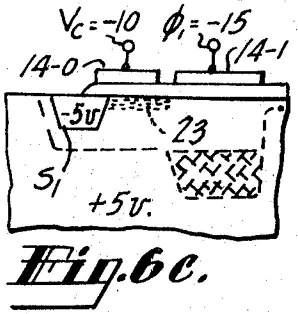

When a negative voltage pulse $V_c$, such as one of an amplitude of −10 volts, is applied to plate 14-0, an inversion layer, 23 in FIG. 6*b*, is formed. This layer extends from the *p*+ region $S_1$, along the surface of the silicon substrate beneath the control or gate electrode 14-0. This inversion layer or conduction channel is analogous to the conduction channel which is formed when the gate electrode of a metal-oxide-semiconductor (MOS) transistor is forward biased. The condition necessary for forming the conduction channel is that the negative voltage applied to the control electrode 14-0 be more negative than the bias voltage at which the source electrode is maintained by an amount which exceeds the threshold voltage $V_t$ of the *n*-type substrate. This threshold voltage $V_t$ is the same parameter as the similarly termed parameter in the metal-oxide-semiconductor transistor art. The conduction of the induced inversion layer 23 is proportional to the difference between the applied voltage $V_c$ and ($V_t$ + $V_{S_1}$), where $V_{S_1}$ is the source potential.

The input pulse $V_c$ must be concurrent with the $\phi_1$ pulse to transfer the charge signal into the first potential well. The following example illustrates the case in which the lagging edge of pulse $V_c$ overlaps the leading edge of pulse $\phi_1$ and pulse $V_c$ terminates before the $\phi_1$ pulse terminates.

As indicated in FIG. 5, at time $t_1$, while the control voltage $V_c$ is still present, the leading edge of the negative pulse $\phi_1$ applied to the first plate 14-1 occurs. This pulse may be more negative than the control voltage and in the present example is shown to be −15 volts in amplitude. The resulting operation is depicted schematically in FIG. 6*c*. The negative voltage applied to plate 14-1 causes a potential well to form in the region of the substrate beneath this plate. The minority carriers, positive charge in the present instance, thereupon flow from the source $S_1$, through the induced conduction channel 23 beneath the control electrode 14-0, to the potential well under the electrode 14-1. This flow of charge continues only until the surface potential beneath the first electrode 14-1 reaches the potential of the source $S_1$ (provided that sufficient time, of the order of nanoseconds, is allowed for this process). Thus, if the difference between the source voltage and the control voltage $V_c$ is sufficiently large (in this example 5 volts is used but a smaller voltage difference also would be suitable), the first potential well may be filled to the desired level. This desired level may be only a fraction of the capacity of the potential well and, as contrasted with the prior art, is precisely controllable without the necessity for accurate control either of the duration or amplitude of the control pulse $V_c$.

Figure 6D:
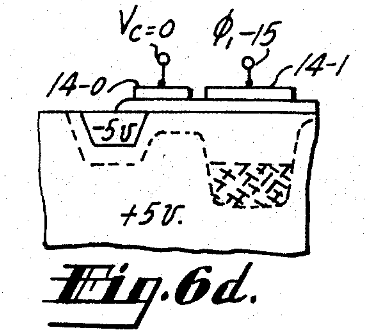
Figure 6E:
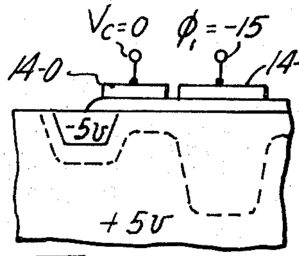

FIG. 6*d* illustrates the operation at time $t_2$ which is after the termination of the control pulse $V_c$ but before the termination of the pulse $\phi_1$. Note first that as the control electrode 14-0 is at 0 volts, that is, is more positive than the source $S_1$, the conduction channel is of high impedance, Thought of in another way, the charge carriers stored in the potential well beneath the first storage plate 14-1 see a potential hill that prevents their escape back to the source. Thus, these charges remain stored under the plate 14-1 until they are shifted by the next voltage phase $\phi_2$ to the following plate 14-2. This will be discussed shortly.

The description above covers the writing of a 1 into the first stage of the shift register. To write 0, no voltage pulse is applied to the control plate 14-0 during the period $t_0 - t_3$. The result is that as long as the surface potential under the gate electrode is more positive (actually less negative in this example) (by about one volt) than the potential at which the source is maintained, no charge will be transferred from the source to the first potential well. (The value of one volt provides a more than sufficient potential barrier to prevent the transfer of charge by the process of diffusion and also provides a safety factor to take into account variations in the device parameters.)

The operation above is depicted in a number of the figures. FIG. *6a* still represents the quiescent circuit condition. At a time between $t_0$ and $t_1$, the situation is still as depicted in FIG. *6a*. As the control plate 14-0 is still reverse biased with respect to the source, no inversion region forms beneath the plate 14-0. At a time such as $t_2$, the situation is as depicted in FIG. *6e*. While there is a potential well created beneath the first plate 14-1, no charge carriers can flow from the source into this potential well in view of the fact that the control plate is still at 0 volts. As already mentioned, no charge present under plate 14-1 represents storage of a 0.

Figure 7:
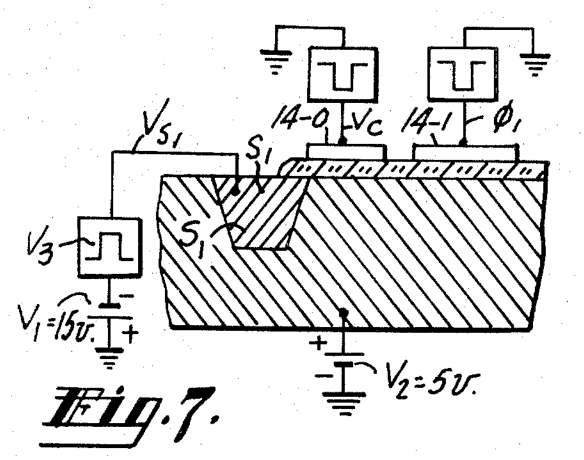
FIG. 7 is a schematic showing in cross-section of another form of input end of the system embodying the invention.

A second form of input circuit according to the invention is illustrated in FIG. 7. The difference between this circuit and the FIG. 4 circuit is that in the FIG. 7 circuit the source $S_1$ is normally sufficiently reverse biased (to the extent of −15 volts with respect to the substrate, −20 volts with respect to ground in this example) that in its quiescent condition, the source does not act as a source of minority charge carriers for potential wells with higher surface potentials than the source. In fact, any such bias may make the source region act as a sink (drain electrode) for the charge carriers present in a potential well. The source may be "turned on" by applying a voltage pulse $V_3$ to the source, at an appropriate time, as illustrated in FIG. 8.

In the operation of the arrangement of FIG. 7, in the absence of a pulse $V_3$, the pulses $V_c$ and $\phi_1$ transfer a 0 (no charge) to the potential well beneath the first storage plate 14-1. However, in the presence of a positive pulse $V_3$ during the pulses $\phi_1$ and $V_c$, a 1 is stored under the first plate 14-1.

Figure 8:
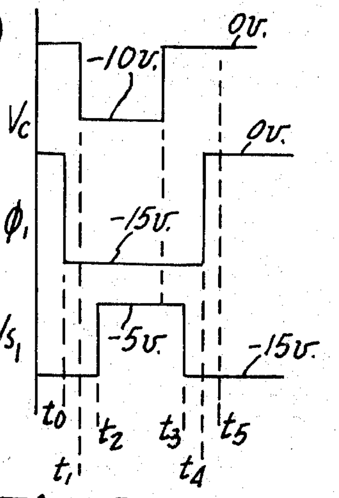
FIG. 8 is a drawing of waveforms employed in the operation of the circuit of FIG. 7.

The timing of the pulses of FIG. 7, shown in FIG. 8, is of interest. At time $t_0$ the $\phi_1$ pulse is applied to storage plate 14-1. This causes a potential well to form beneath the fisrt plate 14-1. Shortly after the start of the pulse $\phi_1$, that is, at time $t_1$, the control pulse $V_c$ starts. This causes a potential well to form beneath electrode 14-0 which connects to the potential well beneath the control electrode 14-1. As no charges are yet available at $S_1$ no inversion layer or conduction channel is yet formed. Shortly thereafter at time $t_2$ the positive pulse $V_3$ is applied to the source $S_1$. This pulse may have an amplitude of 10 volts so that $V_{S_1}$ has a swing from −15 volts to −5 volts. The conditions are now exactly the same as depicted in FIG. *6c* — a conductive channel is formed from $S_1$ to the potential well under electrode 14-1 and the positive minority charge carriers flow from the source and partially fill the potential well beneath plate 14-1 to the known-in-advance fraction of its capacity. The lagging edges of the pulses occur as shown in FIG. 8, pulse $V_c$ terminating before the other pulses to prevent the reverse flow of charge, that is, back from the partially filled well under 14-1 to the source $S_1$.

An important feature of the circuit of FIG. 7 is that the timing of when the charges are introduced may be precisely controlled by controlling the timing of the pulses $V_3$ and $V_c$ with the pulse sequence as shown in FIG. 8. In the general case, the pulse $V_c$ provides the timing while the source potential $V_{S_1}$ determines the level to which the first potential well is filled (or emptied). In this general case, the timing is such that the entire pulse $V_c$ occurs within both pulse $V_3$ and the pulse $\phi_1$.

In the embodiments of the input circuits discussed so far, a signal such as $V_c$ is employed as the control signal. It is also possible readily to perform logic on the inputs signals. For example, the first two plates which are legended 14-0 and 14-1 in FIG. 4 may be control plates which can be referred to as 14-01 and 14-02. Here, the signals applied to the two control plates may represent two bits of information and in this case the two control plates will simulate the AND function. If desired, the first electrode 14-01 may receive a relatively longer signal and the electrode 14-02 may receive a shorter signal which is concurrent with the signal applied to 14-01. Here, either or both signals may represent information or the first, that is, the longer signal, may represent information and the shorter signal may be a timing or strobe pulse.

As an alternative to the above, the two input signals may be the signals $V_3$ and $V_c$ of FIG. 7, the first such signal being applied to the source and the second to the control electrode 14-0. Here, the positive-going pulse $V_3$ may represent a 1 and the negative-going pulse $V_c$ also may represent a 1 and with this convention, the circuit also performs the AND function.

In general, in charge-coupled circuits such as discussed above, multiple nput AND gate operation may be realized by concurrently applying a plurality of negative pulses to a corresponding number of gate electrodes, respectively, and a positive pulse to the source $S_1$. An OR function may be realized by employing a plurality of sources, all providing charge input, in parallel, to the first potential well (under electrode 14-1). Here a positive pulse applied to an source electrode concurrently with the unconditionally applied positive-going control pulse $V_c$ will couple a charge signal to the first potential well. Other alternatives also are possible.

It is also possible to operate the input circuit in such a way that charges of different magnitude represent the bits 1 and 0 respectively. Input signals at these two levels can be obtained by using the direct voltage level of the signal applied to the gate electrode 14-0 to generate the 0 at a lower charge level than the 1 input or by controlling the potential of the source so that the first potential well is filled to a lower level for 0 and to a higher level for 1, or by a combination of these methods.

MIDDLE OF SYSTEM

The transfer of charge from under an electrode such as 14-1 (FIG. 4) to under an adjacent electrode such as 14-2 is accomplished by applying a negative voltage pulse $\phi_2$ to electrode 14-2 while the voltage pulse $\phi_1$ is being reduced in amplitude. The result is that while the potential well under the electrode 14-1 is being made shallower, the potential well under the electrode 14-2 is being made deeper and the charge spills from the shallower to the deeper well. The use of overlapping clock pulses is usual for two, three, four and higher phase operated charge coupled circuits. However, it may be pointed out, in passing, that non-overlapping clock pulses may be employed in connection with two-phase operation (and also in three and four-phase operation) if certain conditions are met, as discussed shortly.

In an arrangement such as shown in FIG. 1, there is no problem of unidirectionality of signal propagation if the source 20 is a three or higher phase source. In these cases, when charge is being transferred, for example, from under electrode 14-2 to under electrode 14-3 (FIG. 1), there is no negative voltage pulse being applied to electrode 14-1. Accordingly, the very shallow potential well under electrode 14-1 (the only such well present will be one due to a direct voltage bias between the electrode and the substrate) acts as a barrier to the flow of charge in the backward direction so that only the forward direction is available for the flow of charge when the source 20 provides three or more phases. Such unidirectionality of charge flow is not present in the case of a two-phase source. Here, to obtain unidirectional charge flow special techniques must be employed as discussed below.

One aspect of the present invention resides in the discovery by the present inventor of special electrode structures which are relatively easy to fabricate for achieving unidirectional charge flow with two-phase voltages. In general, each electrode consists not of a single plate but of two plates which overlap. One arrangement shown in FIG. 9 depends for its operation mainly on the geometry of the electrodes and more particularly mainly on the spacing of one electrode of a pair further from the substrate than the other. The second arrangement illustrated schematically in FIG. 10 and more realistically in FIG. 11 depends mainly upon a voltage offset being maintained between the two electrodes of each pair. A third alternative is to combine the geometry of FIG. 9 with the voltage offset of FIG. 11. An embodiment of this form of the invention is illustrated in FIG. 12.

In all of the cases above, the structure is such as to produce an asymmetrical depletion region beneath an electrode pair in response to a negative potential (or potentials) applied thereto. The direction of asymmetry of the depletion region is such that a charge introduced therein will accumulate at the forward or leading edge of the depletion region as the potential well at that region is substantially deeper than in the remainder of the region.

Figure 9:
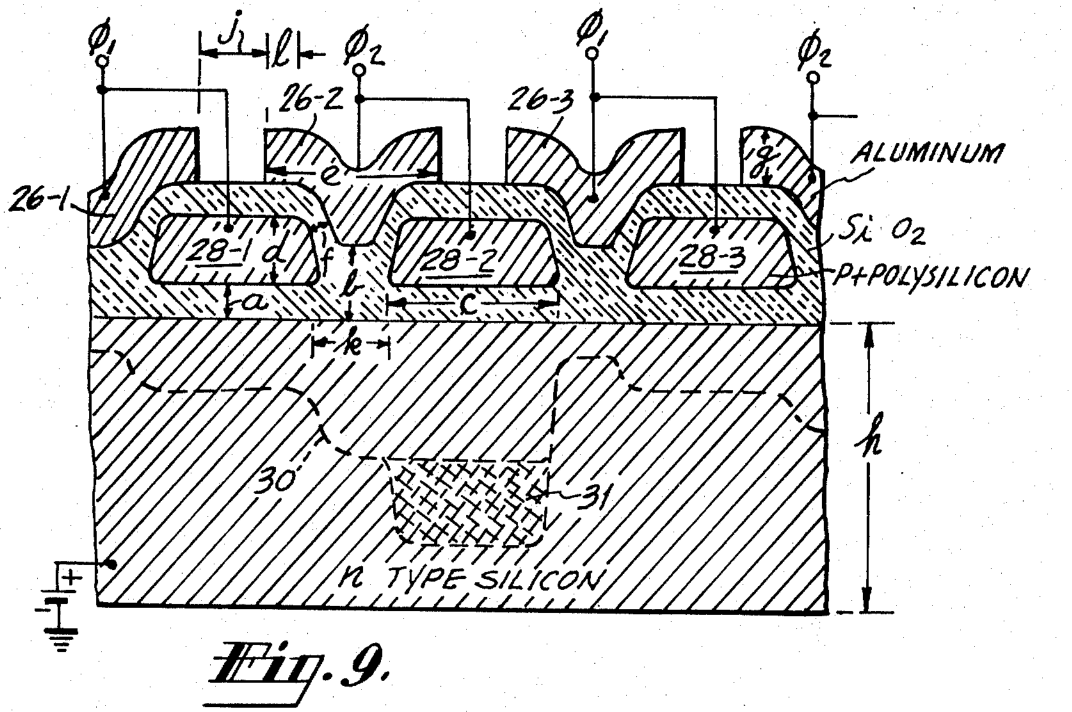
FIG. 9 is a more realistic cross-sectional view through a portion of a shift register according to one embodiment of the invention.

FIG. 9 should now be referred to. Each electrode corresponding to 14-1, 14-2 and so on in FIG. 1 consists of two electrodes which overlap. One of the electrodes consists of a metal such as aluminum and is shown at 26-1, 26-2 and so on and the other electrode of each pair consists of a p+ polysilicon region as shown at 28-1, 28-2 and so on, which is directly electrically connected to its corresponding aluminum electrode. The term "polysilicon" refers to a polycrystalline form of silicon. It is obtained by depositing the silicon at an elevated temperature or by depositing amorphous silicon, then heating to 900° C or more for 10 or more minutes to change the amorphous structure to a polycrystalline structure. (The use of polysilicon material is in itself known in the MOS technology.) The polysilicon electrode of each pair is spaced closer to the *n*-type silicon substrate than the aluminum electrode of that pair. Each aluminum electrode such as 26-2 overlaps the leading edge of its paired polysilicon electrode 28-2 and overlaps also the lagging edge of the polysilicon electrode 28-1 of the preceding pair.

The overlapping polysilicon aluminum electrode construction allows very close spacing between each aluminum electrode and the two polysilicon electrodes it overlaps. Typical dimensions are given later, however, it might be mentioned here that such spacing may be 1,000 A. or less. Moreover, the fabrication techniques employed for making the structure, which techniques will be discussed at greater length later, permit self-alignment of the aluminum electrodes relative to the polysilicon electrodes. The only critical alignment is connected with the etching of the aluminum electrodes above the polysilicon electrodes. The fabrication technique also permits the two different thicknesses of channel oxide (a and b in FIG. 9) easily to be obtained.

In the operation of the circuit of FIG. 9, when a negative voltage pulse $\phi_2$, for example, is applied to the electrode pair 26-2, 28-2, the depletion region which is created is asymmetrical as illustrated by the dashed line 30. This region is substantially deeper beneath the electrode 28-2 than beneath its paired aluminum electrode 26-2. There are two reasons. One is that electrode 28-2 is more tightly coupled to the *n*-type silicon by virtue of its closer spacing to the *n*-type silicon. This results in a smaller voltage drop across the silicon dioxide under the electrode 28-2 (the region *c*) than under the electrode 26-2 (the region *b*), causing a deeper potential well to form under the polysilicon electrode 28-2 than under the aluminum electrode 26-2. The other reason is that the work function for *p+* polysilicon used on *n*-type substrates is lower than that for aluminum by about 1 volt. This implies that for a given negative potential applied to a polysilicon electrode it will repel a greater number of electrons from the adjacent region of the substrate than will an aluminum electrode of the same size spaced the same distance from the substrate and to which the same voltage is applied.

Since the main function of the aluminum electrode is to provide a barrier for the charge flow when a phase voltage applied to a pair of electrodes is being made more positive (actually less negative), during which period the charge is being "spilled" to the potential well under the next electrode pair, the "active region" (the part closest to the substrate which has the dimension *k*) of this electrode is made shorter than the corresponding dimension *c* of the polysilicon electrode. Construction in this way leads to faster transfer time and to the possibility of greater packing density. This dimension (which is approximately equal to the spacing *k* between two adjacent polysilicon electrodes) can be made as small as 0.1 mil (2.5 microns) or less with state of the art metal-oxide-semiconductor fabrication technology.

As discussed above, unidirectional transfer of charge is obtained in a two phase structure such as shown in FIG. 9 by providing asymmetrical potential wells under successive electrode pairs in the manner described. To obtain relatively large asymmetry in these wells without having to have very large differences between the two thicknesses (at *b* and *c* respectively) of the silicon dioxide layer, it is desirable to employ silicon substrates of relatively lower resistivity as, for example, a resistivity of less than 3 ohm-centimeters, and preferably in the range of 1 ohm-centimeter. However, a somewhat larger resistivity substrate may be used if a relatively large substrate bias $V_N$ such as +10 volts or more is employed. A large substrate bias in combination with the two thicknesses of oxide produces a deeper potential well beneath the electrode spaced closer to the substrate surface.

Figure 13:
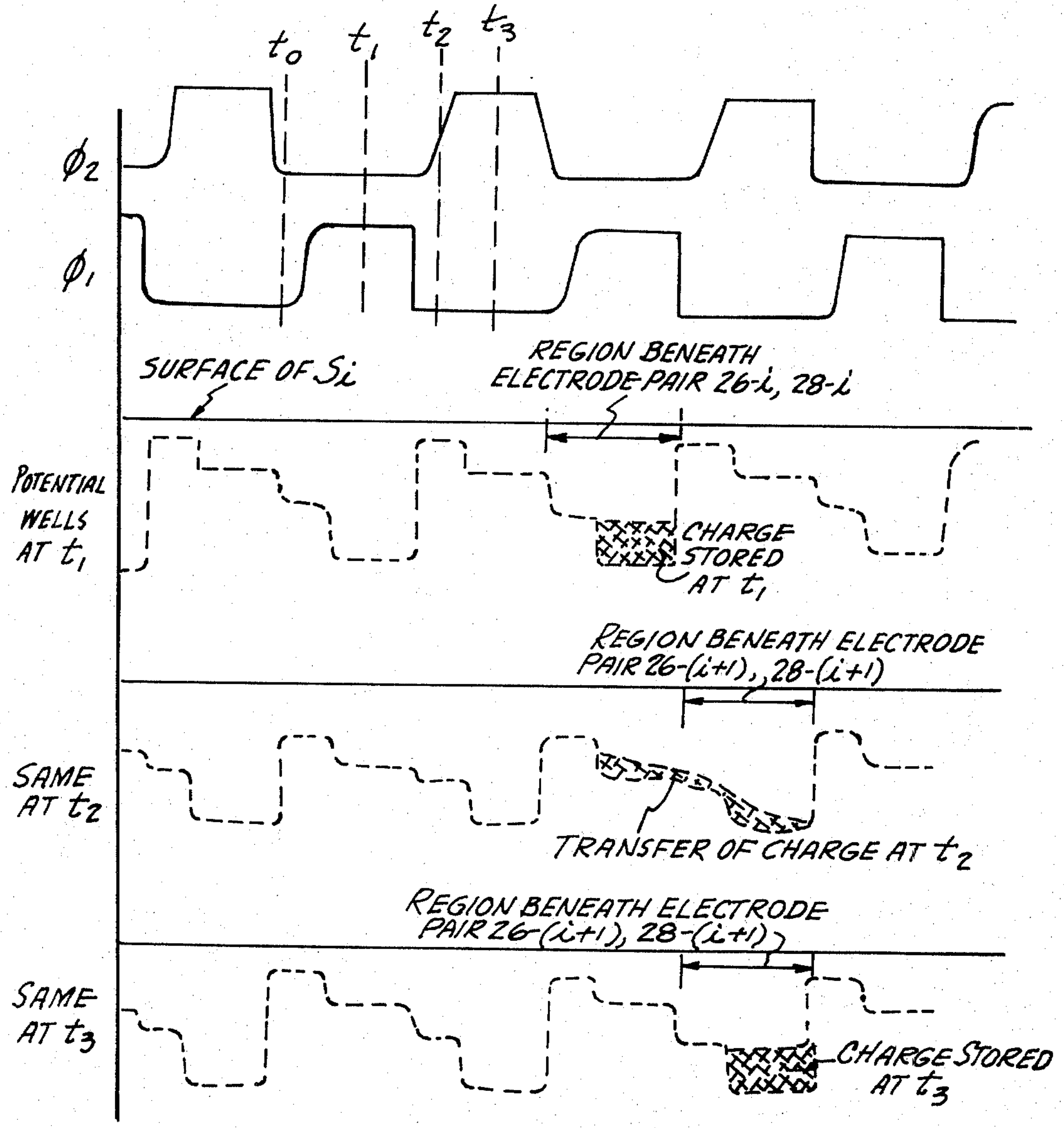
FIG. 13 shows both waveforms and potential wells and is employed in explaining the operation of the circuits of FIGS. 9 through 12.

In the operation of the structure shown in FIG. 9, assume that positive charge accumulates in the deeper portion of the well 30 as indicated at 31 in response to a negative pulse $\phi_2$. Toward the trailing edge of this pulse, the negative pulse $\phi_1$ is applied to the next electrode pair 26-3, 28-3 (time $t_2$ in FIG. 13). In response to the concurrent presence of the last part of pulse $\phi_2$ and the first part of pulse $\phi_1$, the charge 31 will tend to flow to the right, the sequence of events being as depicted in FIG. 13. As the potential well under electrode 28-2 becomes shallower the potential well under electrode pair 26-3, 28-3 becomes deeper and the charge present at 31 spills into this potential well and accumulates under electrode 28-3.

While it is true that concurrently with the application of the $\phi_1$ pulse to electrode pair 26-3, 28-3 this same pulse is applied to the preceding electrode pair 26-1, 28-1, the flow of charge in the reverse direction is prevented by the potential barrier present under the aluminum electrode 26-2. Just prior to the application of the $\phi_1$ pulse, all of the charge under the aluminum electrode 26-2 is stored in the deeper well under electrode 28-2 (time $t_1$ in FIG. 13). Accordingly, when the negative pulse $\phi_1$ goes on and the $\phi_2$ pulse starts going off (time $t_2$ in FIG. 13), the charge in this deeper portion 31 of the potential well will spill in the forward direction, the direction in which the stored positive charge "sees" the more negative potential, and be presented from moving in the reverse direction by the potential hill (the less negative voltage) it sees in that direction.

It may also be mentioned at this point that if the structure of FIG. 9 is operated with a sufficiently large bias voltage applied to the substrate so that the charge signal can be maintained in the deeper potential well by the bias signal alone, then the two phase voltage pulses do not have to overlap. Such operation can lead to simpler signal regeneration circuits as will be described later.

Typical dimensions by way of example for the structure of FIG. 9 are:

$a$ = 1,000 A.
$b$ = 2,000 A.
$c$ = 0.4 – 0.5 mils ≈ 10–13 microns ($\mu$)
$d$ = 3,000 – 10,000 A.
$e$ = 0.3 – 0.5 mils
$f$ = 500 – 1,000 A.
$g$ = 3,000 – 10,000 A.
$h$ = greater than 4 mils
$j$ = 0.2 – 0.3 mils
$k$ = 0.1 – 0.2 mil
$l$ = 0.1 mils Dimensions (except for $b$ in FIG. 11) are similar for the structures of FIGS. 11 and 12.

Figure 10:
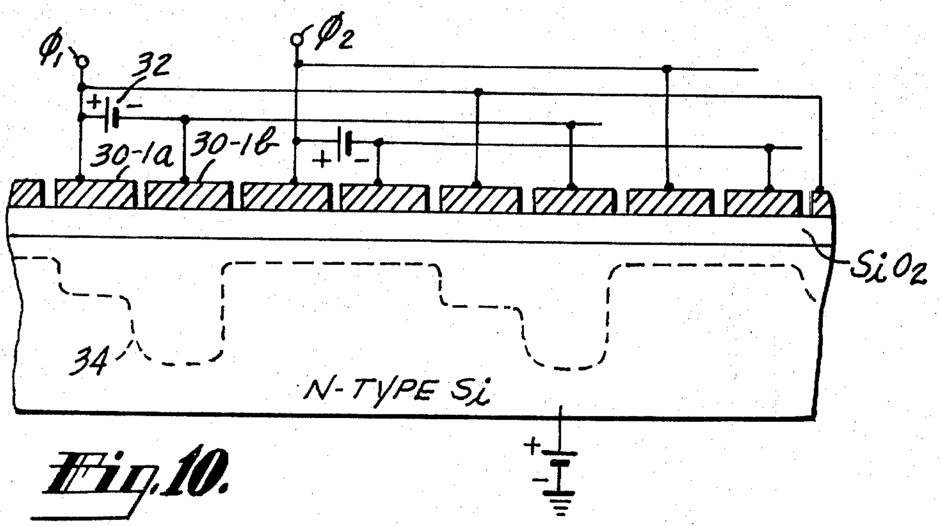
FIG. 10 is a schematic cross-sectional view through another embodiment of a shift register embodying the invention.

FIG. 10 illustrates schematically a second method for creating asymmetrical depletion zones. Here again each storage location corresponding to 14-2, 14-3 and so on of FIG. 1 consists of two very closely spaced electrodes such as **30-1*a* and 30-1*b* with a fixed, direct-voltage offset, indicated schematically by battery 32, between them. In response to a clock pulse such as a $\phi_1$ pulse, the first electrode of each pair, such as 30-1, is not made as negative as the second electrode such as 30-1*b* of each pair. In practice, the voltage offset may be achieved in any one of a number of conventional ways within the multiple-phase power supply. As a simple example, the voltage applied to electrode 30-1*a* may be taken from one point along a voltage divider and the voltage applied to electrode 30-1*b* may be taken from another point along the voltage divider. The effect of the voltage offset is to provide an asymmetrical potential well as indicated by the dashed line 34** which diagramatically shows the situation for the $\phi_1$ voltage.

Figure 11:
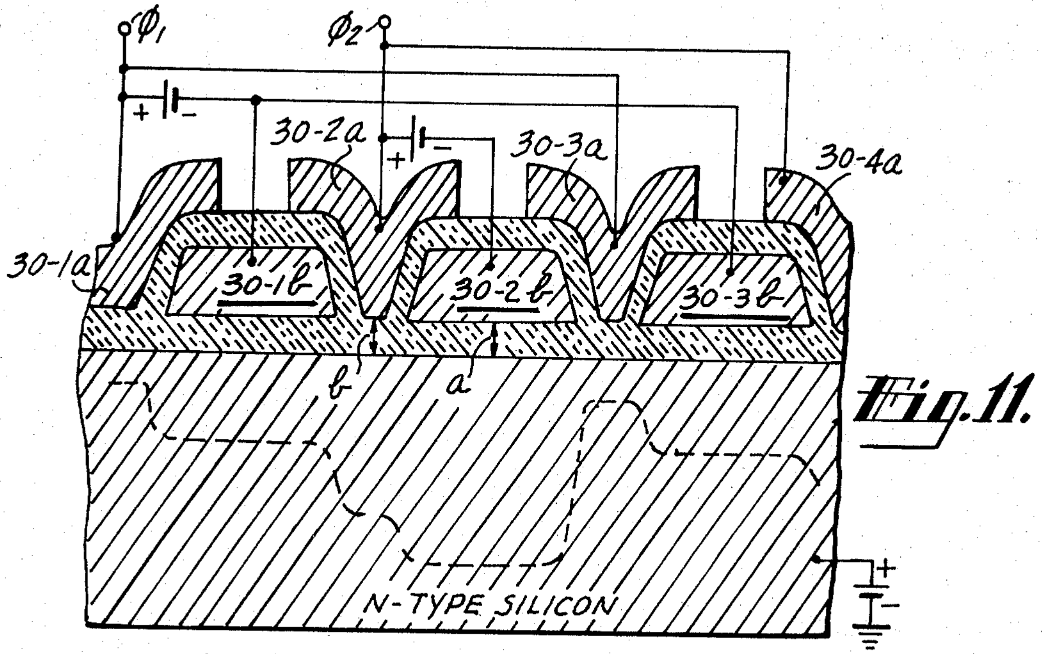
FIG. 11 is a more realistic cross-sectional view of the form of the invention shown in FIG. 10.
Figure 12:
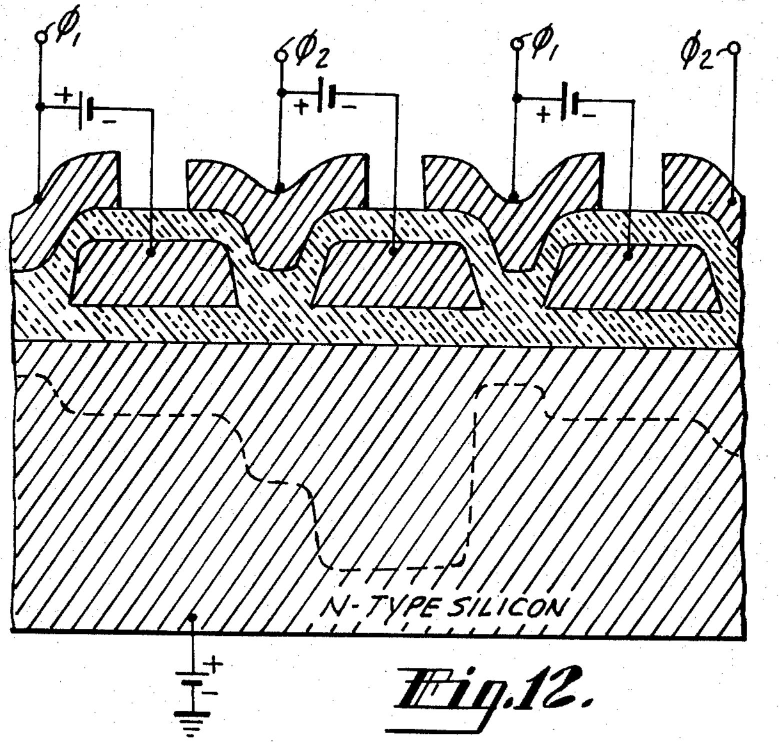
FIG. 12 is a cross-sectional view of another form of shift register embodying the invention.

A cross-sectional and partially schematic view of a practical implementation of the FIG. 10 arrangement is shown in FIG. 11. The structure is very similar to that of FIG. 9, however, the aluminum electrodes **30-1*a*, 30-2*a* and so on may be spaced the same distance from the substrate as the polysilicon electrodes 30-1*b*, 30-2*b*** and so on, that is, $a = b$.

While the asymmetrical depletion region is obtained in a different way in FIG. 11 then it is in FIG. 9, the operation of the structure of FIG. 11 in response to the two phase voltage pulses corresponds very closely to that of the FIG. 9 structure. This operation is illustrated in FIG. 13.

The structure shown in cross-section in FIG. 12 combines the features both of FIG. 9 and FIG. 11. In view of the previous explanation, FIG. 12 need not be discussed in detail.

In the various structures discussed above, as already implied, for an empty potential well (one which has not yet accumulated charge carriers), for a given voltage drop across the silicon dioxide, the higher the resistivity of the substrate the deeper the well that is formed. As a potential well is being filled with mobile charges, more and more of the voltage provided by the electrode responsible for the well is consumed as a voltage drop across the silicon dioxide. This enhances the asymmetry of the potential well. However, mathematical computations relating to electric fields in charge coupled circuits indicate that the lower the resistivity of the substrate, the smaller the fringing electric field produced at an electrode and as will be discussed later, present theory indicates that the smaller the fringing field, the slower the charge shifting speed which can be obtained. Accordingly, there is an advantage to be obtained, in certain applications, in using substrates with higher resistivity. The embodiments of the invention shown in FIGS. 11 and 12, which depend for the potential well asymmetry on the direct voltage offset between the two electrodes of a pair, permit this latter type of structure, that is, they permit asymmetrical potential wells to be formed using higher resistivity substrates. For example, operation appears to be feasible using two phase voltages and substrates with resistivities of say 10 ohm cm and higher using the structure of FIGS. 11 and 12 with the dimensions already discussed and with a direct voltage offset such as 5 volts, as an example.

Figure 14:
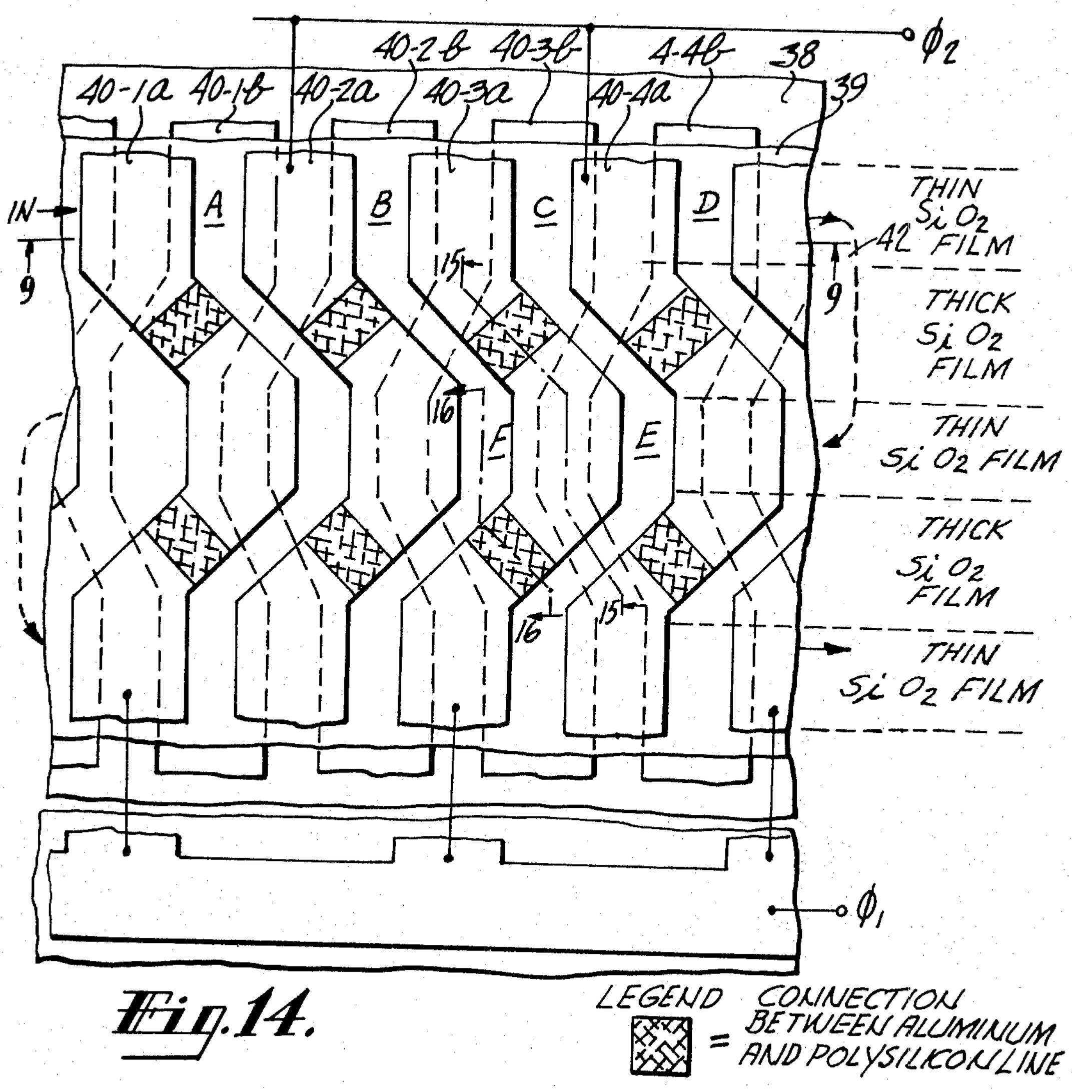
FIG. 14 is a plan and partially schematic view of a two-dimensional shift register array according to another embodiment of the invention.

FIG. 14 illustrates a portion of a two-dimensional, charge-coupled capacitor array employing pairs of electrodes such as described in the discussion of FIG. 9. (Two-dimensional implies ore than the single row of electrodes.) The aluminum electrodes **40-1*a*, 40-2*a* and so on take a zig-zag path in one sense and the polysilicon electrodes 40-1***b*, 40-2*b* and so on take a zig-zag path in the opposite sense. This means, for example, that in the upper region of the structure the right edge of electrode 40-1*a* is coupled to its paired electrode 40-1*b* at the right edge of electrode 40-1*a* and at the left edge of electrode 40-1*b*, whereas at the center of the structure, the left edge of electrode 40-1*a* is coupled to the right edge of electrode 40-1*b*. The reason for arranging the structure in this way is to get the charges to move in one direction (to the right) in the upper thin film region as discussed in more detail shortly and to get the charges to move in the opposite direction (to the left) in the next thin film region.

The polysilicon electrodes 40-1*b* (and the aluminum electrodes) also follow a zig-zag path in the third dimension, that is, in the dimension in and out of the paper in FIG. 14. Thus, at the upper portion of the figure, an electrode such as 40-1*b* is very close and therefore coupled to the substrate. In the following region, the spacing between the electrode 40-1*b* and the substrate is relatively far, to effectively decouple the electrode 40-1*b* from the substrate. The thin film of $SiO_2$ may be, e.g., 500–2,000 A. in depth and the thick film 10,000 A. or more in depth. These different thin film and thick film regions are indicated by legends at the right of FIG. 14. Each electrode such as 40-1*a* is directly electrically connected to its paired electrode such as 40-1*b*. These connections are shown schematically in the view of FIG. 14 by the diagonal, crossed lines.

Figure 15:
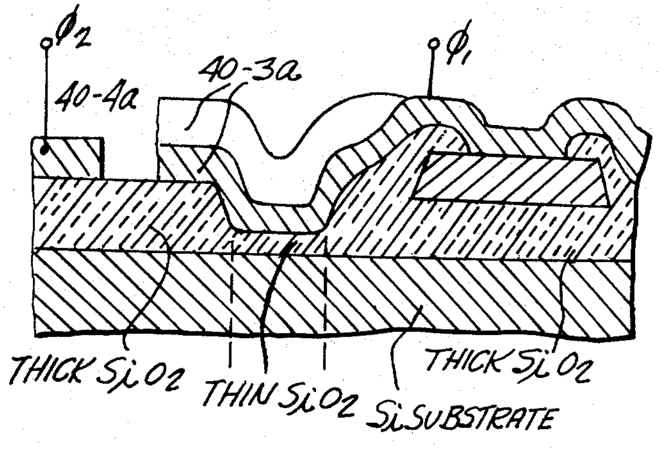
FIGS. 15 and 16 are cross sections taken along lines 15—15 and 16—16, respectively, of FIG. 14.
Figure 16:
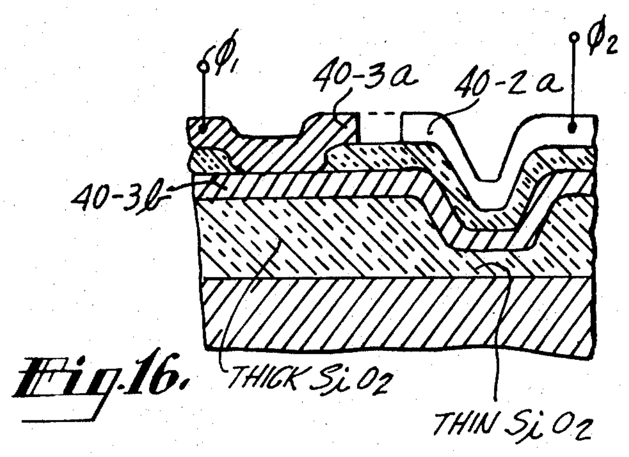

The structure of the uppermost thin film region along 9—9 of FIG. 14 is similar to that shown in cross-section in FIG. 9 (the reference numerals, however, are different). The zig-zag structure in the third dimension (in and out of the paper in FIG. 14) of the polysilicon and aluminum electrodes and the connection of an aluminum electrode to its paired polysilicon electrode are shown in cross-sections taken at 15—15 and 16—16 in FIG. 14. These cross-sections are shown in FIGS. 15 and 16 respectively. All three figures may be referred to in the discussion of the operation which follows.

The assumption may be made for purposes of this discussion that in response to a $\phi_1$ pulse, a charge has accumulated at A FIG. 14 in the upper shift register beneath electrode 40-1*b* of pair 40-1*b*, 40-1*a*. Note that the structure of this electrode pair is similar to that discussed in connection with FIG. 9 such that the potential well is asymmetrical. In response to the phase 2 pulse $\phi_2$, the charge stored under electrode 40-1*b* moves to the right and becomes stored at B under the electrode 40-2*b* of the next electrode pair 40-2*a*, 40-2*b*. In response to the next $\phi_1$ pulse, this charge continues to move to the right and becomes stored at C under electrode 40-3*b* of pair 40-3*a*, 40-3*b*, and so on. When a charge reaches the end of the shift register (not shown in FIG. 14) a charge regeneration circuit (shown and discussed later) applies a charge or its complement (depending upon the regeneration circuit employed) to the next shift register. The direction of charge signal flow is indicated by dashed line 42.

For purposes of the present explanation, assume that this charge has arrived during phase 1 time (during the negative pulse $\phi_1$) at region E under electrode 40-4*b* of pair 40-4*a*, 40-4*b*. It should be clear that now the direction of asymmetry of the potential well is reversed. At E, the aluminum electrode 40-4*a* is to the right of its paired electrode 40-4*b* whereas at D, the aluminum electrode 40-4*a* is to the left of its paired electrode 40-4*b*. Accordingly, in response to the next $\phi_2$ pulse, the charge stored at E will move to the left to F.

It should be clear from the above that with the structure of FIG. 14 it is possible on a single substrate to provide a plurality of shift registers (as illustrated schematically in FIG. 2) which simulate the operation of one very long shift register. As already mentioned, and as will be discussed shortly, the means connecting the output terminal of each shift register to the input terminal of the following shift register may be integrated onto the same substrate as the registers. With respect to size versus storage capacity, if each storage location occupies an area of, say, 1 to 2 mils, then it is possible to have a $10^4$ bit register on a substrate 100 mils by 100 mils (0.1 inch × 0.1 inch = 0.01 $in^2$) in area.

The manufacturing process, which will be discussed later, is similar to that employed in the manufacture of silicon-gate MOS field-effect transistors and is well known in the art. Each storage location requires only a single element (a single charge-storage capacitor) at each location as contrasted to the requirement, for example, of 4 or 6 transistors per location employed in many memories commercially available these days.

Figure 17:
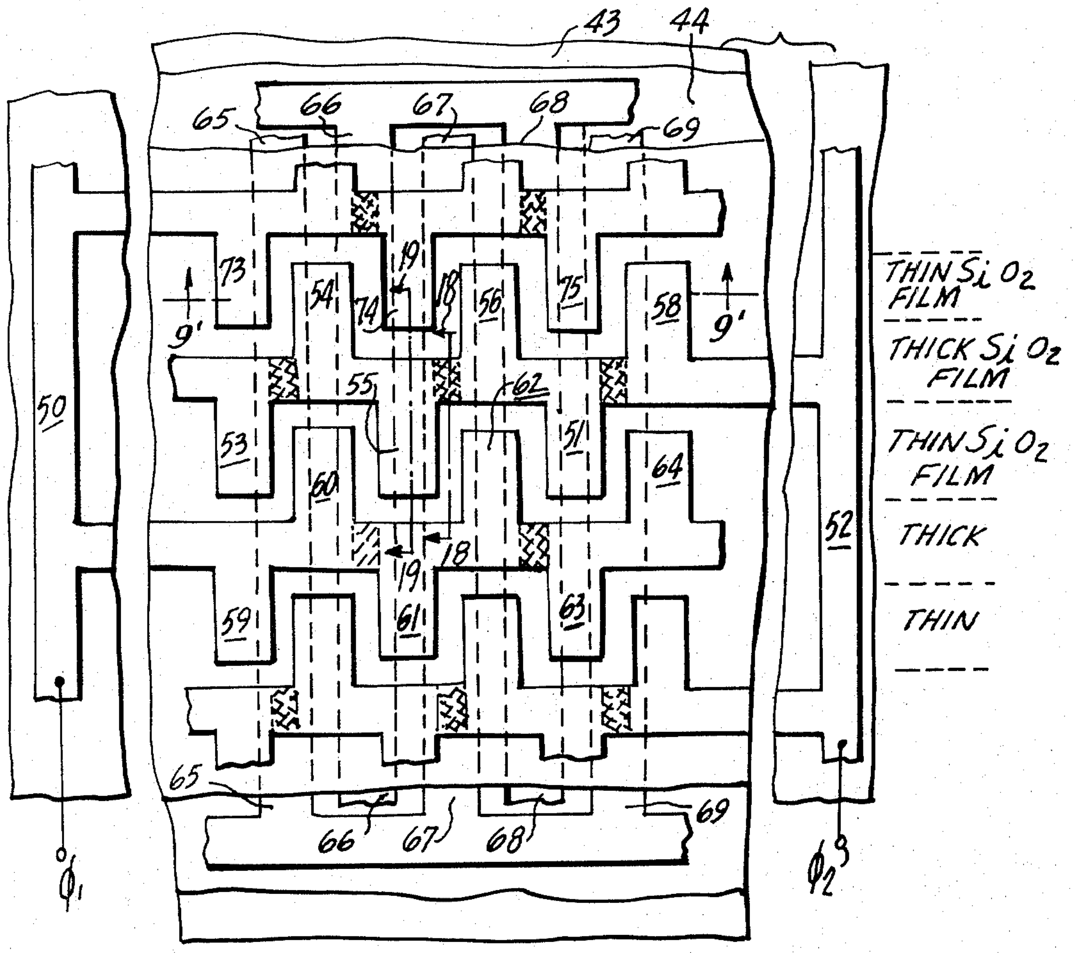
FIG. 17 is a plan and partially schematic view of another form of two-dimensional shift register array embodying the invention.
Figure 18:
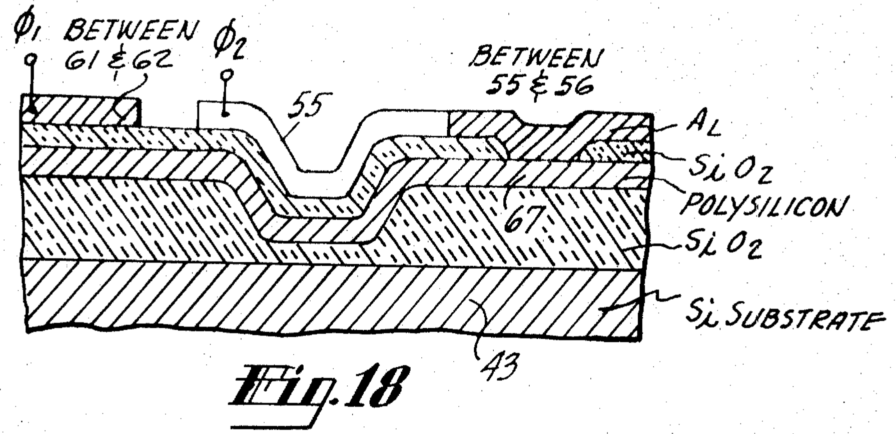
FIGS. 18 and 19 are cross-sections taken along lines 18—18 and 19—19, respectively, of FIG. 17.
Figure 19:
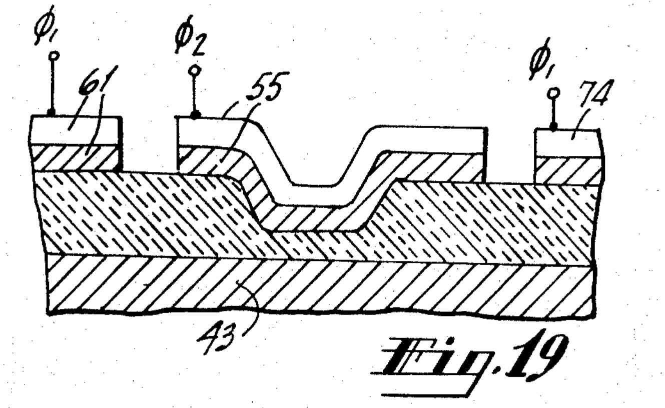

A second embodiment of a two dimensional structure is shown in FIG. 17. It includes an *n*-type silicon substrate 43, a silicon dioxide layer 44 which in some regions is thick and in others is thin, and *p*+ type polysilicon lines 65–70 located in the silicon dioxide. The cross-sectional views of FIGS. 18 and 19 will help the reader to visualize the structure. The thin film region (section 9'—9') is similar in cross-section to FIG. 9.

The final portion of the structure, that which is on the upper surface of FIG. 17, includes the aluminum lines 50 and 52. These extend to the interdigital structure, in one case tabs 53 through 58, for example, and in another case tabs 59 through 64, as a second example. Line 50 is connected to the $\phi_1$ voltage source and line 52 is connected to the $\phi_2$ voltage source. Line 50 is connected to alternate polysilicon electrodes 66 and 68 and line 52 is connected to alternate polysilicon electrodes 65, 67 and 69, in both cases in the same way as already discussed in connection with FIG. 14.

At a storage location, a phase 1 pair of electrodes would be, as an example, tab 75 and electrode 68; the next electrode pair, a phas 2 pair, comprises tab 56 and electrode 67; the next pair is a phase 1 pair and comprises tab 74 and electrode 66, and so on.

In the operation of the arrangement of FIG. 17, if a charge initially is stored under electrode pair 75–68 during a phase-1 pulse, during the next phase 2 pulse, the charge will move to the left to a position under electrode pair 56–67; during the next phase 1 pulse, the charge will continue to move to the left and will be stored under electrode pair 74, 66 and so on. Thus, in the shift register along line 9'—9', the stored charge will propagate to the left. On the other hand, it is clear that for the next shift register, that defined by tabs 53, 60, 55 and so on, any stored charge will propagate to the right. In other words, as in the embodiment of FIG. 9, if each set of tabs along a horizontal line is considered to be a shift register, the two-phase negative voltage pulses applied to electrode 50 and 52 will cause charges to propagate in opposite directions in successive registers.

Figure 20:
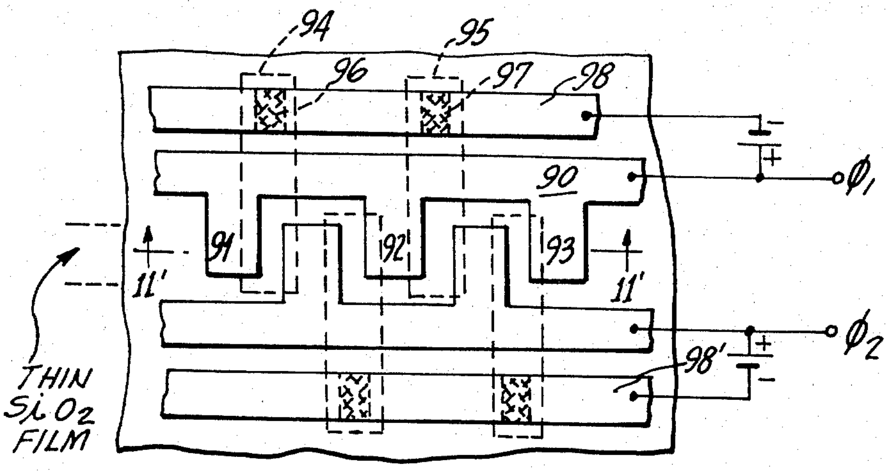
FIG. 20 is a plan view of another form of a shift register embodying the invention.

A shift register which incorporates the structure of FIG. 11 or FIG. 12 is shown in FIG. 20. It includes a common conductor 90 connected to interdigital tabs 91, 92, 93, each comprising one electrode of a pair. Polysilicon electrode 94 is the second electrode of the pair 91, 94; polysilicon electrode 95 is the second electrode of the pair 92, 95. The polysilicon electrodes 94 and 95 are directly connected at 96 and 97 to the aluminum conductor 98. The phase 2 electrodes are similar in structure to and symmetrical with the phase 1 electrodes and are located as shown.

As in previous arrangements already discussed, the portion of the structure of FIG. 20 at which stored charges propagate contains a thin film silicon dioxide region at 11'—11'. The cross section along this thin film region resembles that of FIG. 11. Alternatively, the cross section may be as shown in FIG. 12. The operation of the shift register of FIG. 20 is quite similar to that of embodiments already discussed.

Figure 21:
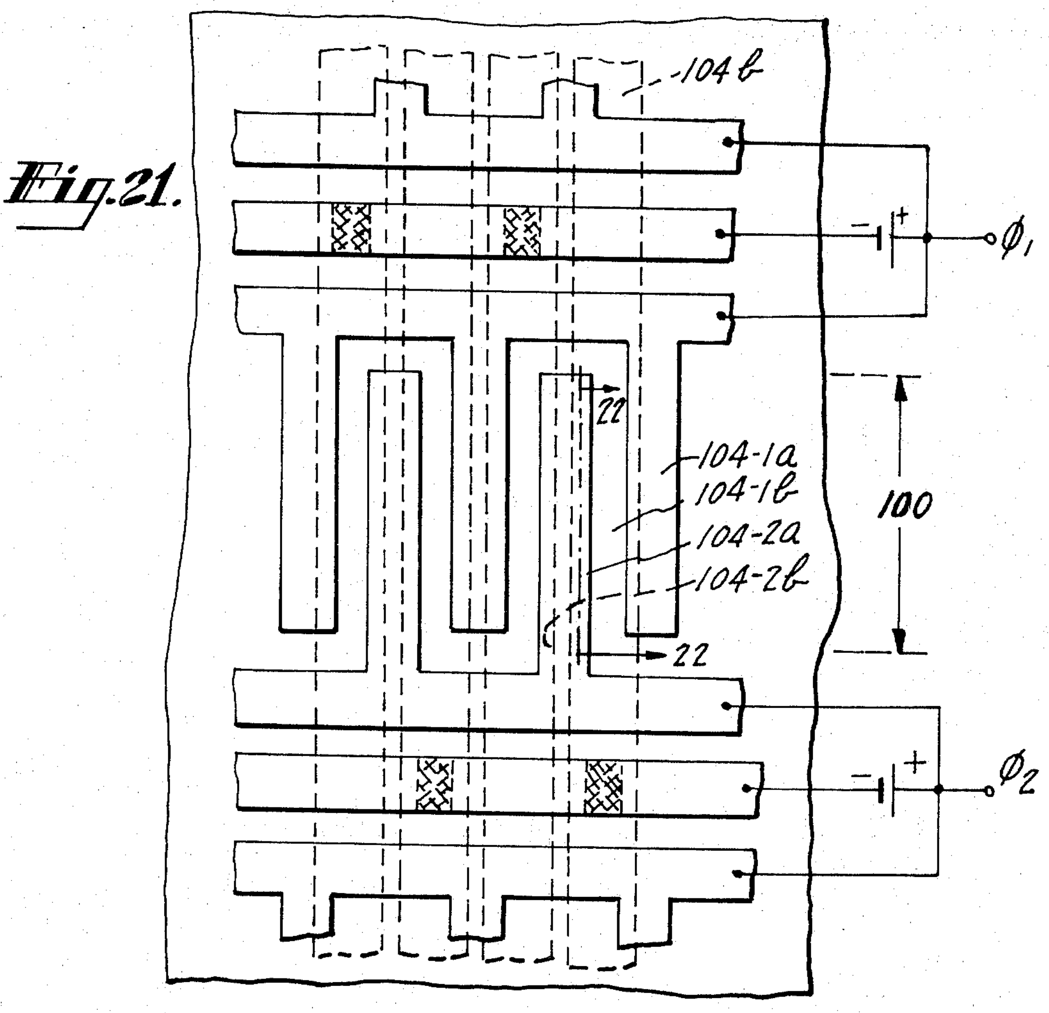
FIG. 21 is a plan view of a portion of a multi-channel shift register embodying the invention.
Figure 22:
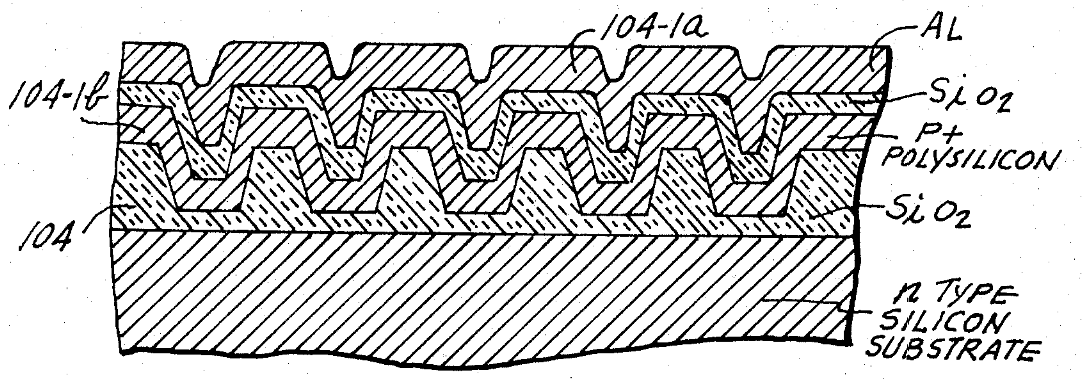
FIG. 22 is a cross-section taken along line 22—22 of FIG. 21.

The structure of FIG. 20 is somewhat inefficient from the point of view of packing density. Extra space is required for the conductors 98 and 98'. Nevertheless, modifications of this structure such as shown in FIG. 21 are useful and economical. In this figure, in the region 100 each polysilicon electrode such as **104*b* form a plurality of storage locations rather than a single location. This is illustrated in FIG. 22 which is a section taken along line 22—22 of FIG. 21.**

In the operation of the arrangement shown in FIG. 21, there are a plurality of source electrodes (not shown) that introduce into the first "electrode pair" a plurality of charges corresponding to one byte of information. For example, each polysilicon electrode of a pair may include say eight or more thin silicon dioxide film regions 104 of FIG. 22 under which eight bits of information may be stored, respectively. These bits, indicated by the presence or absence of charge, for example, are shifted a byte at a time from electrode pair to electrode pair. For example, they (eight bits) may be shifted from electrode pair **104-1*a*, 104-1*b* to electrode pair 104-2*a*, 104-2*b***, where in each case the *a* electrode is the aluminum electrode at the surface and the *b* electrode is the polysilicon electrode.

If it is attempted to send a signal down a relatively long polysilicon line spaced close to a silicon substrate, there will be a substantial delay in the signal transmission. The reason is that the polysilicon line has a relatively high sheet resistance, of the order of 10 to 20 ohms per square, so that the line looks like a resistor-capacitor transmission or delay line, where the "capacitor" is the distributed capacitance between the line and the substrate. The solution to this problem in the arrangements of FIGS. 20 and 21 is to employ a plurality of relatively short polysilicon lines such as 94 and 95 of FIG. 20, all connected in parallel to a relatively highly conductive line such as aluminum line 98, which is spaced relatively far (10,000 A. or more) from the substrate. However, as already mentioned, the price paid is the greater area required and this reduces the packing density.

Figure 23:
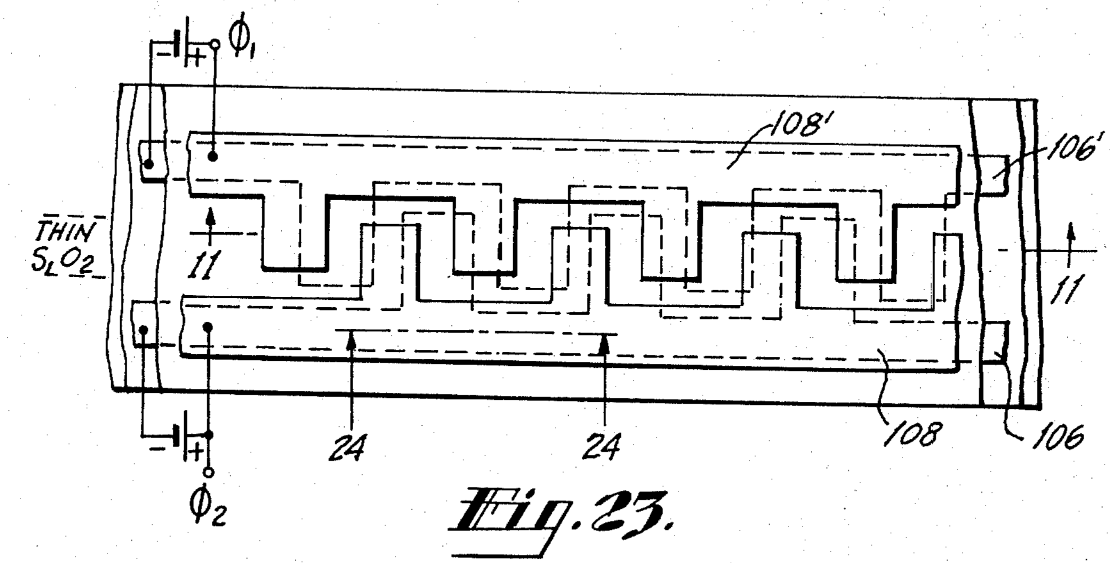
FIG. 23 is a plan view of a portion of another form of shift register embodying the invention.

The arrangement of FIG. 23 solves the problem above in a different way — one not requiring additional space. Here, the shift register consists of an interdigital structure similar to that shown in FIG. 20 and shown in cross section in FIG. 11 and the polysilicon portion also comprises an interdigital structure. The bus analogous to 98 of FIG. 20 comprises a length of polysilicon line such as 106 which lies for its entire extent beneath the corresponding aluminum line 108. The spacing *f* (FIG. 24) between these two lines may be of the order of 500 to 1,000 A. which may be less than or comparable to the spacing *a* (FIG. 11) between the polysilicon line and the substrate in the thin silicon-dioxide region. The spacing between the polysilicon line 106 and the substrate in the thick silicon dioxide region (dimension *q*, FIG. 24) may be of the order of 10,000 A. or more.

The result of the geometry above is to make the capacitance between the polysilicon line and the aluminum electrodes substantially greater than that between the polysilicon line and the substrate. The reason is that there is a much greater area of polysilicon spaced a small distance from the aluminum than there is spaced a comparable distance from the substrate. In addition, as already mentioned, the structure may be such that the closest the polysilicon line comes to the silicon substrate is 1,000 to 2,000 A., whereas the dimension *f* may be 500 A.

The coupling between an aluminum line and its corresponding polysilicon line may also be increased in other ways. As one example, the silicon dioxide layer of FIG. 24 can be replaced by a, say, 500 A. thick layer of silicon nitride or other dielectric material which has a higher dielectric constant than silicon dioxode. As another alternative, the silicon dioxide layer may be replaced with a rather thin doped oxide that tends to form a PN junction region at the surface of the polysilicon, thus avoiding direct shorts due to the pin holes that may result from the very thin oxide, which may be less than 500 A. thick.

With the structure arranged as discussed above, the aluminum lines are tightly coupled from an alternating voltage viewpoint to the respective polysilicon lines. Accordingly, when, for example, a $\phi_1$ pulse is applied to line 108' it is "instantaneously" capacitively coupled to the polysilicon line 106' while at the same time the two lines are offset in voltage relative to one another in the manner already discussed in connection with previous embodiments.

Figure 24:
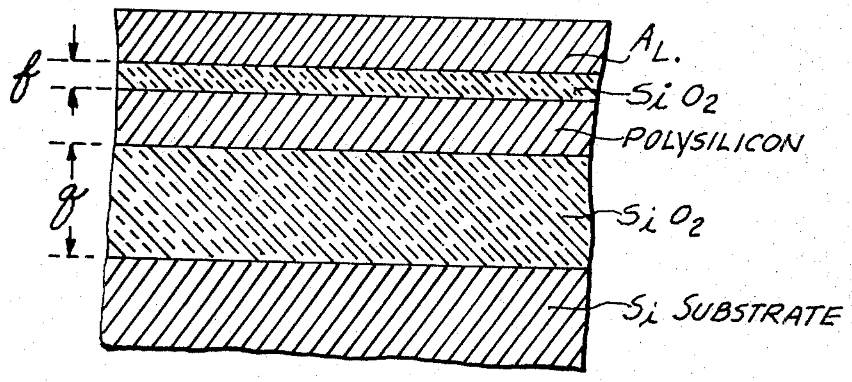
FIG. 24 is a cross-section taken along line 24—24 of FIG. 23.
Figures 25, 26:
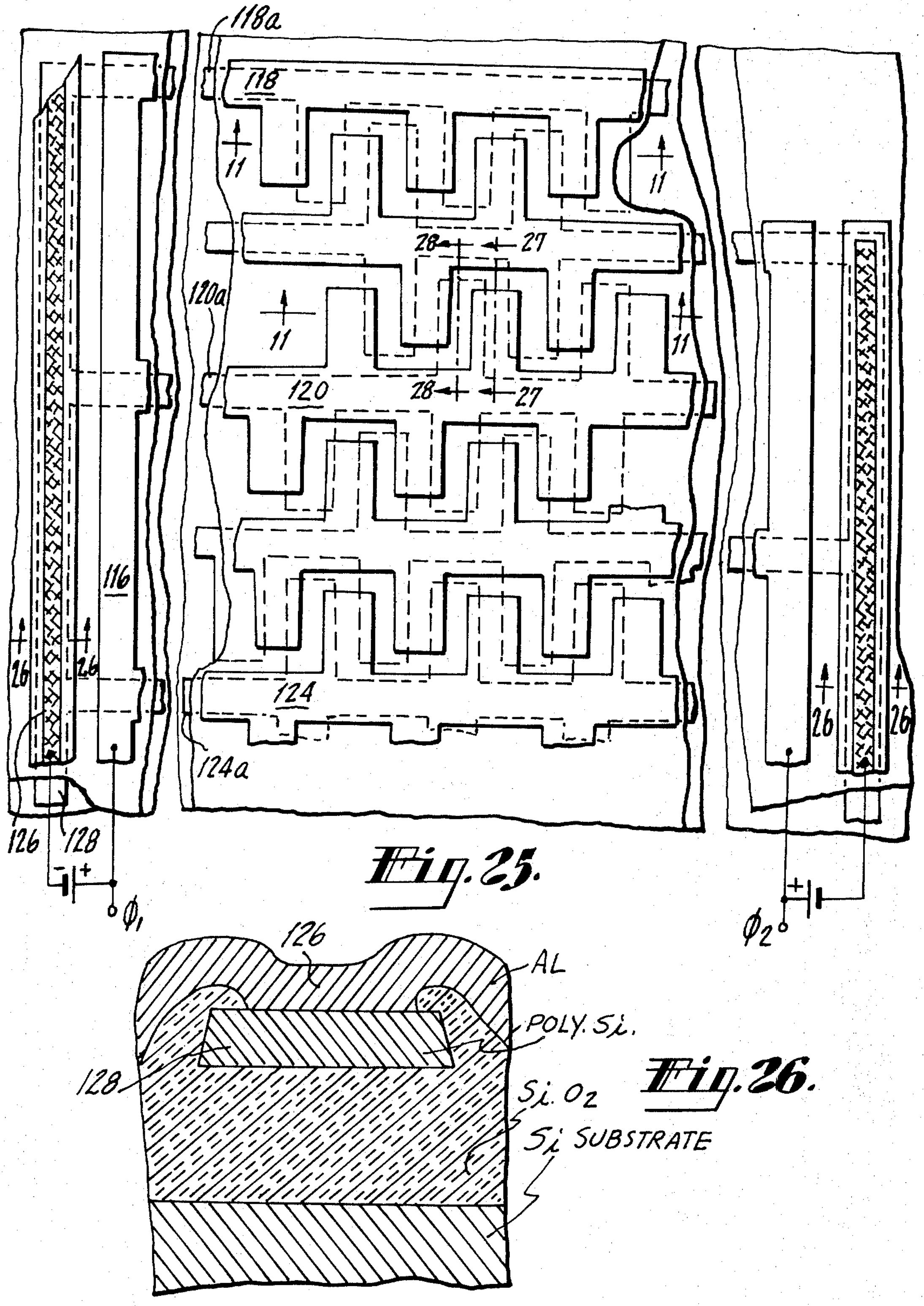
FIG. 25 is a plan view of a portion of another form of shift register embodying the invention.
FIGS. 26, 27 and 28 are cross-sections taken along lines 26—26, 27—27, and 28—28, respectively, of FIG. 25.
Figure 27:
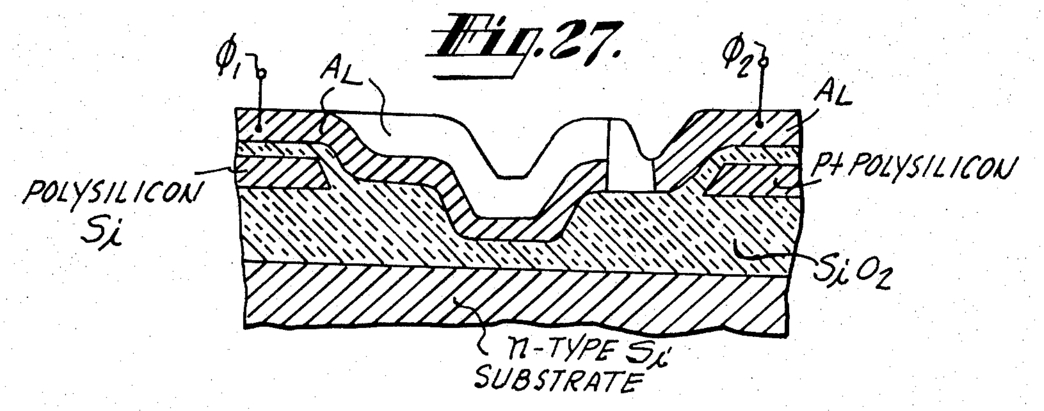
Figure 28:
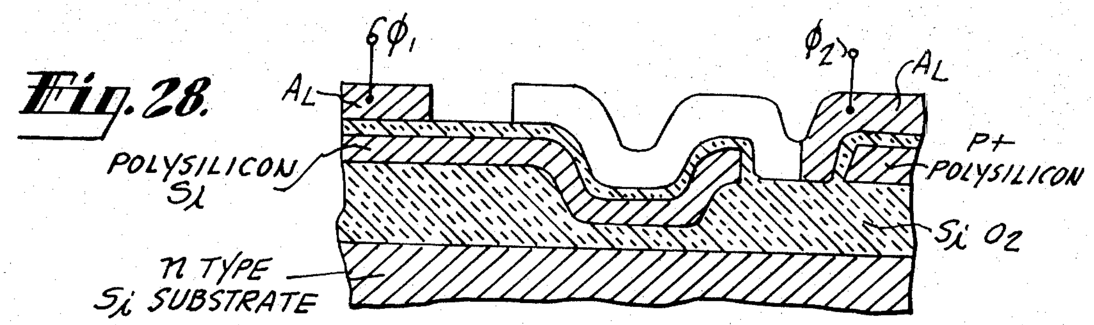

A two dimensional array operating on the principles discussed in connection with FIGS. 23 and 24 is illustrated in FIG. 25. This array has substantially the same packing density as the arrangement of FIG. 17 and it employs a voltage offset as in the structure discussed in connection with this figure and FIGS. 11 and 12. As in previous arrangements, there are thin silicon dioxide film and thick silicon dioxide film regions. Such thin film regions are present, for example, at 11—11 in FIG. 25. The cross section at these regions may be as shown in FIG. 11 or as shown in FIG. 12. The thick film regions are located between the thin film regions. Two cross sections, along lines 27—27 and 28—28 respectively, which are shown in FIGS. 27 and 28, show both the thick and thin film regions.

One additional feature of interest in FIG. 25 is the method for conducting the two phase voltages to the tabs of the array. Taking the phase 1 voltage as an example, it is directly conducted via aluminum conductor 116 to the alternate aluminum lines 118, 120, 124. The more negative phase 1 voltage is conducted via aluminum conductor 126 to the polysilicon line 128 along the entire extent of this line. This direct connection is shown more clearly in FIG. 26 which is a section taken along line 26—26 of FIG. 25. The long polysilicon line 128 is connected in parallel to the polysilicon lines **118*a*, 120*a*, 124*a*. Similar structure is employed for the phase 2** voltage.

In the arrangement of FIG. 25 as in the FIG. 23 arrangement, the capacitance between each aluminum line such as 118 and its corresponding polysilicon line such as 118*a* is made much greater than that between the polysilicon line and the substrate. The reason is the relatively close spacing between lines 118 and 118*a* over a relatively large surface area, just as discussed in connection with FIG. 23.

The operation of the FIG. 25 arrangement should be clear from what already has been discussed in connection with FIG. 23. Charge may be introduced into a shift register in the manner discussed in connection with the input end of the system. This charge once present in a shift register travels in one direction (to the right) in the uppermost shift register; it travels in the opposite direction (to the left) in the next shift register and so on. The couplings between registers comprise regeneration circuits to be discussed shortly.

COUPLING BETWEEN ADJACENT SHIFT REGISTERS OF THE SYSTEM

Figure 29:
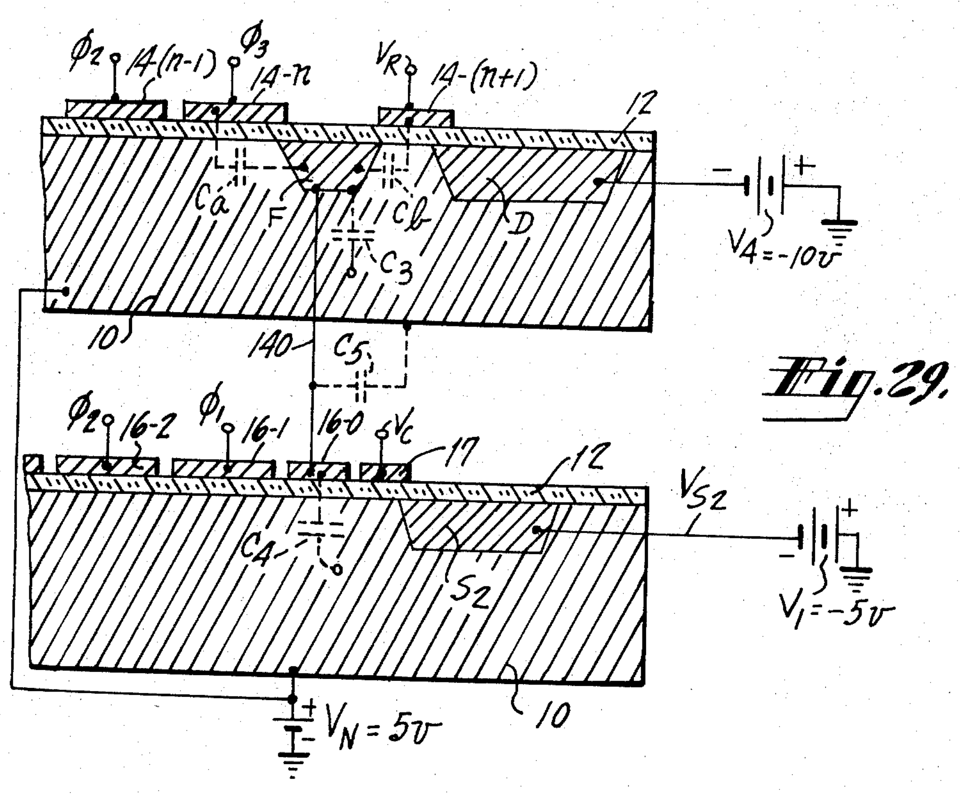
FIG. 29 is a schematic, cross-section through one form of coupling structure embodying the invention for a three-phase shift register system, that is, one form of structure for coupling the output end of one register to the input end of a second register.

FIG. 29 shows in cross-section the coupling between the output end of one register and the input end of a second register. For purposes of the present discussion, the plates or electrodes 14-($n$-1), 14-*n*, 16-0 and so on are shown simply as single elements. Their actual structure may be similar to that already discussed in connection with FIGS. 9, 11 and 12 and will be discussed and shown later. The substrate 10 is a common substrate and the silicon dioxide layer 12 is also common.

The new structure of FIG. 29 not previously shown comprises a floating region or junction F and a drain D, both formed in the substrate. These are highly doped $p+$ silicon regions similar to the source $S_1$ shown in FIGS. 4 and 7. The floating junction F and drain D correspond to the source and drain electrodes respectively of an MOS transistor and the electrode 14-($n$+1) corresponds to the gate electrode of such a transistor. The drain D is connected to a voltage supply $V_4$ which provides a voltage of a value such as −10 volts.

The input end of the next shift register includes a source $S_2$ and gate electrode 17 whose function and structure are similar to that of the source $S_1$ and gate electrode 14-0, respectively shown in previous figures. The function of the electrode 17 controlled by the voltage pulse $V_c$ is to provide the timing for the transfer of the charge signal from the source $S_2$ to the potential well beneath the first electrode 16-1. As described previously this potential well beneath the first electrode of the second shift register can be filled with charge to a known-in-advance extent such that its surface potential approaches the voltage of the source $S_2$, that is, the voltage of the supply $V_1$ which may be a value such as −5 volts.

FIG. 29 shows also some of the capacitances in the system. These are defined below and their significance in the operation of the system will be discussed briefly later.

$C_a$ = the capacitance between electrode 14-*n* and floating junction F $C_b$ = the capacitance between the reset electrode 14-($n$+1) and the junction F $C_3$ = the capacitance between the junction F and the substrate 10

$C_4$ = the capacitance between the gate electrode 16-0 and the substrate 10

$C_5$ = the capacitance between the substrate 10 and the conductor 140 joining the junction F to the gate electrode 16-0

$C_F = C_a + C_b + C_3 + C_4 + C_5$ = the total effective capacitance of the floating junction F.

The operation of the system of FIG. 29 will be discussed first for the case in which the capacitances $C_a$ and $C_b$ are substantially smaller than $C_F$. It is also assumed, for purposes of this explanation, that the shift registers are operated with a three-phase voltage source as this is one of the simpler modes of operation. The operation of other structures with four-phase voltage sources and two-phase voltage sources will be discussed later.

Figure 30:
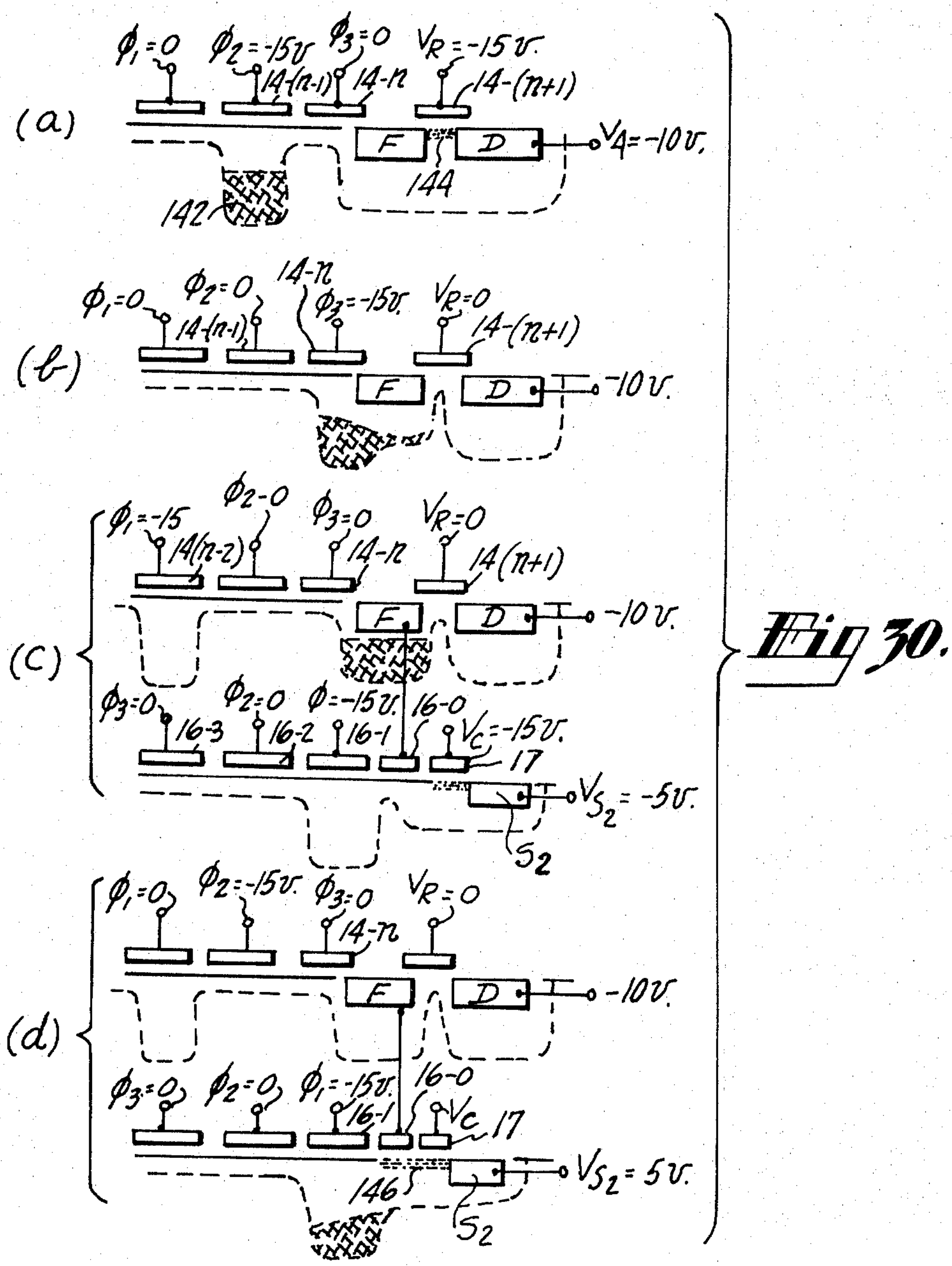
FIG. 30 is a drawing to illustrate the propagation of charge in the circuit of FIG. 29.
Figure 31:
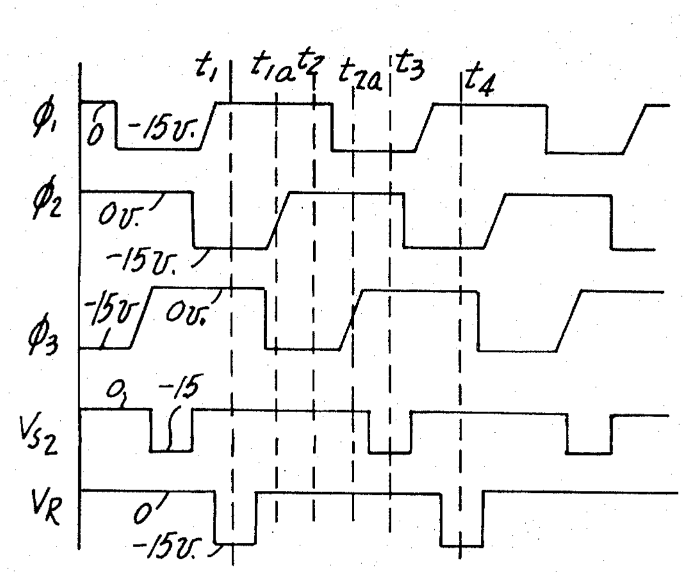
FIG. 31 is a drawing of waveforms employed in the circuit of FIG. 29.

The waveforms employed in the operation of the FIG. 29 circuit are shown in FIG. 31. FIG. 30 shows in a schematic way the potential wells which form and the way in which charge is transferred in response to the application of the waveforms of FIG. 31.

FIG. 30($a$) illustrates the operation during the $\phi_2$ pulse (time $t_1$ of FIG. 31). A reset pulse $V_R$ which preferably is more negative than the power supply voltage $V_4$ is concurrent with the negative $\phi_2$ pulse. FIG. 30($a$) shows that a charge 142 has accumulated in the potential well beneath electrode 14-($n$−1) in response to the $\phi_2$ pulse. Concurrently, the −15 volt $V_R$ pulse applied to the reset electrode 14-($n$+1) has created a low impedance channel, illustrated schematically at 144, between the source F and drain D electrode which resets the region F to a reference potential close to the value of $V_4$ while the charge accumulated in F during the previous cycle is transferred to the drain D.

FIG. 30($b$) illustrates the situation after the phase two pulse is terminated and the phase three pulse $\phi_3$ starts. The time may be $t_2$ of FIG. 31. The charge formerly present under electrode 14-($n$−1) has spilled into the combined potential well beneath electrode 14-*n* and the junction F. In the example given, the well beneath electrode 14-*n* is deeper than that beneath electrode F (14-*n* is at −15 volts and F is at approximately −10 volts) so the charge tends to accumulate in the former region of the potential well, as shown. During this time $t_2$, the reset voltage $V_R$ is 0 volts. Accordingly, there is a potential barrier created beneath the reset electrode or, put another way, the channel between the junction F and the drain D is in its high impedance condition. If one considers F as a source, the electrode 14-($n$+1) is a gate and D is a drain, all of an MOS transistor, this transistor is cut-off, and and none of the charge passes to D.

When the next $\phi_1$ pulse occurs, the situation is as depicted in FIG. 30($c$). This figure illustrates that after the positive transition of pulse $\phi_3$ (such as at time $t_{2a}$ in FIG. 31), the charge, if present under an electrode 14-*n*, will be transferred to the floating junction F. Assuming that charge is present at the floating junction F, the potential of this floating junction becomes relatively positive (actually becomes less negative). As this floating junction is directly connected to the control electrode 16-0, it places this control electrode at a relatively positive potential so that the potential well beneath this electrode becomes very shallow. This shallow potential well acts as a voltage barrier. During this same period, such as $t_3$ of FIG. 31, the pulse $V_c$ is applied. This pulse causes a conductive channel to extend from the source electrode $S_2$, which is at a voltage of −5 volts, to a region of the sub-strate beneath electrode 17. However, as the control electrode 16-0 is at a substantially more positive voltage than $V_T$ −5 volts, the voltage of the conductive channel, the charges cannot flow from the source $S_2$ into the potential well created beneath electrode 16-1 by the negative $\phi_1$ voltage pulse applied to this electrode.

The case in which the last bit stored in the first register is a 0 rather than a 1 is illustrated in FIG. 30(*d*). Here, during the $\phi_3$ pulse, a 0 is stored beneath electrode 14-*n*. The floating junction F therefore remains negative to the extent of roughly −10 volts, the voltage to which it was charged during the $\phi_2$ pulse. This voltage applied to control electrode 16-0 is in the forward direction so that during the pulse $V_c$ a conduction channel 146 extends from the source $S_2$ to the region of the substrate just beneath electrodes 17 and 16-0 to the potential well created under the first electrode 16-1 by the −15 volt $\phi_1$ pulse. This permits the positive charge carriers available at the source $S_2$ to flow to the potential well beneath electrode 16-1 until the surface potential of the well starts to approach the potential of the source $S_2$. Thus, in response to a 0 stored beneath the last plate 14-*n* of the first shift register, a 1 is transferred to the first plate 16-1 of the next shift register.

Summarizing what has been discussed up to this point, during the $\phi_2$ pulse, a charge indicative of the bit 1 may be stored under electrode 14-(*n*−1). During the $\phi_3$ pulse, the bit 1 transfers to the potential well beneath electrode 14-*n*. During the $\phi_1$ pulse, the absence of a charge, indicative of the bit 0, becomes stored under the first electrode 16-1 of the next shift register. Thus, it is clear that when the last bit in the first register is a 1, its complement 0 is shifted into the second shift register. The discussion also showed that when the last bit in the first register is a 0, its complement 1 is shifted into the second shift register.

Figures 32, 33:
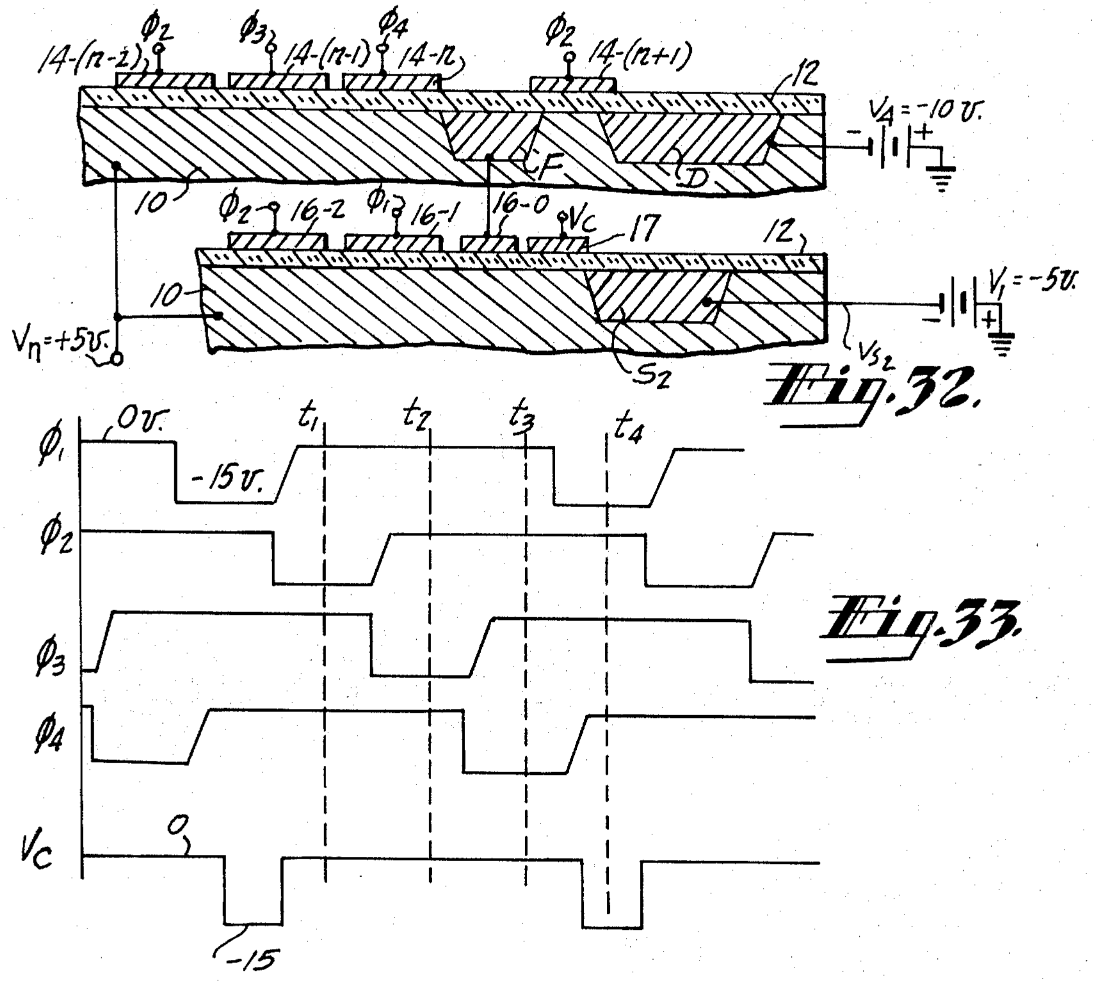
FIG. 32 is a schematic cross-section showing another form of coupling structure embodying the invention, this one for a four-phase shift register system.
FIG. 33 is a drawing of waveforms employed in the operation of the circuit of FIG. 32.

The circuit of FIG. 32 is the same as the one in FIG. 29, however a four-phase voltage source rather than a three-phase voltage source is employed. The use of a four-phase rather than three simplifies the timing somewhat as the $\phi_2$ pulse may be applied to electrode 14-(*n*+1) rather than the $V_R$ pulse.

In the operation of the FIG. 32 embodiment, during the $\phi_2$ pulse (time $t_1$ of FIG. 33) a charge, if present, is moved beneath electrode 14-(*n*−2). This same pulse applied to electrode 14-(*n*+1) causes an inversion layer to form between the floating junction region F and the drain electrode D causing region F to discharge the positive charge it may have accumulated in the previous cycle and to assume a negative voltage level of approximately −10 volts. During the $\phi_3$ pulse, the charge present under plate 14-(*n*−2) moves to the region of the substrate under plate 14-(*n*−1). During the $\phi_4$ pulse (time $t_3$ of FIG. 33), the charge moves to the region under plate 14-*n* and may start to accumulate at the floating region F. The transfer of charge into F is completed by the end of the $\phi_4$ pulse and this places the control electrode 16-0 at a relatively positive value with respect to the potential of $S_2$ if F has accumulated a positive charge representing the bit 1 and at a negative value if region F remains negative representing the bit 0.

During the $\phi_1$ negative pulse applied to electrode 16-1, the control voltage pulse $V_c$ is applied to electrode 17. This occurs at time $t_4$ of FIG. 33. Depending upon whether electrode 16-0 is relatively negative or relatively positive, with respect to $S_2$, the conductive channel will or will not be extended from the source $S_2$ to the potential well under electrode 16-1. In other words, the positive carriers available at region $S_2$ either will pass or not to the region of the potential well beneath electrode 16-1.

In the discussion above, the operation of the system with overlapping pulses has been considered. Such operation produces the transfer of charge from one well to the next by lowering the surface potential of a following well while the potential of the well containing the charge to be transferred is being raised, thus forcing its charge to spill into the following potential well. By using a relatively large substrate bias $V_n$ such as a bias of 10–15 volts, it is possible to operate the system with multiple phase pulses which do not overlap. Under such conditions, the control pulse $V_R$ can be replaced with an appropriate one of the multiple-phase voltage pulses. In this case whether or not the control pulse $V_c$ may be eliminated entirely will depend upon how quickly the charge can be transferred from under electrode 14-*n* to the region under floating region F. If this charge transfer is sufficiently rapid (takes a shorter interval that the interval between the non-overlapping pulses $\phi_3$ and $\phi_1$ (FIG. 29) then proper operation is obtained.

Returning to FIG. 29, if the capacitances $C_a$ and $C_b$ are more than a small fraction of the value of the total capacitance $C_F$ of the floating F region, the operation of the output circuit may be appreciably different from the operation just discussed. Consider first the effect of the capacitance $C_b$. If the value of this capacitance is not negligible compared to the total capacitances $C_F$, then at the lagging edge of the reset pulse $V_R$ applied to electrode 14-(*n*+1), where the positive-going voltage transition occurs, this positive transition will be capacitively coupled to the region F, resulting in a positive step in the potential of F. The result is that at the end of this reset pulse $V_R$, the region F will be at a higher (more positive) potential than $V_4$ (the direct voltage at which the drain region D is maintained). As all of the circuits to be considered should have the value of $C_b$ as small as possible, the amount of overlap between electrode 14-(*n*+1) and floating region F should be minimal. One way to achieve minimum overlap is to employ a "self-aligned polysilicon gate" as shown at 14-(*n*+1) in FIG. 37. This may be made by the procedure described later.

While the presence of the capacitance $C_b$ should be avoided, the capacitance $C_a$ can be used to advantage to achieve another mode of operation of the output circuit. The circuit may be schematically represented in exactly the same way as FIG. 29 for the case of a three-phase charge coupled shift register, however, the negative timing control voltage pulse $V_c$ may be eliminated.

In operation, the principal difference between this form of circuit and the one already described in connection with FIG. 29 is that, due to the relatively large capacitive coupling $C_a$, the potential of the floating F region tends to follow the voltage swing of the overlapping electrode 14-*n* which is driven by the $\phi_3$ voltage pulse. Thus, during the $\phi_3$ pulse, the F region goes relatively highly negative. It is therefore possible to use directly the potential of the floating region F to control the passage of charge from the source $S_2$ to the first potential well (under electrode 16-1) of the second shift register. In other words, if during the negative $\phi_3$ pulse there is no charge present beneath electrode 14-n, indicative of storage of the bit 0, the floating region F will maintain the gate electrode 16-0 sufficiently negative to permit charge to flow from the source $S_2$ to the region under electrode 16-1 during the time that the leading edge of negative pulse $\phi_1$ overlaps the lagging edge of negative pulse $\phi_3$. On the other hand, if during the $\phi_3$ pulse there is positive charge representing a 1 present under plate **14-*n*, the floating F region becomes sufficiently positive to prevent the flow of charge from the source $S_2$ to the region under electrode 16-1** during the next $\phi_1$ pulse. All of this is possible without the need for the additional timing control pulse $V_c$.

There are a number of other characteristics of the circuit operation which can be taken advantage of when there is a substantial capacitance at $C_a$. At the termination of the $\phi_3$ pulse (time $t_{2a}$, FIG. 31), the positive voltage swing of $\phi_3$ produces a positive voltage step at the F region that tends to modify the process of resetting F to the reference potential $V_4$. This effect can be used to simplify the output circuit in two ways. First the reset pulse $V_R$ can be replaced by a direct voltage level such as ground level (since the substrate is at a voltage $+V_n$) or some more negative potential such as $V_1$. Secondly, the structure of the output circuit can be simplified by operating the reset electrode **14-(*n*+1) as well as the drain D and the source $S_2$ at the same potential such as $V_1$. Finally, a special control waveform $V_a$ of FIG. 35** may be employed to enhance the circuit operation.

Figures 34, 35, 36:
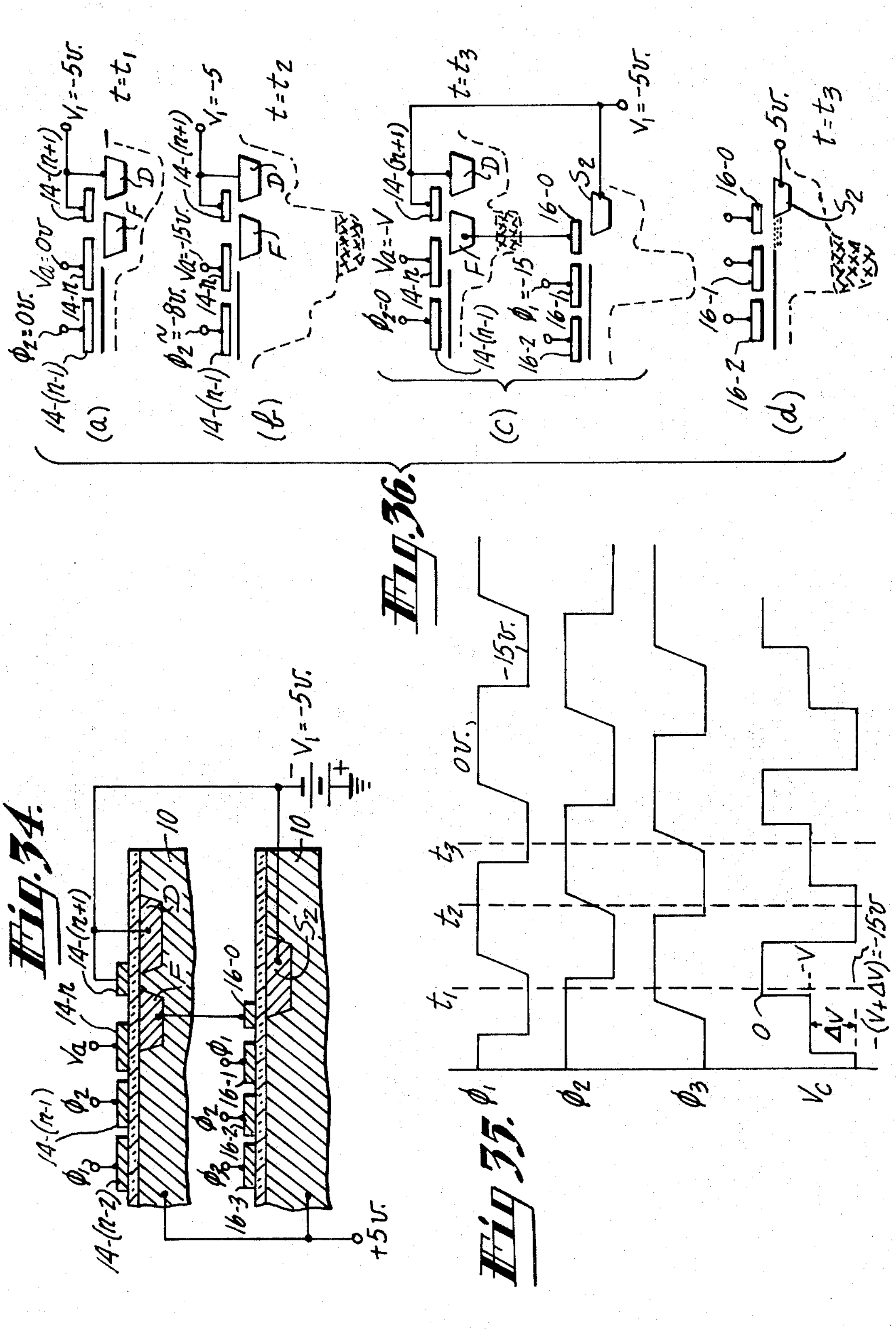
FIG. 34 is a cross-section of another form of coupling circuit embodying the invention.
FIG. 35 is a drawing of waveforms employed in the operation of the circuit of FIG. 34.
FIG. 36 is a drawing to help explain the operation of the circuit of FIG. 34.

A circuit combining the features above is shown in FIG. 34. The common voltage $V_1$ at which the electrodes D and $S_2$ are maintained may be −5 volts, whereas the substrate 10 may be biased to +5 volts.

In the description which follows of the operation of the circuit of FIG. 34, FIGS. 34, 35 and 36 should be referred to. At time $t_1$, there may be a charge present under electrode **14-(*n*−2). The composite waveform $V_a$ is at its most positive value which may be ground. In response to this positive pulse, the floating region F, which it will be recalled is capacitively coupled to electrode 14-*n* by some substantial value of capacitance $C_a$, also is driven relatively positive. As a result, the region F acts like a relatively highly forward-biased source electrode of an MOS transistor and any charge which may previously have been stored there is transferred via the channel region under electrode 14-(*n*+1) to the drain electrode D. In the process, electrode F attains a negative value not quite as negative as −5 volts. The actual value is −5 volts + $V_t$, where $V_t$ is the threshold voltage as already discussed. The configuration of the potential wells at time $t_1$ is shown in FIG. 36(*a*)**.

Thereafter, the $\phi_2$ pulse occurs and the charge present under electrode **14-(*n*−2) transfers to the region of the substrate under electrode 14-(*n*−1). This part of the operation is straightforward and is not illustrated in FIG. 36.**

At time $t_2$, the control voltage $V_a$ is at its most negative value. The negative pulse $\phi_3$ has started and the $\phi_2$ pulse is terminating. Assuming that the $\phi_2$ pulse has a maximum negative value of −15 volts the actual voltage present at electrode **14-(*n*−1) at this instant is about −8 volts. The potential wells created at this time are as shown in FIG. 36(*b*). The charge formerly present in the potential well beneath electrode 14-(*n*−1) spills into the potential well under electrodes 14-*n* and into F. The capacitive coupling between electrode 14-*n* and region F has driven region F to a more negative value than electrode 14-*n* as F initially was negative to the extent of almost −5 volts. Accordingly, the deepest potential well is at region F and if charge initially was stored under electrode 14-(*n*−2) it eventually accumulates in region F. It may also be observed that drain D is not as negative as region F and moreover, as electrode 14-(*n*+1)** is spaced from the substrate, the surface potential under it is somewhat less negative than that of the drain D.

During the above period time $t_2$, the $\phi_3$ pulse is on. This pulse is applied elsewhere in the system as, for example, to plate 16-3 of FIG. 34 to propagate a charge formerly stored under plate 16-2 to plate 16-3. One could, if desired, rather than employing the control voltage $V_a$, apply the $\phi_3$ pulse to the electrode **14-*n***, as already discussed, however, not as versatile control is obtained of the transfer of charge and signal regeneration as will be shown shortly.

At time $t_3$, the $\phi_1$ pulse is on. During this same period, the voltage $V_a$ is raised to a value intermediate 0 and −15 volts. The actual value employed is a function of such circuit parameters as the amount of capacitance $C_a$ (FIG. 29) and other distributed circuit capacitances.

The raising of the value of $V_a$ to −V makes the potential well under electrode F somewhat shallower but it still remains sufficiently deep to prevent most of the charge at F from passing to the region D. The value of −V is so chosen that in the case in which there is charge present at F, representing the bit 1, the voltage at 16-0 prevents the passage of charge from the source electrode $S_2$ to the region under 16-1. This set of conditions is illustrated at (*c*) in FIG. 36. The value of voltage $V_c$ must also be such that in the absence of charge at F, indicative of storage of the bit 0, a conductive channel region is created beneath electrode 16-0 which causes charge to transfer from the source $S_2$ to the region under electrode 16-1. This situation is illustrated at (*d*) in FIG. 36.

The circuit of FIG. 34 is particularly attractive when implemented with MOS devices (F, **14-(*n*+1), D) of the enhancement type which have low threshold voltages. It should also be pointed out that other embodiments of the invention already discussed may advantageously employ special waveshapes such as $V_a$ of FIG. 35 for control of the electrode which overlaps the floating junction region F. This permits better control of the timing of the potential developed at the floating region F and also permits the shift of the potential at F to a more negative value (when F is receiving a charge from under an electrode such as 14-(*n*−2) (FIG. 34)) and to a less negative value −V in FIG. 35 chosen to provide the desired threshold level for signal regeneration when the potential well under the first storage electrode 16-1 of the next register is ready to accept charge. This means that the positive step ΔV at $V_a$ (capacitively coupled to F) also is an additional control to insure that when the region of the substrate adjacent to F is filled to the allowable extent with charge, the potential at F (applied to electrode 16-0) will cut-off the flow of charge from source electrode $S_2$ to the region under the first storage electrode 16-1.**

Figures 37, 38:
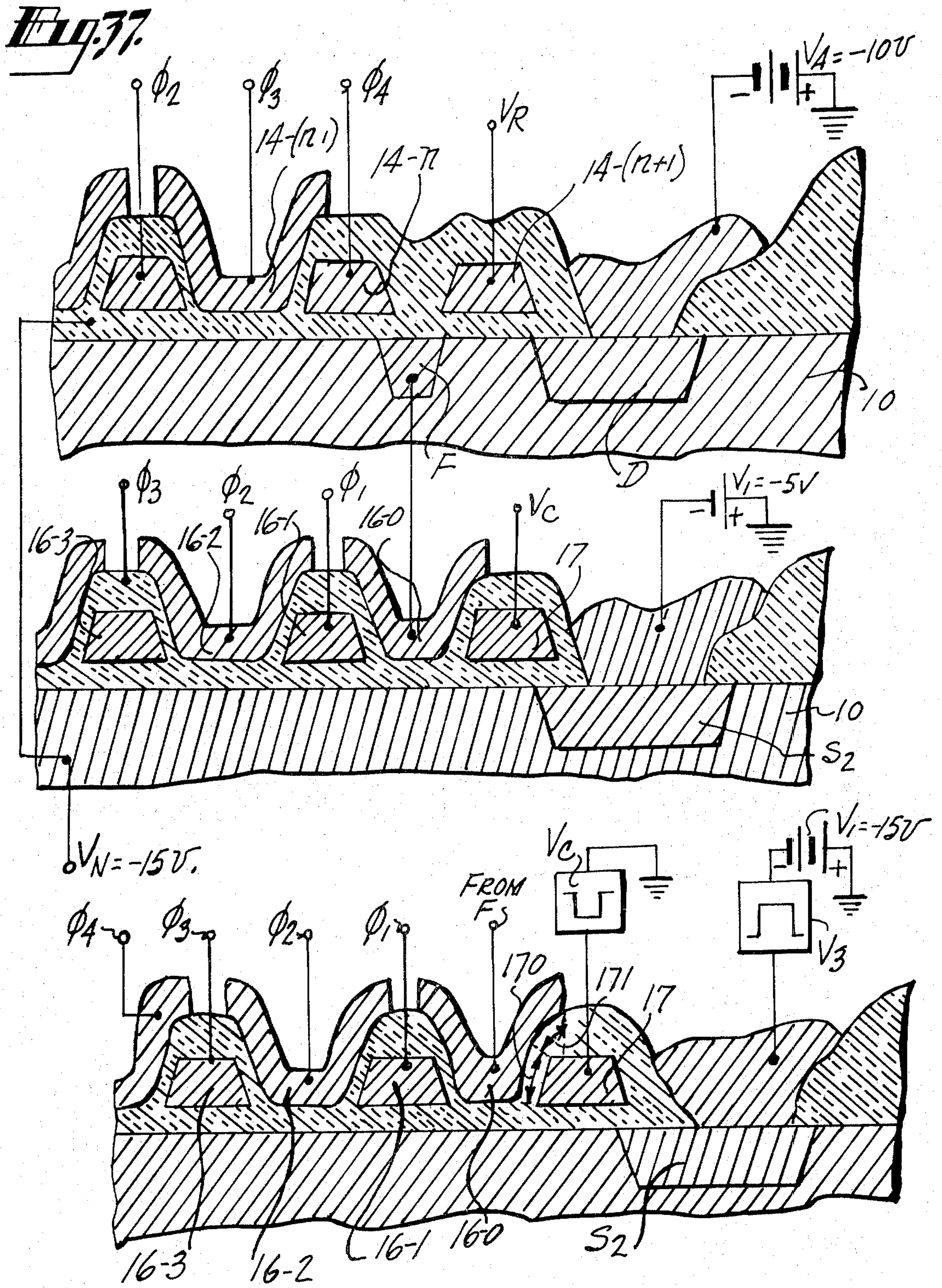
FIG. 37 is a more realistic showing of another form of coupling circuit embodying the invention, this one for a four-phase shift register system.
FIGS. 38 and 39 are cross-sections showing modifications in the input circuit of the receiving register of FIG. 37.

FIG. 37 illustrates in a more realistic way the actual structure which may be employed for the portion of the system shown schematically in FIG. 29. Note, however, that here and elsewhere the thicknesses of the electrodes (their vertical dimensions) are not shown to scale and they are drawn in much larger proportion than are the horizontal (length) dimensions of the electrodes. This same structure and the alternatives of FIGS. 38, 39 and 40 are also suitable for the structure shown schematically in FIGS. 32 and 34.

FIG. 37 represents a silicon gate implementation of the four-phase charge coupled system described previously in connection with FIGS. 32 and 33. FIG. 38 shows the lower one of the two shift registers of FIG. 37 in a modified version. Here, the signal regeneration is accomplished by the coincidence of two control pulses $V_c$ and $V_3$. In this case the voltage pulse $V_c$ provides the timing for introducing the charge into the second shift register. The control pulse $V_3$ determines whether or not or how much charge is to be transferred to the first potential well of the second shift register. The selective timing of these two control pulses has already been described under the section dealing with the input end of the system.

Figure 39:
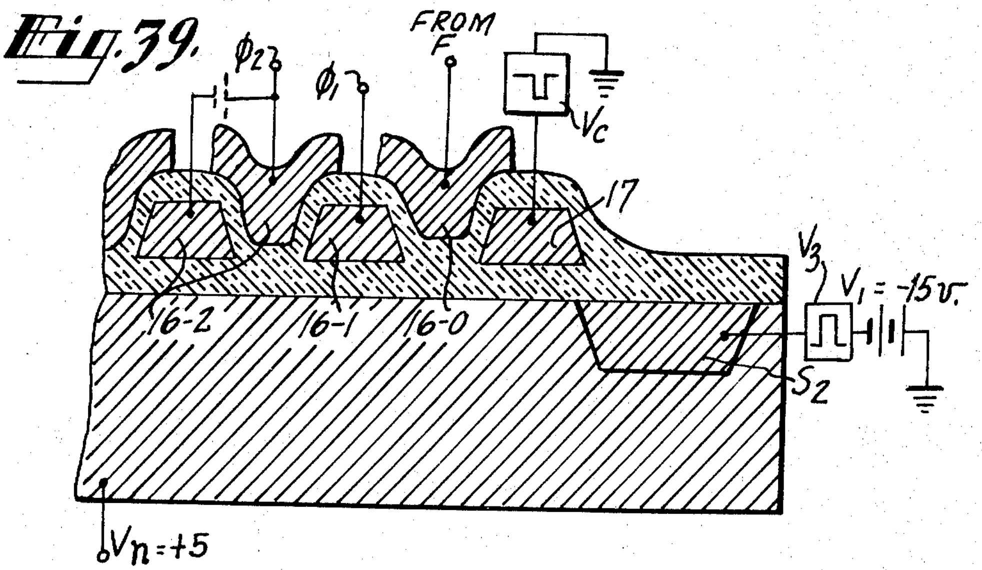

FIG. 39 is a generalized showing of the input end of a register similar to that of FIG. 38 but intended for two-phase operation. The signal regeneration in a specific, similar two-phase charge coupled system is described in more detail later in connection with FIGS. 42, 43 and 44.

Figure 40:
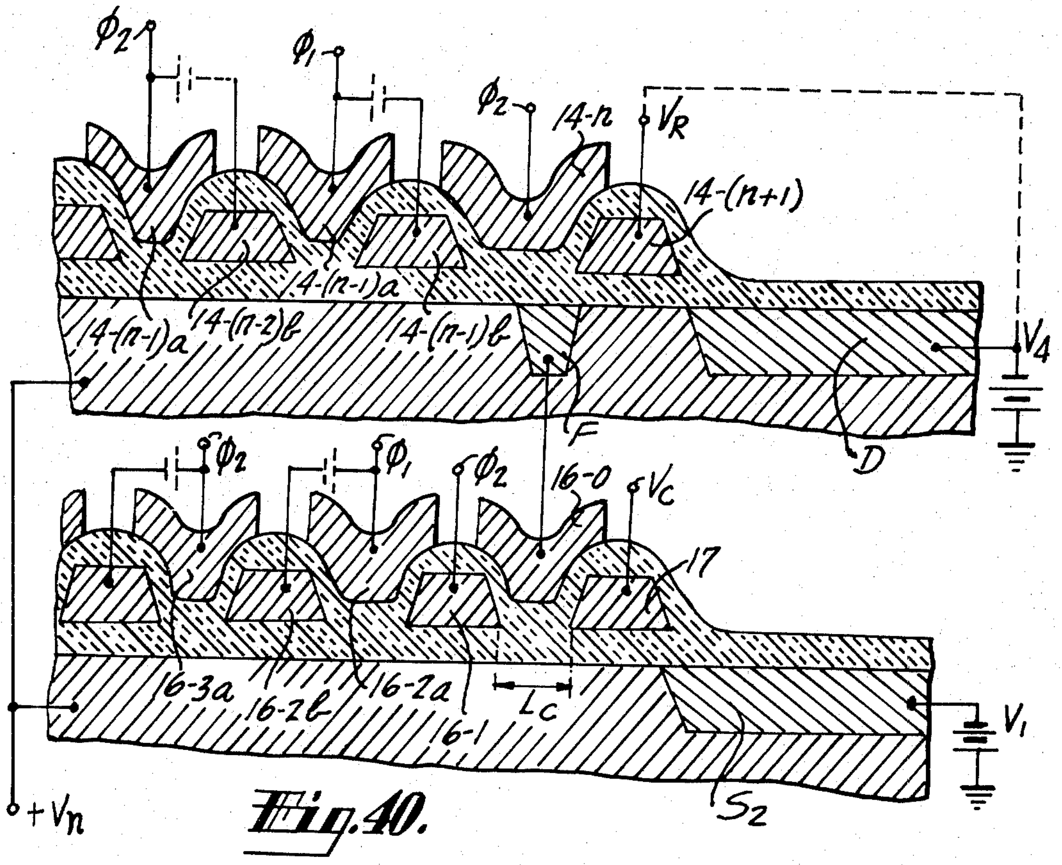
FIG. 40 is a cross-section of another form of coupling circuit embodying the invention, this one operated by a two-phase voltage supply.

Returning to FIG. 38, here just as in the case of the system shown in FIGS. 37, 39 and 40, the floating region F is connected to an aluminum electrode 16-0 which is of the self-aligned type and which can be made to have a relatively small amount of capacitance to the substrate 10. While the electrode 16-0 is spaced relatively close to the additional control electrode 17 — a polysilicon electrode, in the region 170, this region 170 is very small, of the order of ½ micron. Accordingly, the presence of electrode 17 does not add significantly to the capacitance of the electrode 16-0. For the remainder of the overlapped portion, region 171, the silicon dioxide may be made relatively thick-of the order of several thousand angstroms (the drawing is not to scale). This relatively large spacing over a relatively large distance means that the capacitance in this region is relatively small. The polysilicon electrode 17 already mentioned is located between the aluminum electrode 16-0 and the source $S_2$.

It should be added that in the case of the four-phase system, such as described in connection with FIG. 34, but still made using polysilicon and aluminum electrodes and having an output stage similar to that of FIG. 40, the floating region F of the first register can be connected to the electrode 17 of the second register shown in FIG. 37. In this case the $\phi_1$ voltage is applied to 16-0, $\phi_2$ to 16-1, $\phi_3$ to 16-2, and $\phi_4$ to 16-3.

All of the structures discussed above for the input end of the second register may be employed at the input end of the first and all other registers. In other words, the structures schematically shown in FIGS. 4 and 7 may, in practice, be as is shown in one or more of the last three figures discussed.

Figure 41:
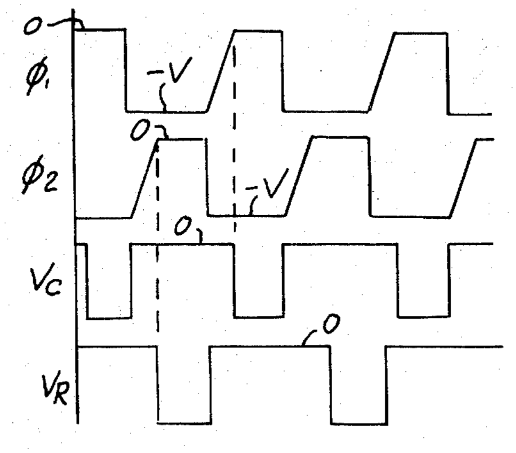
FIG. 41 is a drawing of waveforms employed in the operation of the circuit of FIG. 40.

FIG. 40 illustrates a version of the coupling circuit suitable for two-phase operation in which, just as previously described in connection with FIG. 34, the overlapping capacitance $C_a$ is a relatively large fraction of the total capacitance $C_F$ of the floating junction F. The structure is similar in many respects to that already discussed. The waveforms employed in the circuit operation are shown in FIG. 41.

In operation, during the negative $\phi_1$ pulse, the negative voltage pulse $V_R$ occurs. This discharges any charge carriers which may have accumulated in the floating region F and the floating region F assumes a negative potential close to that of the voltage supply $V_4$. During the next $\phi_2$ pulse, the charge, if any, accumulated under electrode pair 14-$(n-1)a$, 14-$(n-1)b$ transfers to the region under electrode **14-*n* and the floating region F. Shortly after the start of the negative $\phi_2$ pulse, the negative control pulse $V_C$ occurs and this causes a conduction channel to form under polysilicon electrode 17 effectively extending the source $S_2$ region. Now charge will flow from $S_2$ to the first potential well under electrode 16-1, or not, depending upon whether electrode 16-0 is relatively negative (no positive charge at F) or relatively positive (indicative of the bit 1 stored at 14-*n*** and F) compared to the potential of the source $S_2$.

Figure 42:
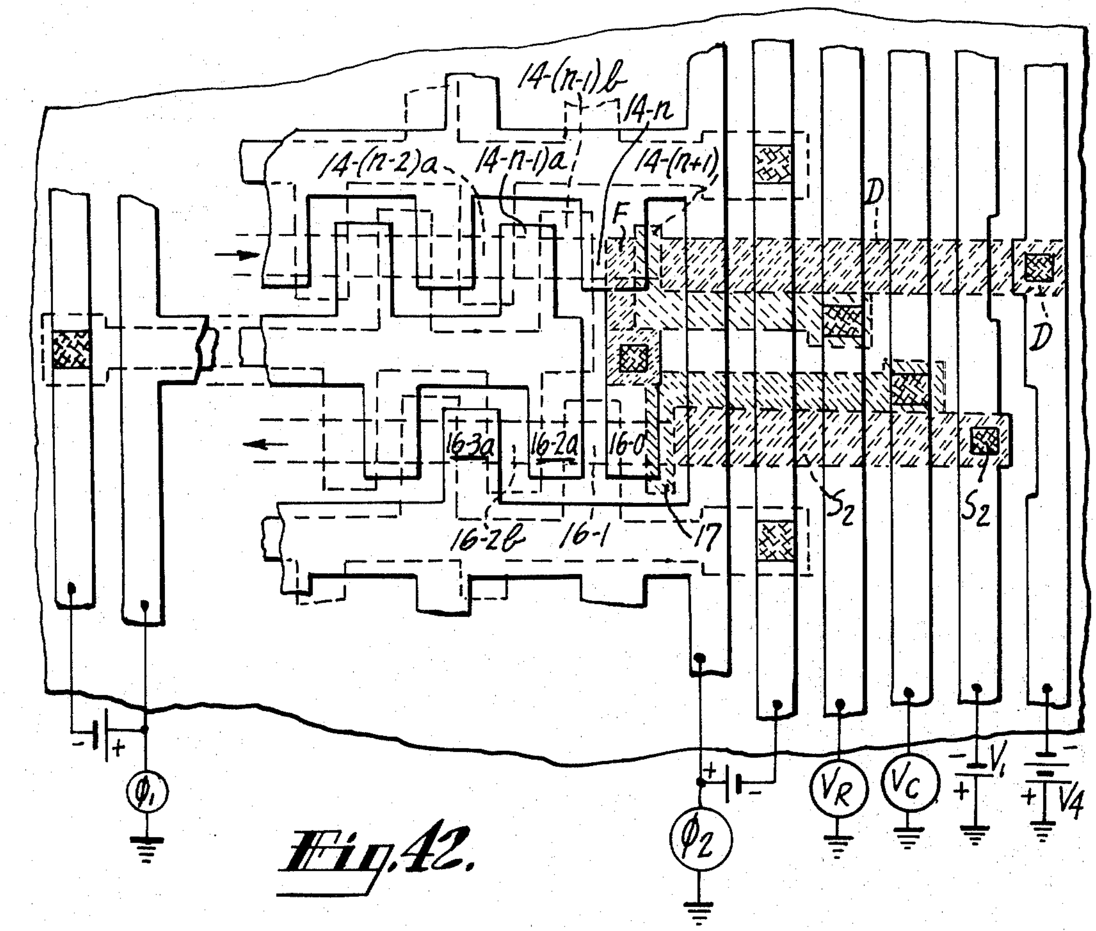
FIG. 42 is a plan view showing how the circuit of FIG. 40 may be layed out.

FIG. 42 is a plan view of a portion of a two dimensional, shift-register array a part of which is shown in cross-section in FIG. 40. To aid the reader to interpret FIG. 42, parts in FIG. 42 corresponding to those in FIG. 40 are identified by the same reference numerals. The economy of layout which is possible with two-phase operation should be evident from FIG. 42.

Figure 44:
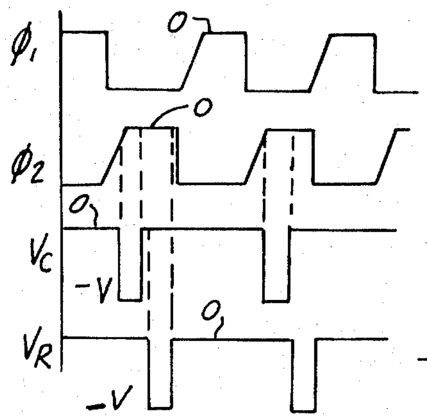
FIG. 44 is a drawing of waveforms employed in the operation of the circuit of FIG. 43.
Figure 43:
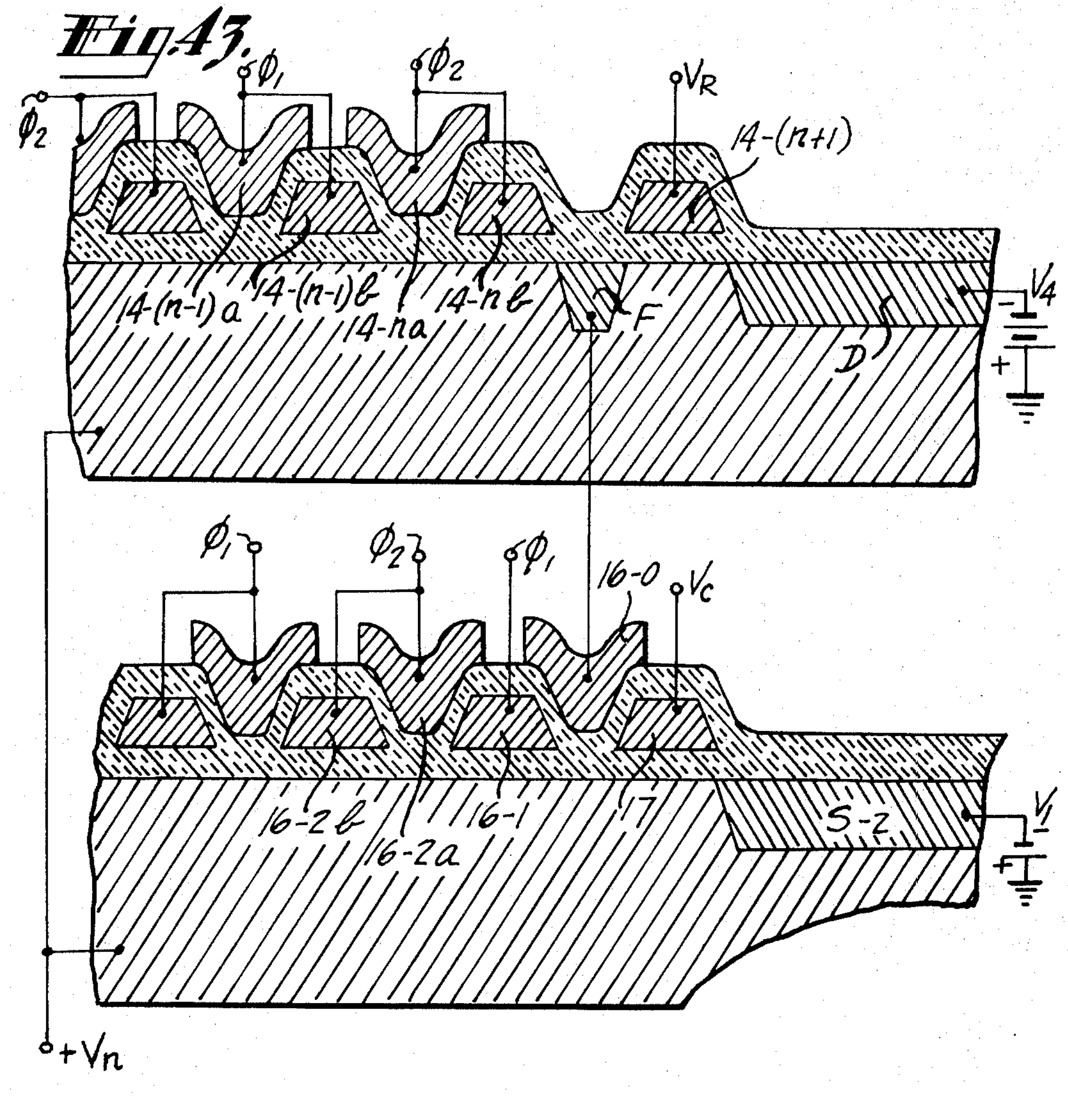
FIG. 43 is a cross-section through another form of coupling circuit operated by a two-phase power supply.

Another form of two-phase coupling circuit is shown in FIG. 43. Here, the last electrode of the first shift register comprises an electrode pair **14-*na*, 14-*nb* rather than the single electrode of FIG. 40. In addition, the first electrode 16-1 of the second shift register is driven by a phase 1 pulse rather than a phase 2 pulse. In addition, the timing waveforms of FIG. 44 are somewhat different than those employed for the circuit of FIG. 40.**

In the operation of the circuit of FIG. 43, during the $\phi_1$ pulse, the reset pulse $V_R$ occurs and the floating electrode resets to the reference negative voltage level. When the next $\phi_2$ pulse occurs, the charge present, if any, under electrode pair 14-$(n-1)a$, 14-$(n-1)b$ transfers to the potential well under electrode pair **14-*na*, 14-*nb* and from there spills into the potential well beneath the floating electrode F if during the $\phi_2$ pulse the electrode F is at a more negative potential than the electrode pair 14-*na*, 14-*nb*.**

The transfer of charge from the last potential well of the shift register to the floating region F is completed during the lagging edge of $\phi_2$. At this time, during the pulse $V_c$ (which occurs during the first part of negative pulse $\phi_1$, a conduction channel extends from the source $S_2$ to beneath electrode 17. If at the same time the floating electrode F is relatively negative, charge flows from $S_2$ through this channel region and through the channel region formed under electrode 16-0 to the potential well beneath electrode 16-1 created by $\phi_1$. If, on the other hand, electrode 16-0 is relatively positive, indicative of the storage of a 1 at floating electrode F, then a barrier is created beneath electrode 16-0 and no charge flows from $S_2$ to the potential well beneath electrode 16-1.

Shortly after the control pulse $V_C$ has terminated and still during the negative pulse $\phi_1$, the reset pulse $V_R$ occurs to reset the floating electrode F, that is, to place it at its reference potential. No charge can flow from the source $S_2$ at this time, however, as $V_C$ is at ground potential, thus forming a barrier for the transfer of charge from the source $S_2$.

Figure 45:
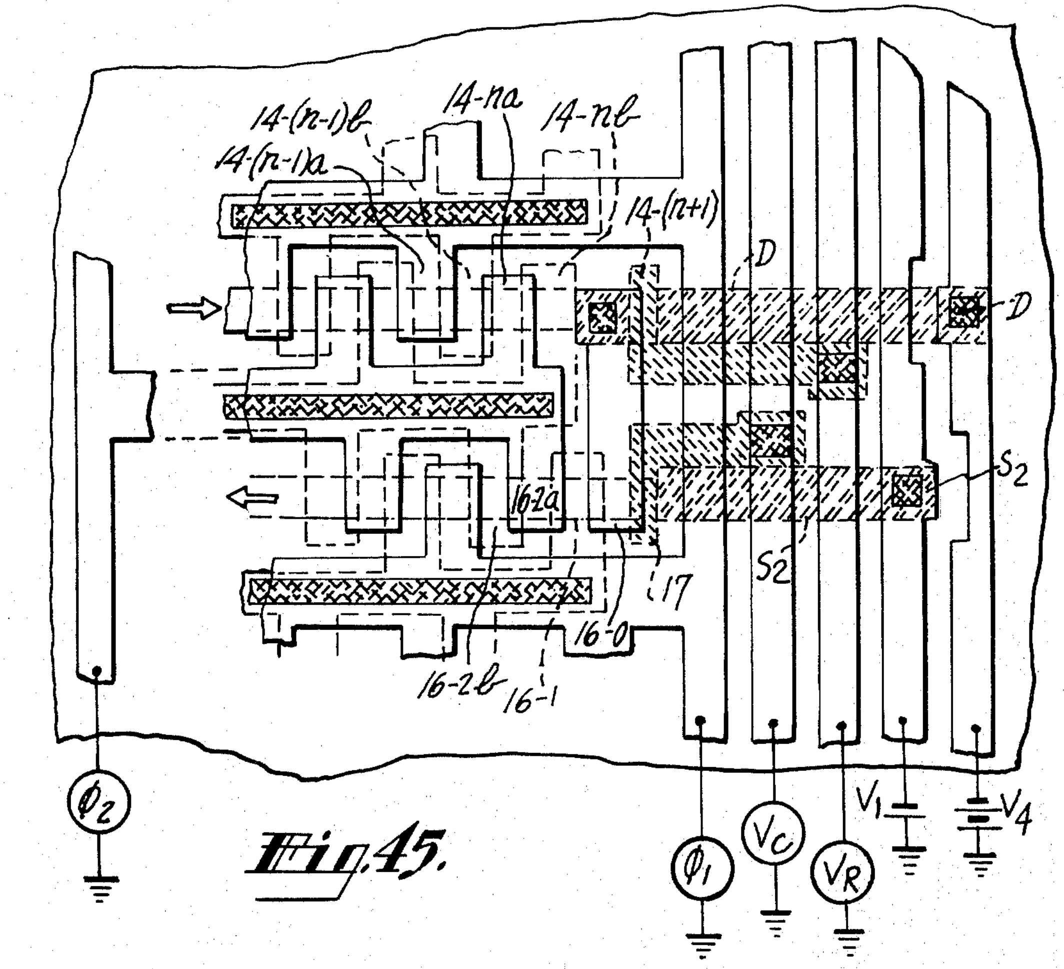
FIG. 45 is a plan view of how the circuit of FIG. 43 may be layed out.

FIG. 45 is a plan view of a portion of a two-dimensional, shift-register array such as shown in part in FIG. 43. Again, the economy of layout should be self-evident.

While not illustrated, it is to be appreciated that various other permutations and combinations of the various arrangements described may be employed. To give but one example, it is clear that the simplified structure of FIG. 34 may be employed in the two-phase version of the shift register.

Returning briefly to FIG. 40, as already mentioned the construction of the signal regeneration stage can be somewhat simplified, as is evident from the layout in FIG. 42, if the circuit is designed to operate without the resetting control voltage pulse $V_R$. This modification of the circuit is illustrated schematically by the dashed line connecting the electrode 14-($n$+1) to the same power supply $V_4$ as is employed for the drain D. In a preferred form of the invention, a common power supply is employed for D, 14-($n$+1) and $S_2$ in the same fashion as indicated previously in FIG. 34 for the case of a three-phase system.

Figure 46:
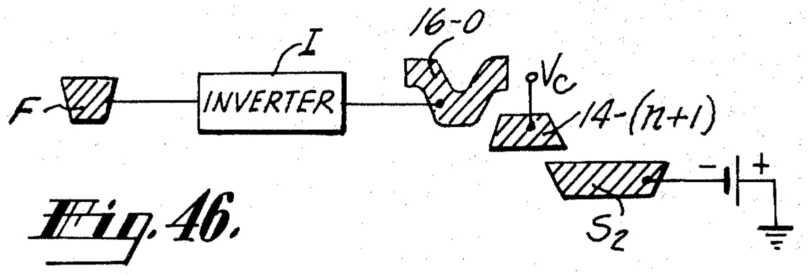
FIG. 46 is a block and schematic showing of another form of coupling circuit embodying the invention.

In the embodiments of the invention illustrated thus far, each shift register receives the complements of the bits stored in the preceding shift register. The circuit shown schematically in FIG. 46 permits each shift register to supply the bits themselves to the next shift register. The floating electrode F, rather than being directly connected to the gate electrode 16-0 of the next register, is instead connected thereto through an inverter I. In other respects, the operation is the same as that already discussed. The inverter also may be employed in the various other embodiments of the invention discussed. In practice, the inverter may be made of metal-oxide-semiconductor devices which are integrated into the same substrate as the remainder of the system or, alternatively, may be a circuit external of the substrate.

In the embodiment of the invention illustrated in FIG. 21, a plurality of bits are transmitted in parallel in the region 100. It was mentioned in the discussion of this figure that this plurality of bits may be a byte of information. Particularly advantageous operation can be achieved if, in addition, the complement of the byte is transmitted concurrently. Thus, a system of this type comprises $n$ pairs of charge-coupled shift registers (where $n$ is an integer which in the limiting case is 1, which normally is 6 or 8 and which may be a substantially larger number). One shift register of each pair stores the bits and the other the complements of the bits and each such pair may be connected to a balanced detector as shown in FIG. 47.

Figures 49, 50:
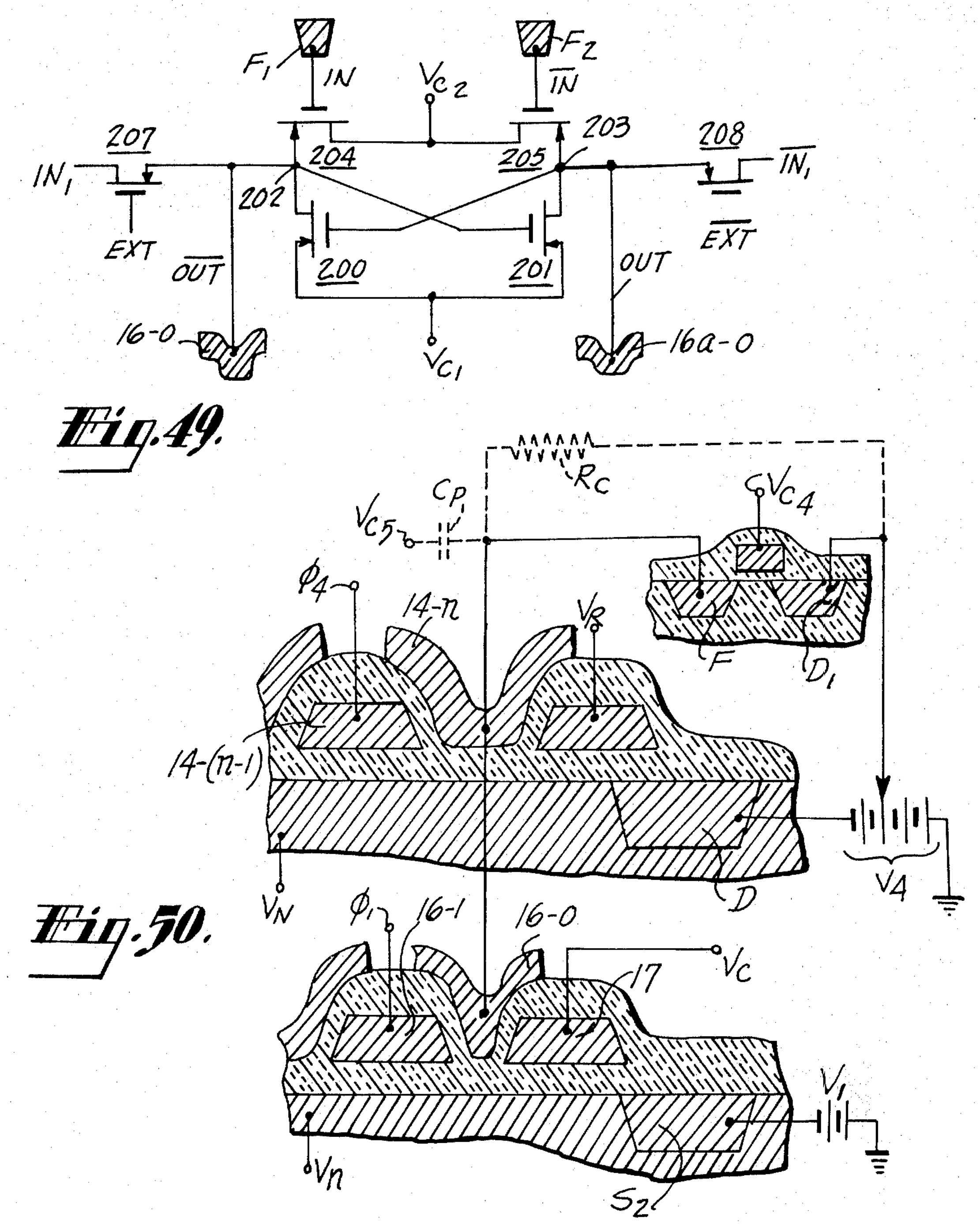
FIG. 49 is a schematic showing of another form of the circuit of FIG. 47 may take.
FIG. 50 is a cross-sectional and schematic showing of another form of coupling circuit embodying the invention.

An important advantage of operating in this way is that the signal may be detected without requiring that it achieve a definite threshold level. For reliable operation of the balanced detector, it is only necessary that there be a sufficient difference in amplitude between the two input signals, one representing the bit 1 and the other the bit 0. Another advantage of using a balanced detection arrangement, as will be discussed shortly in connection with FIG. 49, is the relative ease of entering new information into the storage loop and of obtaining output information from the storage loop. The reason is the additional signal gain which is available that allows the balanced detector to be positioned at some distance from the charge-coupled shift-registers.

Figures 47, 48:
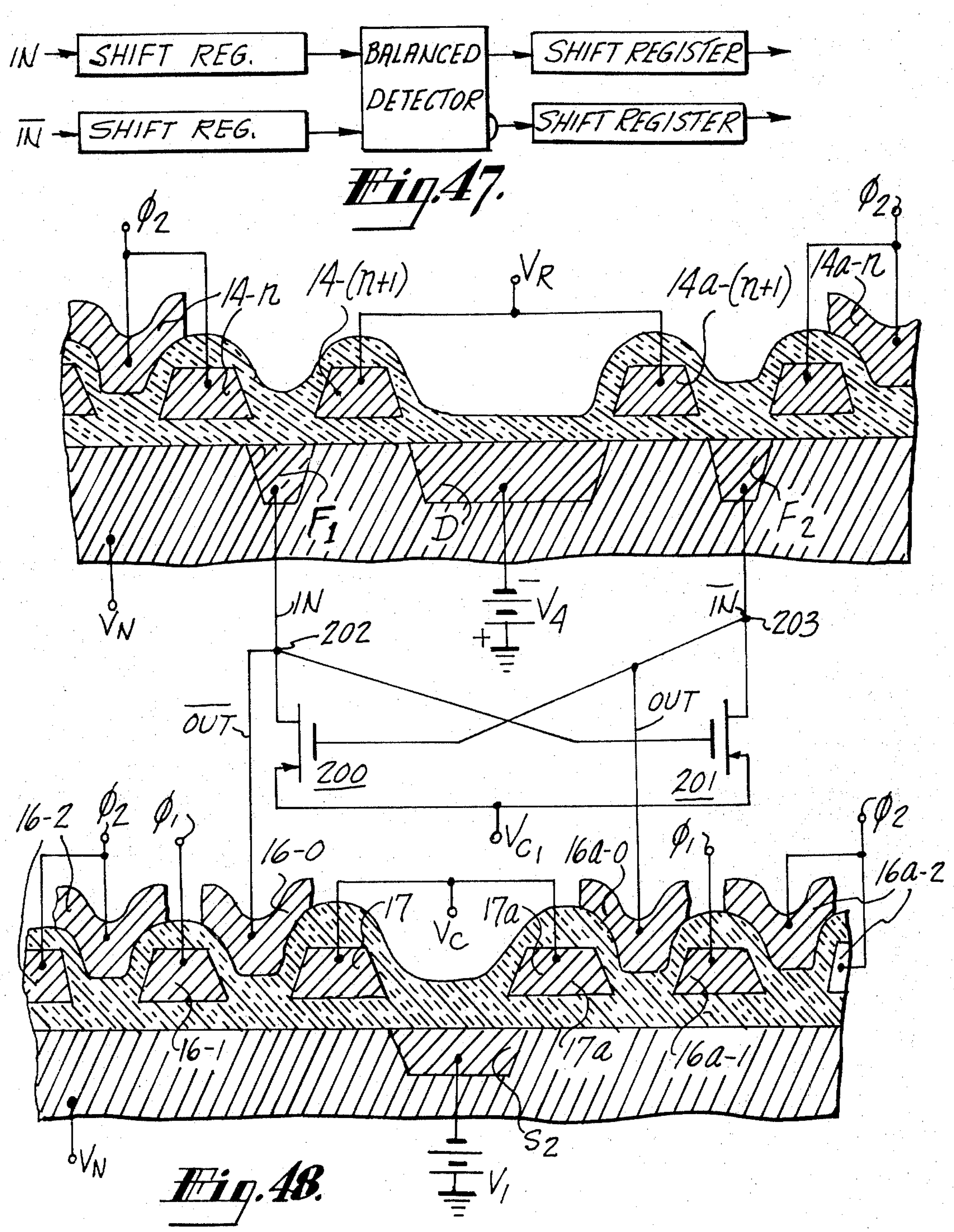
FIG. 47 is a block diagram showing a coupling circuit for a form of the circuit such as shown in FIG. 21.
FIG. 48 is a cross-sectional and schematic showing of the actual structure of the circuit of FIG. 47.

An embodiment of the balanced detection scheme is illustrated in FIG. 48. It may be assumed that the upper left register 14-($n$+1), 14-$n$ and so on is storing bits and the upper right-hand register 14$a$-($n$+1), 14$a$+$n$ and so on is storing complements of the bits. In practice, these two registers are arranged side-by-side and the bits and their complements travel in the same direction, however, they are illustrated here as converging simply for the sake of convenience.

The balanced detector includes two transistors 200, 201 which are integrated into the same substrate as the remainder of the system. It also makes use of the output structures of the two shift registers as the load devices or "resistors" for the two cross coupled transistors 200, 201. Thus, the balanced detector, in effect, comprises a four-transistor, flip-flop, two of the transistors acting as load resistors and being part of the output circuit of the shift registers.

In the operation of the system of FIG. 48, during the $\phi_1$ pulse, $V_R$ may be made relatively strongly negative and $V_{C_1}$ made equal to $V_4$. As a result, the floating regions $F_1$ and $F_2$ discharge any charge either one may have accumulated and reset to a value close to $-V_4$. Thus, terminals 202 and 203 are placed at the same negative potential close to $-V_4$ and when $V_R$ is made zero ($V_{C_1}$ remaining at $-V_4$), all four transistors are cut off and the $F_1$ and $F_2$ regions are open-circuited.

The transfer of charge signal to the $F_1$ and $F_2$ establishes the state the flip-flop will assume when re-energized or in other words when the four-transistor flip-flop is placed in an operative condition. The flip-flop is reenergized by first making $V_{C_1}$ more positive (actually less negative) and then (or concurrently) returning $V_R$ to a negative potential to effectively place the transistor loads ($F_1$, 14-($n$+1), D and $F_2$, 14$a$-($n$+1), D) back in the circuit. More precisely $V_R$ may be made somewhat more positive than at the resetting part of the cycle, however, it is still kept at a potential which is sufficiently negative that the two load transistors still are in condition to conduct. Control voltage $V_{C_1}$ is made relatively positive with respect to $V_4$; it may be raised, for example, to $V_1$ or a slightly more positive potential (the actual value chosen for $V_{C_1}$ will depend on the voltages desired at 202 and 203).

As mentioned above, the state the flip-flop assumes will depend upon the values of the bits stored in the two shift registers. For example, if the bit stored under electrode pair 14-n during the $\phi_2$ pulse is a 0 (no charge) $F_1$ remains relatively negative. Correspondingly, there will be a charge under electrode pair 14$a$-$n$ so that at the end of the $\phi_2$ pulse, it will be transferred to $F_2$ and $F_2$ will be relatively positive. The relatively negative voltage at 202 will unbalance the flip-flop and when the flip-flop is reenergized it will result in driving transistor 201 into conduction and correspondingly the relatively positive voltage at 203 will result in driving transistor 200 to cut-off. The difference in voltage between $F_1$ and $F_2$ determines the new state when the flip-flop is re-energized. Thus, terminal 202 will be driven relatively negative close to the value of $-V_4$ less the potential drop from D to $F_1$ whereas point 203 will be at a relatively positive value close to the potential of $V_{C_1}$ which can be the same as $V_1$.

During the $\phi_1$ pulse, the information stored at 202 and 203 which is applied to the gate electrodes 16-0 and 16$a$-0, respectively, concurrently with a negative pulse $V_C$ applied to electrodes 17 and 17$a$, will cause a conduction channel to be present under electrode 16-0 and no conduction channel to be present under **16*a*-0. That is, after the start of the $\phi_1$ pulse when the flip-flop is switched to the new state, the control pulse $V_C$ is made negative and charge transfers from $S_2$ to the region under storage plate 16-1. As electrode 16*a*-0 is relatively positive with respect to $V_1$, no charge transfers from source $S_2$ to the region under storage plate 16*a*-1.**

FIG. 49 shows in a more schematic way an alternative arrangement. The structure of the upper and lower shift registers is the same as that appearing in FIG. 48 and only the floating junctions $F_1$, $F_2$ and electrodes 16-0 and **16*a*-0 are illustrated. In this embodiment, the floating junctions are not employed as load elements for the balanced detector. The transistors 200 and 201 are the same as those of FIG. 48. However, in addition, there are separate transistors 204 and 205 whose purpose is to amplify the signals present at $F_1$ and $F_2$ respectively. In addition, there are transistors 207 and 208 that serve the dual purpose of acting as transistor loads for the flip-flop 200, 201 and as a means for introducing new information into the flip-flop. It also may be mentioned that new information may be introduced into the circuit of FIG. 48 by a pair of transistors such as 207 and 208 shown in FIG. 49.**

In the operation of the FIG. 49 arrangement, the flip-flop initially may be reset by making transistors 207 and 208 both conductive (EXT = $\overline{\text{EXT}}$ = V while $IN_1$ = $\overline{IN}_1$ = some negative value such as $-V_4$ of FIG. 48). Then transistors 207 and 208 are cut off, for example by making EXT = $\overline{\text{EXT}}$ = ground, while $V_{C_1}$ is also equal to $-V_4$ so that transistors 200 and 201 are cut off. Thus points 202 and 203 are both reset to the same reference potential ($-V_4$).

At the time the flip-flop is reset and the charge signals are available at $F_1$ and $F_2$, a negative pulse $V_{C_2}$ which is more negative than $V_{C_1}$ is applied to the drain electrodes of transistors 204 and 205. If now, for example, IN (the voltage at $F_1$) is relatively negative and $\overline{\text{IN}}$ (the voltage at $F_2$) relatively positive, transistor 204 will conduct more than transistor 205. This unbalances the flip-flop, so that in the same way as described for the circuit of FIG. 48, when the flip-flop is reenergized (first by returning the voltages IN = $\overline{\text{IN}}$ to $-V_4$ and then returning $V_{C_1}$ to $V_1$) it will be set to a new state in which the voltage difference between points 202 and 203 will be an amplified version of the voltage difference initially present between $F_1$ and $F_2$.

New information can be added to the lower registers via the transistors 207 and 208 in a manner similar to that employed in, for example, a P-MOS memory array. The EXT and $\overline{\text{EXT}}$ signals perform the function of the word select pulses while the IN and $\overline{\text{IN}}$ signals perform the function of the bit signals to introduce new information. The external input signals can set the flip-flop to the desired state in the absence of the control input pulse $V_{C_2}$.

The external signals also can be made to have sufficient amplitude to override any signals which may be present at $F_1$ and $F_2$ during $V_{C_1}$. In other respects, the operation is similar to that described in connection with FIG. 48. This means that during the process of regeneration of the information, the transistors 207 and 208 perform the function of the load devices in the flip-flop which in the circuit of FIG. 48 were part of the output structure of the complementary shift registers.

In addition to the features of FIGS. 48 and 49 discussed above, the flip-flops employed are convenient means for translating the charge-coupled information to static information stored in a flip-flop. In the case, for example, of a byte and its complement being transmitted down two charge coupled shift registers, as in FIG. 21, at an output terminal of this system there may be *n* flip-flops such as shown in FIGS. 48 and 49, where *n* is the number of bits in a byte. These n bits easily may be shifted into any convenient form of memory desired. For example, the signal regeneration flip-flop such as in FIG. 49 with additional transistors 204 and 205 to amplify the signal derived from $F_1$ and $F_2$, may be operated as a semiconductor memory that may be used as a buffer store between the charge coupled memory loops and external circuits.

In the systems of FIGS. 48 and 49, input information is sensed at floating junctions such as $F_1$ and $F_2$. It is to be understood that the system is also operative employing floating aluminum electrodes such as **14-*n* of FIG. 50 for capacitively coupling signals to the flip-flop. The change in capacitance of such floating electrodes as a function of the charge signal will become apparent from the description shortly to be given of the operation of the FIG. 50** circuit.

While FIGS. 47–49 are illustrated for purposes of the present discussion in terms of a two-phase arrangement, it should be clear that the techniques described are equally applicable to three, four and higher phase charge propagating circuits.

In the discussion up to this point, the coupling between two registers has included a floating junction region such as F, $F_1$ and so on. This floating junction region is located in an *n*-type substrate and consists of a *p*+ region. It is also possible to employ as the signal sensing means a floating aluminum electrode as illustrated in FIG. 50. Here, the floating aluminum electrode **14-*n* at the output end of one shift register is coupled to a gate electrode 16-0** at the input end of the next register.

In the operation of the FIG. 50 system, a four-phase system, assume that the electrode **14-*n* has been reset by the negative control pulse $V_{C_4}$ to some voltage not quite as negative as $V_4$ and open-circuited (left floating) by removing the control pulse $V_{C_4}$. This creates a potential well beneath electrode 14-*n*. At $\phi_4$ time, charge (or no charge) transfers to the region of the substrate beneath the last storage electrode 14-(*n*−1). Assume for the moment that charge is present. During the lagging edge of $\phi_4$ which overlaps the negative $\phi_1$ pulse, as the potential well beneath electrode 14-(*n*−1) is being made shallower, the charge present there spills into the potential well beneath floating aluminum electrode 14-*n*. As is well understood in this art, the increase in charge in the potential well beneath electrode 14-*n* causes the effective capacitance between electrode 14-*n* and the substrate to increase. Since a fixed charge previously was established on these floating electrodes, this causes the voltage present at electrode 14-*n* and therefore at 16-0** to decrease.

When the $\phi_4$ pulse has terminated, the charge transfer to the potential well under electrode **14-*n* becomes completed and at this time the negative control voltage pulse $V_C$ is applied to electrode 17. Now the conditions are correct for charge to flow from $S_2$ through the conduction channel beneath electrode 17 and depending upon whether electrode 16-0 is negative or positive relative to the source $S_2$ potential $V_1$, to flow or not to the potential well beneath storage electrode 16-1**.

Under ideal conditions assuming a perfect dielectric-silicon dioxide layer, with no leakage, a fixed charge could be maintained in the electrode **14-*n* by capacitive voltage divider action. For purposes of the present discussion consider a relatively large direct voltage source $V_{C_5}$ and a relatively small capacitor $C_P$ in the circuit for accomplishing this objective. In practice, however, even a dielectric material as good as silicon-dioxide has some finite resistivity which, in general, tends to make the reference voltage of the electrode 14-*n*, under these conditions, dependent on the previous state of the shift register. Moreover, a slow voltage drift will result at these floating electrodes if the conductivities of these two capacitors may not be exactly proportional to their respective capacitances and this would introduce further errors. To avoid such problems and also to avoid the need for a relatively high, direct-voltage source, in accordance with the present invention, a reset voltage means such as the MOS device F, $V_{C_4}$, $D_1$ is provided for resetting electrode 14-*n* to a reference level. Each time the negative control pulse $V_{C_4}$ occurs, the floating aluminum electrode 14-*n* is reset to the voltage of $D_1$. While, if desired, a negative pulse $V_{C_4}$ may be applied during each $\phi_2$ pulse, actually electrode 14-*n*** need not be reset this often. If desired, it may be reset, for example, in synchronism with a negative $\phi_2$ pulse, say every millisecond or so.

One further feature of the circuit of FIG. 50 is that the voltage of the electrode 16-0 may be modulated by some external voltage source $V_{C_5}$ via a coupling capacitor shown in phantom view at $C_P$. The control voltage $V_{C_5}$ may be synchronous with the control voltage $V_C$. Its purpose is to shift the level of the voltage present at 16-0 to an appropriate level for, in one case, cutting off completely the channel beneath electrode 16-0 and, in another case, making it highly conductive. This is, in effect, similar to what has already been described for the case in which there is substantial overlap capacitance $C_a$.

An alternative to the resetting means described above is to maintain the floating electrode **14-*n*** at a fixed reference voltage by connecting this electrode via a relatively large value of resistance, shown in phantom view at $R_C$, to a power supply terminal. This resistor may take the form of a relatively thin strip of polysilicon film of the same composition as is employed for the polysilicon electrodes.

OUTPUT END OF THE SYSTEM

Figure 51:
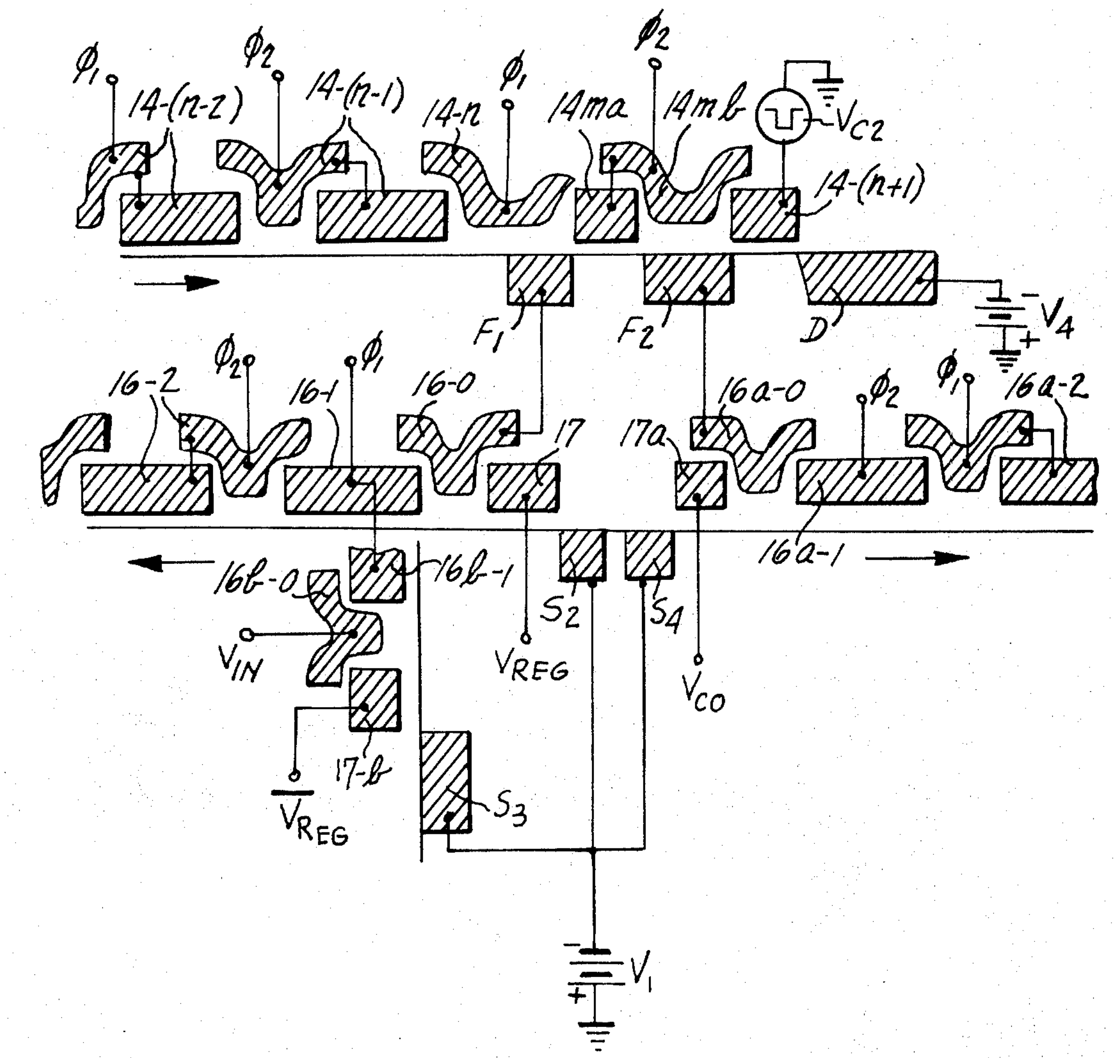
FIG. 51 is a schematic drawing showing both a circuit for coupling the output end of one register to the input end of another register and input-output circuits for the system.
Figure 52:
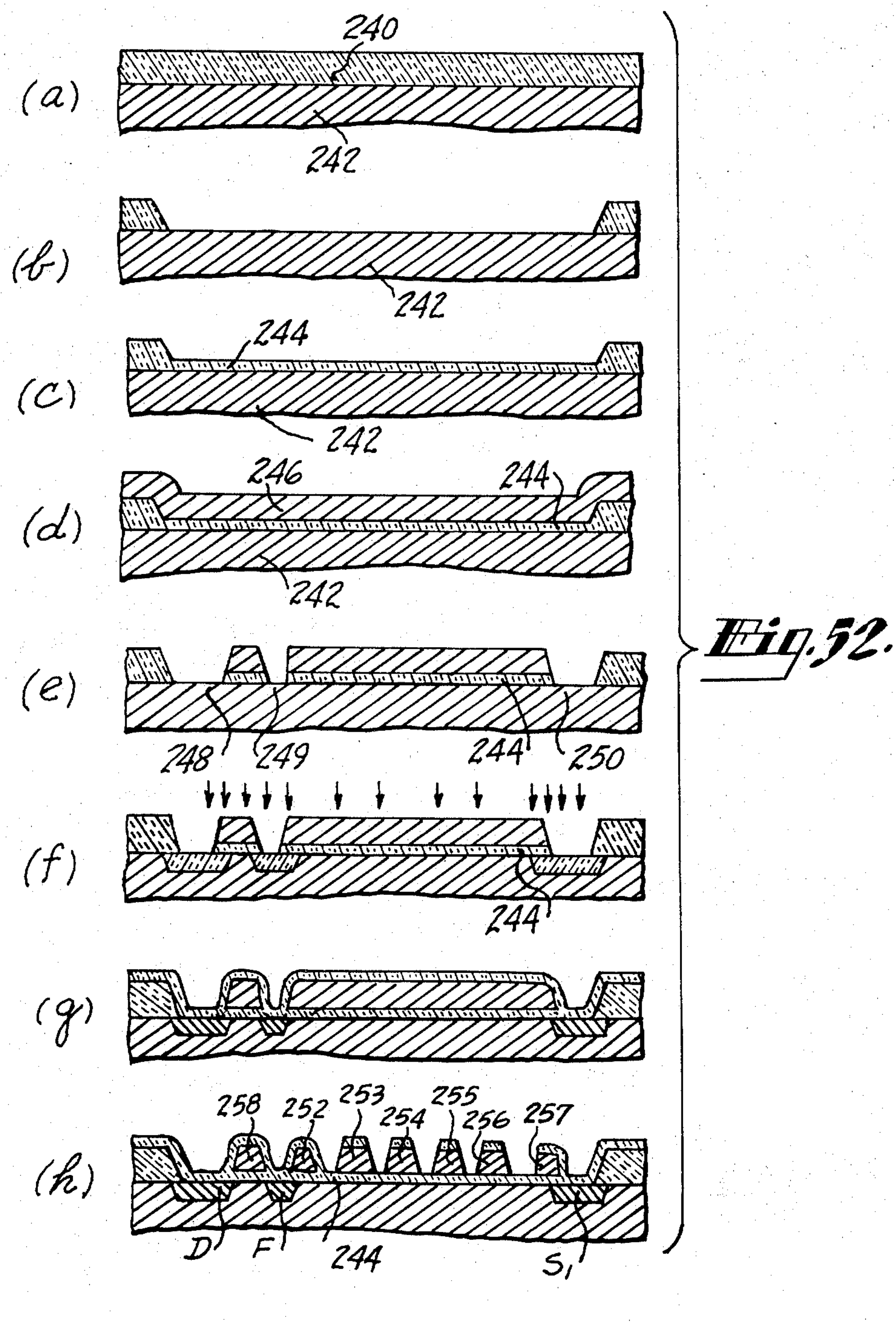
FIGS. 52*a–h* are a group of sketches to help explain a method of fabricating the systems shown above.

FIG. 51 illustrates schematically one form of input-output circuit for the system of the present invention. It also illustrates the use of charge-coupled logic circuits. This circuit is designed for the two-phase embodiments, however, similar circuits may be employed for the 3, 4 and higher phase embodiments.

The portion of the circuit containing the electrodes **14-(*n*−2), 14-(*n*−1) and so on at the upper left may be at the end of the last register of the system and the circuit which includes electrodes 16-2 and 16-1** and so on may be at the beginning of the first register of the system. Together they may be part of a closed loop. If it is desired simply to recirculate the information, then the pulses $V_{REG}$ have some negative value with respect to source $S_2$ and $\overline{V_{REG}}$ is relatively positive with respect to source $S_3$, for example, the latter may be at ground potential.

The electrodes **17*a*, 16*a*-0, 16*a*-1, and 16*a*-2 represent the input end of a shift register for removing the output signal from the system above, which may be a closed loop. Briefly, this register of the system operates as follows. The output is obtained only if the negative control pulse train $V_{co}$ (applied to electrode 17*a*) is present. When $\overline{V_{REG}}$ pulses are relatively negative and $V_{REG}$ is relatively positive new information may be introduced into the closed loop system under the control input signal $V_{in}$. Otherwise, the function of the control pulses $V_{REG}$, $\overline{V_{REG}}$, and $V_{co}$ is similar to that of the timing pulse in FIG. 40**.

For the purposes of this description, the voltage source $V_1$ controlling the potentials of $S_2$, $S_3$, and $S_4$ will be −5V. The sources $S_2$, $S_3$, and $S_4$ may comprise the same single source region, but to obtain an additional control over the operation of the output stage, separate control voltages may be applied to the sources $S_2$, $S_3$ and $S_4$ in a manner such as described, for example, in connection with FIG. 7.

The operation of the closed loop should be clear from previous discussions, for example, such as the discussion of the circuit of FIG. 40 (with the understanding that $\phi_2$ in FIG. 40 is $\phi_1$ in FIG. 51). During the negative $\phi_1$ pulse, the complement of the bit stored in the last stage of the last shift register shifts into the first stage (16-1) of the first shift register. During the next $\phi_2$ pulse, the bit stored under 16-1 propagates to the left to the potential well under electrode pair 16-2.

At the leading edge of this $\phi_2$ pulse and the lagging edge of the $\phi_1$ pulse which is terminating, positive charge which is present at $F_1$ spills into the potential well being created under **14*ma*, 14*mb*. Note that $F_1$ is spaced a small distance from 14-(*n*−1), aluminum electrode 14-*n* overlapping this distance. Electrode 14-*n* acts as a gate electrode during the lagging edge of $\phi_1$ to prevent any charge at $F_1$ from propagating back to 14-(n−1). As $\phi_1$ is decreasing, the potential well under electrode 14-*n* is decreasing and concurrently the potential well under the electrode pair 14-*ma* and 14-*mb*** is increasing which causes this transfer of charge to take place. The transfer of charge from $F_1$ to $F_2$ stops when electrode $F_1$ reaches the potential of $\phi_2$ less the threshold voltage $V_T$, that is, say $(-15 \text{ volts} + V_T)$. This is the reset or reference voltage for $F_1$.

At the beginning of pulse $\phi_2$, $F_2$ is at a negative potential $V_{F2}$ close to $V_4 + \phi_2$ (assuming strong capacitive coupling of $\phi_2$ to $F_2$) having been reset previously in the manner soon to be described. Thus, the positive charge carriers accumulate in the potential well beneath $F_2$. The potential of $F_2$, if no charge is transferred from $F_1$, is $V_4 + \phi_2$, assuming that the capacitance of the electrode **14-*mb* is considerably larger than the capacitance of $F_2$ to the substrate plus the capacitance of electrode 16*a*-0. Otherwise, the potential of $F_2$ will be $V_4 + \Delta\phi_2$, where $\Delta\phi_2$ depends upon the relationship of the capacitance between the electrode 14-*mb*** and $F_2$, and the total capacitance of $F_2$.

The above flow of charge, if present, results in a positive change in potential at $F_2$ and as the latter is connected to **16*a*-0, a corresponding voltage change at 16*a*-0. The latter is the gate electrode for another shift register 16*a*-1, 16*a*-2** and so on.

If, during $\phi_2$ time, the control voltage $V_{CO}$ is relatively negative with respect to source $S_4$, charge will propagate from $S_4$ through the conduit channel beneath 17*a*. Now, depending upon whether 16*a*-0 is relatively negative (no charge at $F_2$) or relatively positive with respect to $S_2$ (charge present at $F_2$) the charge from $S_2$ will or will not pass to the first potential well — the one electrode 16*a*-1. Thereafter, this information propagates to the right. If, on the other hand, $V_{CO}$ is relatively positive, say at ground, then no information can pass from $F_2$ to the 16*a*-1, 16*a*-2 . . . register.

After the termination of $V_{CO}$, the $\phi_2$ pulse terminates while the $\phi_1$ pulse is on the second control voltage pulse $V_{C_2}$ occurs. This pulse causes the region of the substrate beneath control electrode 14-(*n*+1) to operate as a conduction channel and any charge at $F_2$ is conducted via this channel to the drain D. After the charges have transferred, the second floating electrodes $F_2$ is reset to a negative value close to that of $V_4$ by the control pulse $V_{C_2}$. $V_4$ may be some value such as −5 volts or so.

When it is desired to introduce new information into the shift register, electrode 17 is made relatively positive with respect to $S_2$, that is, it is placed at a potential such as ground and a relatively negative pulse or pulse train $\overline{V_{REG}}$ is applied to 17-*b*. The relatively positive $V_{REG}$ voltage causes electrode 17 to prevent the passage of charge carriers from the source $S_2$ to the potential well beneath electrode 16-1 regardless of the potential at 16-0. Thus, if no information is inserted at $V_{IN}$, $V_{REG}$ will, in effect, insert a 0 into the shift register in response to each $\phi_1$ pulse, effectively erasing the successive bits stored in the shift register system.

New information may be inserted by applying an appropriate voltage $V_{IN}$ to gate electrode 16b-0 in coincidence with the pulse $\overline{V_{REG}}$ applied to 17-*b* during each negative $\phi_1$ pulse. If $V_{IN}$ is negative during the $\phi_1$ pulse, the source electrode $S_3$ transfers charge to the potential well beneath electrodes 16-1 and 16*b*-1. These two electrodes are really the same electrode, a common electrode, shown separately for the sake of drawing convenience, which is able to receive charge either via the channel controlled by electrodes 17 and 16-0 or via the channel controlled by the electrodes 17-*b* and 16*b*-0. If, on the other hand, $V_{IN}$ is relatively positive as, for example, a ground potential, during the negative pulse $V_{REG}$, then there is a potential barrier created beneath electrode 16*b*-0 and no charge is transferred from $S_3$ to the potential well created by $\phi_1$ beneath electrode 16*b*-1, 16-1.

The purpose of the special stage consisting of electrodes 14-*ma* and 14-*mb* and the $F_2$ region is to permit an output signal to be obtained which is delayed by one half cycle from the output signal available at the first shift register, without any additional capacitive loading of the first output stage. The construction of this special output stage can be extended to a multi stage structure, each stage consisting of 14-*ma*, 14-*mb*, $F_2$, successive stages driven by successive phases. This new and improved structure is useful as a so-called "bucket-brigade" circuit such as described in F.L.J. Sangster, "Integrated MOS and Bipolar Analoy Delay Lines using Bucket-Brigade Capacitor Storage", ISSCC Digest Technical Papers, p. 74, 1970. Such bucket brigade circuits are made by a standard *p*-MOS process. The new structure of FIG. 51 is made by using self-aligning silicon gate techniques discussed later and this permits the construction of considerably more compact circuits. It also provides a method for making the capacitance of the electrode (electrode 14-*mb*) overlapping the diffused floating junctions more reproduceable. A further feature of this circuit is the virtual elimination of the unwanted feedback capacitance between the stages. The latter is possible because the floating junction regions are diffused with the silicon-gates, such as 14-*ma* and 14-(*n*+1) in the case shown in FIG. 51, being used as the mask.

The new structures for bucket-brigade shift registers which also can be used as a self-scanned photosensor array can be made in the same way as two-phase charge-coupled shift registers, using two thicknesses of channel oxide to obtain the asymmetrical potential wells such as shown in FIGS. 14 or 17. However, in the new bucket-brigade structures, the two different thicknesses of the channel oxide are not essential for operation but may be used as an additional control over the relative values of the silicon-gate and the aluminum capacitances in optimizing the design of these circuits.

In the operation of the bucket-brigade circuit above, charges representing information are transferred between reverse-biased floating junctions such as the region $F_2$ in FIG. 51 under the control of the two-phase clock voltage pulses such as $\phi_2$ driving, in parallel, the self-aligned polysilicon gates such as 14-*ma* overlapping the floating junction regions such as $F_2$.

GENERAL CONSIDERATIONS IN THE DESIGN OF CHARGE-COUPLED SHIFT CIRCUITS

A number of factors to be considered in the design of the circuits discussed above have already been touched on. Taking FIG. 40 as an example, the power supply $V_4$ serves to set the floating region F to some reference potential $V_{REF} \cong V_4$. The power supply potential $V_1$ (combined with $V_3$ (FIG. 29), if the latter is present) determines the amount of charge to be introduced to the potential well under the first storage electrode 16-1. The potential $V_F$ of the floating region F is the voltage applied to the gate electrode 16-0. When $V_F = V_{REF}$ (no charge signal present at F) then the charge made available at $S_2$ may transfer, at an appropriate time, to the potential well under 16-1. On the other hand, the value of $V_F$, when charge is present, must be sufficient to prevent the flow of charge from $S_2$ to the well beneath 16-1. This value must be more positive then $(-V_1 + V_T)$, where $V_T$ is the threshold associated with $S_2$, 16-0. It may be assumed for the present purposes that $V_C$ of FIG. 40 is sufficiently negative that a highly conductive channel is established under electrode 17.

It is clear from the above that by judicious choice of the values of $V_4$ and $V_1$, an appropriate value of $V_F$ can be obtained in one case (not charge at F), to permit charge flow to a desired degree from $S_2$ to the potential well beneath 16-1 and, in another case (charge at F), to prevent the flow of charge from $S_2$ to the potential well beneath 16-1. The voltage swing at F — the amount of departure of $V_F$ from $V_{REF}$, can be increased by increasing the magnitude of $\phi_2$ (in FIG. 40), causing a deeper potential well to form at F and, when charges are present, causing more such charges to accumulate and thereby causing a greater positive swing of $V_F$.

In the discussion of FIG. 29 the various circuit distributed capacitances were introduced. The total capacitive loading $C_F$ of the floating region F is:

$$C_F = C_a + C_b + C_3 + C_4 + C_5$$

The change in voltage $\Delta V_F$ produced at F as a result of charge transfer Q TO F IS:

$$\Delta V_F = Q/C_F$$

For a relatively high resistivity substrate, the major contributors to $C_T$ may be $C_a$ and $C_5$. Therefore, in this environment $\Delta V_F$ may be increased substantially for a given $Q$ by reducing $C_a$ and $C_5$ to a minimum. This implies a short dimension $L_C$ of FIG. 40 (assuming that the capacitance between 17 and 16-0 is relatively low in FIG. 40) and minimum overlap between **14-*n* and F as, for example, is shown in FIG. 43. However, as discussed in connection with FIG. 43,** somewhat more complex timing signals are needed and it may somtimes be desirable to sacrifice some of the voltage gain in the interest of simplifying the timing and other considerations. The effect on the circuit operation of increasing the capacitance at $C_a$ has already been discussed.

SPEED OF OPERATION

The speed of operation which can be achieved with the charge-coupled shift registers described above depends, in part, upon the time it takes to transfer a charge from one potential well to the next adjacent potential well. This charge transfer can be accomplished in three different ways:

1. Diffusion.
2. By means of a self-induced drift field which results from the gradient of the surface potential due to an uneven charge distribution in or between the two potential wells, and
3. By an externally induced drift field resulting from the fringing field between the two electrodes.

Computer calculations relating to 3 above have shown that for a sufficiently high substrate resistivity, the self-aligned electrode structures discussed above which permit the separation between two adjacent electrodes to be equal to or less than the spacing of an electrode from the substrate, can be made to operate so that the complete transfer of charge is accomplished mainly in response to the fringing field and in a time of the order of nanoseconds. On the other hand, mechanism 2 above, which can be considered also as a diffusion mechanism with a diffusion coefficient proportional to charge density, results in the transfer of charge in a manner similar to the discharge of a resistor-capacitor (RC) transmission line. However, as contrasted to the latter, with mechanism 2 the charge transfer becomes progressively slower than the RC time constant as a function of the amount of charge which has been removed from the potential well. Accordingly, in the absence of 3 above, which is expected for widely spaced and/or long electrodes, as the potential well becomes emptier, the transfer of charge mechanism begins to depend entirely upon the diffusion of charge carriers independently of their concentration with a characteristic time constant of $L^2/D$ where $L$ = the electrode length and $D$ = the diffusion coefficient in $cm^2$/sec. In cases 1 and 2, the charge transfer efficiency (the degree of completeness of charge transfer) is expected to be inversely proportional to the frequency of operation. With method 3, however, a complete transfer of charge can occur essentially in a single drift transit time of the charge carriers and this implies extremely high speed operation, as well as a complete transfer of charge. Therefore, while mechanism 2 may significantly contribute to the initial charge transfer, a complete and rapid charge transfer is possible only in the presence of mechanism 3.

When the depletion depths are comparable to or greater than the electrode lengths $L$, and the separation between electrodes is equal to or smaller than the thickness of the silicon dioxide layer, the effective charge transfer time $t_c$ due to the fringing field for a substrate of infinite resistivity can be approximated by:

$$t_c = (L^2/\mu\Delta V)\ (L/2\pi a) \qquad (1)$$

where the equation above is derived from $$E_{min} = (2\pi a \Delta V/L^2) \qquad (2)$$

$$t_c = (L/\mu E_{min}) \qquad (3)$$

where $E_{min}$ = the electric field present under the $\phi_2$ electrode (see below)

$\mu$ = the mobility = 250 $cm^2$/volt-seconds for *n*-type silicon.

$\Delta V$ represents the difference between the voltages applied to two adjacent charge coupled electrodes. The equation was derived for a three-phase charge coupled shift register when the $\phi_2$ voltage was decreasing, the $\phi_3$ voltage was increasing and the $\phi_1$ voltage was 0. The charge was being transferred from the potential well under a $\phi_2$ electrode to the potential well under the $\phi_3$ electrode. At the instant of time of interest, the value of the voltages applied to these two electrodes were $\phi_1 = 0$ volts, $\phi_2 = -V$ volts, and $\phi_3 = -2V$ volts, making $\Delta V = V$.

$a$ = the thickness of the silicon dioxide, that is, the spacing of an electrode from the substrate.

While in the case above the value of $E_{min}$ was obtained analytically (by precise solution of the potential field equations), when a finite resistivity is involved, such analytic methods are not applicable. Here, computer calculations involving approximations (the solution of Poisson's equations) are required. Such numerical solutions of the potential field for charge-coupled structures in which the finite resistivity of the substrate is taken into account, that is, in which the space charge of the depletion region has been considered, have shown the following. For a configuration of electrodes in which $L = 4$ microns ($\mu$), the spacing $f$ between electrodes $= 0.2\mu$, $a = 2{,}000$ A., substrate resistivity $p = 20$ ohm-cm, and voltages present on three adjacent electrodes 2, 7 and 12 volts, respectively, the minimum fringing field at the silicon substrate surface (the field which will assist charge transfer) is $2.5 \times 10^3$ volt/cm. This corresponds to a transit time — time for charge to travel from one potential well to the next, of 0.5*n*.sec. The fringing field for $L = 10\mu$ with all other factors the same is $4 \times 10^2$ volt/cm. corresponding to a transit time of 10*n*.sec.

The fringing field drops sharply (and transit time increases correspondingly) as the depletion depth becomes smaller than the electrode length $L$. The amount of fringing field is a function, among other things, of the electrode voltage (the larger the voltage between the electrodes and the larger their absolute values, the greater the field) the substrate resistivity $p$ (the greater $p$, the greater the fringing field, for a given electrode voltage) and the dimension $a$ (the smaller $a$, the greater thr fringing field for a given electrode voltage). It was found that when the depletion depth $x_d$ becomes less than $6a$, the fringing field starts to decrease very rapidly with decrease in substrate resistivity. The condition at which the depletion depth $x_d$ is equal to $6a$ corresponds to the situation when the effective thickness of the silicon dioxide (which is equal to about 3a) is equal to $½x_d$, the effective depletion depth. The above condition corresponds to the situation when the voltage drop across the silicon dioxide is equal to the voltage across the depletion depth of the silicon.

Another method for increasing the fringing field for a fixed electrode structure for the case of relatively low resistivity substrate consists of operating the two-phase structures with a relatively large substrate bias voltage $V_N$. A large substrate bias voltage, by increasing the depletion depths of the potential wells, results in larger fringing fields. For example, the numerical solutions of the potential fields show that for substrate doping of $5 \times 10^{15}$ $cm^{-3}$ (which corresponds to resistivity of 0.8 ohm-cm for $n$-type substrate) and 4 micron long electrodes separated by 0.2 micron spaces on 2,000 A. channel oxide, the minimum fringing field is 300 volts/cm for phase-voltages of 2, 7 and 12 volts. However, for the same structure the minimum fringing field is increased to 1,200 volts/cm for phase voltages of 12, 17 and 22 volts. This means that in this case the minimum fringing field is increased by a factor of four when the substrate voltage is changed from $V_N = +2$ volts to $V_N = +12$ volts.

The structures of the present invention may be employed to achieve high-speed operation. The overlapping electrode structure permits the adjacent electrodes to be spaced close to one another. The separation between the electrodes $f$ (see FIG. 9) may be made very small —1,000 A or less (that is, 0.1$\mu$ or less). The length $L$ (FIG. 9) can be small, 13$\mu$ or less — perhaps as small as 5$\mu$, as can the length $k$ (FIG. 9) which may be 2–5$\mu$. The small length $k$ is readily achieved by the self-aligned silicon gate technique.

The computer analysis discussed briefly above, indicates that the use of a relatively high resistivity substrate (10 or more ohm-cm) can provide bit rates of the order of $10^8$ bits per second or more. However, high packing density circuits such as are desirable for serial memory applications can be best achieved by using two-phase structures for the charge coupled circuits. Of these structures, the one using only the two thicknesses of silicon dioxide and without voltage offset (as shown in FIG. 9) employs a relatively low resistivity substrate such as one having a resistivity of the order of 3 to 1 ohm-cm. These registers are designed to operate in the $10^7$ to the $10^8$ bit per second range. To achieve the higher bit rates with these structures, a relatively large substrate bias $V_N$ such as +10 volts or more may be used. To achieve bit rates in excess of $10^8$, the two-phase structures employing the direct offset voltages (as shown in FIG. 11) are preferred as they can be made with high (as well as low) resistivity substrates.

Another factor to be considered in determining the operating speed of the circuits discussed above is the response time of the signal regeneration circuits (circuits such as discussed in connection with FIGS. 37–40, for example). Here, the time needed to reset the floating junction F to a reference potential must be considered as well as the time required to transfer charge to the floating junction and the time needed to place charge in the first potential well of the next register (the well beneath electrode 16-1) under the control of the floating junction. The transfer of charge into the floating junction, in principle, can be as fast as the time required to transfer charge between two adjacent potential wells. The time required for resetting the floating junction to the reference potential (the potential $V_4$), is comparable to the charge transfer time and can be speeded up by employing a sufficiently large reset pulse $V_R$. The remaining factor, namely the time required to transfer charge to the potential well beneath electrode 16-1 is the main limitation in the response time of the signal regeneration circuit. However, this is not a serious limitation as it can be shown that for a voltage of two volts or more this charge transfer time can be of the order of several nanoseconds.

METHODS OF FABRICATION

The discussion which follows of the fabrication techniques which may be employed to construct the charge coupled devices described above relates to processes which are in themselves known in the integrated circuit art. Therefore, the description is somewhat abbreviated and such well-known processing steps as cleaning the wafers, applications of photoresist, annealing of the channel oxide, alloying the silicon to aluminum contacts and other common procedures are implied but are not discussed in detail.

FIG. 53 should now be referred to. As shown in FIG. 53*a*, a thick silicon-dioxide layer 240 (about 10,000 A. thick) is thermally grown on the silicon substrate 242. Then, as shown in FIG. 53*b*, the portion of the silicon dioxide at which the electrodes and the diffused regions D, F and $S_1$ will be formed is etched away. Then, as shown in FIG. 53*c*, a thin layer 244 of silicon dioxide (perhaps 500 – 2,000 A. thick) is thermally grown on the substrate.

Next as shown in FIG. 53*d* a polysilicon layer 246 (about 3,000 to 5,000 A. thick) is epitaxially deposited over the silicon wafer 242 both over the thin and the thick silicon dioxide regions. Thereafter, a mask is employed to define the regions of the substrate at which the $p+$ regions will be formed by removing all of the polysilicon that is not used for the gates or electrodes. In brief, a photoresist may be deposited through this mask and portions of the polysilicon and silicon dioxide defined by the non-hardened regions on the photoresist etched away to leave the structure shown in FIG. 53*e*. This exposes certain regions 248–250 of the substrate. Thereafter, a source of $p+$ material such as boron is employed to form the PN junctions as illustrated in FIG. 53*f*. Note in this operation the polysilicon regions and, in other places, the thick silicon dioxide, are used as the diffusion mask.

After the steps above, a second thin silicon dioxide layer 2,000 – 6,000 A. thick may be deposited over the entire sample as shown in FIG. 53*g*. The function of this oxide is to serve as the dielectric isolation between the polysilicon and the aluminum electrodes of different voltage phases. This oxide also may be deposited before the deposition of the sources and drains. Next, another mask may be employed to define the regions etched away in FIG. 53*h*. Then, the etching is accomplished to leave behind the polysilicon portions of each electrode pair as shown at 252–257. In FIG. 53*h*, the $p+$ region in the substrate may be the source $S_1$, the floating region F and the drain D. The electrode 258 may be the control electrode which is employed to reset the floating electrode F to the voltage of the drain D.

The remaining steps in the process should be self-evident and are not illustrated. First, an additional silicon dioxide layer is thermally grown or deposited to produce the desired thickness of channel oxide under the aluminum electrodes and to isolate the polysilicon electrodes. Then contact openings are made with another mask to the $p+$ regions in the substrate and at places on the polysilicon requiring a connection to the aluminum conductors or electrodes to be deposited subsequently. Then, a continuous layer of aluminum may be deposited over the sample. Then another mask may be employed to define the aluminum electrodes. Then portions of the aluminum may be etched away to define the aluminum electrode structure.

In the step shown in FIG. 53*h*, if desired, a portion of the silicon dioxide channel region 244 may be etched away. Whether or not this is done depends upon how close it is desired that the aluminum electrode be to the substrate. If it is desired that the aluminum electrode be as close to the substrate as the polysilicon electrodes, then portions of the layer 244 must be etched away in view of the next layer of silicon dioxide which will be layed down. On the other hand, if the aluminum electrodes are to be spaced further from the silicon substrate then the polysilicon electrodes, then the etching may stop as shown in FIG. 53*h*.

In accordance with a second method of manufacture essentially the same structure, but without self-aligned diffusion, can be made by modifying the sequence of operations. In this case, the $p+$ regions may be formed in the $n$-type substrate before the growth of the thick silicon dioxide (before the step depicted in FIG. 53*a*). Now, as the thick oxide is grown, the $p+$ regions will be driven deeper into the substrate. In addition, with this technique one of the masks may be employed both for etching the polysilicon electrodes 252–257 as well as the polysilicon control electrode 258.

While in the main part of the discussion in this application specific materials are given to illustrate the invention, it is to be understood that these are examples only. In many cases different materials than those specified may be used. For example, while it is presently believed that silicon is a preferred substrate material other materials such as germanium or gallium arsenide, as examples, may be used instead. Further, even in the case of silicon, $p$-type substrates may in some cases be preferred to $n$-type substrates. In $p$-type substrates, the charge carriers are electrons and their mobility is about twice that of holes and this implies that faster charge coupled structures may be fabricated in this way. In addition, rather than employing polysilicon and aluminum for electrodes, other materials such as polysilicon and one of molybdenum, or molybdenum-gold, or platinum-titanium-gold, or tungsten-aluminum, or aluminum silicon alloys or any one of a number of such metals may be employed instead. Substitutions for the polysilicon are also possible using the two-layer metalization technology. An example is the use of anodized aluminum for the first metal layer (aluminum-oxide, in this case, would be the insulator or one of the insulators between this metal electrode and the second one of the pair). In addition, while silicon dioxide has many advantageous properties, other insulating materials such as aluminum oxide and silicon nitride may be employed on silicon substrates and many other high quality dielectrics may be used instead on substrates other than silicon.

It is to be understood that the dimensions given by way of example above are for the case of systems made by integrated circuit techniques, such as by using contact or projection printing for the development of the photo-resist. The same type of structures can be made considerably smaller in dimensions, which means that it can be made to be capable of higher speed performance, by the use of a scanning electron beam for the exposure of the photoresist or even for the direct making of the electrodes. Here, the alignment between different layers of the structure can be automated employing feedback techniques and a digital computer for control. Using this manufacturing technique, length dimensions of electrodes are obtained of the order of one micron ($10^{-6}$ meters) or less.

What is claimed is:

1. In a charge-coupled shift circuit, in combination:
- a substrate formed of a semiconductor material of one conductivity type;
- an insulating layer on one surface of said substrate;
- a source electrode comprising a region in said substrate adjacent to said surface of different conductivity than said substrate;
- a control electrode spaced from said substrate by said insulating layer and lying adjacent to said source electrode;
- a storage electrode also spaced from said substrate by said insulating layer and lying adjacent to said control electrode at the edge thereof opposite said source electrode;
- means for normally reverse biasing said source electrode to an extent sufficient to prevent it from releasing charge carriers;
- means for concurrently pulsing said storage and control electrodes, in the first case for forming a potential well into which the charge carriers provided by said source may flow and in the second case for forming a relatively low impedance conduction channel between said source and said potential well, the pulse applied to said control electrode starting after and terminating before the pulse applied to said storage electrode; and
- means for controlling the level to which said potential well fills comprising means for applying a pulse to said source electrode during an interval which is concurrent with the pulsing of the storage and control electrodes and which terminates after the termination of the pulse applied to said control electrode and before the termination of the pulse applied to said storage electrode.

2. In a circuit as set forth in claim 1, said last-named means comprising means for applying a pulse of an amplitude such that said source remains reverse biased relative to said substrate.

3. In a charge-coupled circuit, in combination:
- a substrate formed of a semiconductor material of one conductivity type;
- a source electrode in said substrate formed of a material of opposite conductivity type;
- means including a storage electrode for creating a potential well in said substrate close to said source;

a control electrode coupled to said source electrode for controlling the flow of charge carriers from said source electrode to said potential well;

means for controlling the time at which charge flows from said source electrode to said potential well comprising means for pulsing said control electrode for creating a relatively low impedance conduction channel between said source electrode and said potential well; and means for controlling the depth to which said potential well is filled, that is, the amount of surface charge which accumulate at the substrate surface beneath said storage electrode, comprising means for pulsing said source electrode in the forward direcfon during the pulsing of the control electrode and terminating after the termination of the pulsing of the control electrode.

4. In a charge-coupled circuit, in combination:

a substrate formed of a semiconductor material of one conductivity type;

a source of charge carriers comprising a region of other conductivity type at the surface of said substrate;

means close to said source for forming a potential well in said substrate into which carriers from said source may flow, said menas including a storage electrode and means for applying a voltage pulse thereto;

means coupled to said source for controlling the flow of charge carriers from said source to said potential well, said means comprising control electrode means spaced from said surface of said substrate and extending between said source and said means for forming a potential well, and means for pulsing said control electrode means during a period concurrent with that of the voltage pulse applied to said storage electrode and which terminates at a time prior to the termination of the voltage pulse applied to said storage electrode;

menas for quiescently reverse biasing said source to an extent sufficient to prevent the same from acting as a source of charge carriers; and means for applying a voltage signal in the forward direction to said source, during at least the latter portion of the time said control electrode means is pulsed.

5. In the combination as set forth in claim 4, said means for forming a potential well comprising means for applying a voltage pulse to said storage electrode starting at time $t_0$ and terminating at time $t_4$, said means for controlling the flow of charge carriers comprising a single control electrode and means for applying a voltage pulse to said control electrode starting at time $t_1$ after $t_0$ and terminating at time $t_{2a}$ prior to $t_4$, and said means for applying a voltage signal comprising means for applying a pulse in the forward direction to said source which starts at time $t_2$ after $t_0$ and which terminates at time $t_3$ after time $t_{2a}$ and before time $t_4$.

6. In the combination as set forth in claim 5, said means for applying a voltage pulse to said control electrode comprising means for applying a pulse having an amplitude greater than $V_t$, where $V_t$ is the threshold voltage of said substrate, and also substantially greater than the voltage pulse applied to said source.

7. In the combination as set forth in claim 4, said control electrode means comprising at least two control electrodes and said means for pulsing comprising means for individually applying pulses to said two control electrodes, respectively.

8. In the combination as set forth in claim 7, said two control electrodes being arranged in series between said source and said storage electrode.

* * * * *